US012730385B2

(12) United States Patent
Fujii

(10) Patent No.: US 12,730,385 B2
(45) Date of Patent: Sep. 8, 2026

(54) ELECTRONIC DEVICE MANUFACTURING METHOD AND LITHOGRAPHY CONTROL PROCESSOR

(71) Applicant: Gigaphoton Inc., Tochigi (JP)

(72) Inventor: Koichi Fujii, Oyama (JP)

(73) Assignee: Gigaphoton Inc., Tochigi (JP)

( * ) Notice: Subject to any disclaimer, the term of this patent is extended or adjusted under 35 U.S.C. 154(b) by 236 days.

(21) Appl. No.: 18/606,012

(22) Filed: Mar. 15, 2024

(65) Prior Publication Data

US 2024/0219846 A1 Jul. 4, 2024

Related U.S. Application Data

(63) Continuation of application No. PCT/JP2021/038992, filed on Oct. 21, 2021.

(51) Int. Cl.

| | |
|---|---|
| ***G03F 7/00*** | (2006.01) |
| ***H01S 3/08*** | (2023.01) |
| *H01S 3/225* | (2006.01) |

(52) U.S. Cl.

CPC ...... *G03F 7/70633* (2013.01); *G03F 7/70358* (2013.01); *H01S 3/08009* (2013.01); *H01S 3/225* (2013.01)

(58) Field of Classification Search

CPC .... G03F 7/70633; G03F 7/70358; G03F 7/20; H01S 3/08009; H01S 3/225

See application file for complete search history.

(56) References Cited

U.S. PATENT DOCUMENTS

| | | | | |
|---|---|---|---|---|
| 6,256,086 | B1 | 7/2001 | Sumiyoshi | |
| 8,400,611 | B2 * | 3/2013 | Harayama | G03F 7/70266 355/53 |

(Continued)

FOREIGN PATENT DOCUMENTS

| | | |
|---|---|---|
| JP | H07-245251 A | 9/1995 |
| JP | 2000-040649 A | 2/2000 |

(Continued)

OTHER PUBLICATIONS

International Search Report issued in PCT/JP2021/038992; mailed Dec. 14, 2021.

(Continued)

*Primary Examiner* — Hung V Nguyen

(74) *Attorney, Agent, or Firm* — Studebaker Brackett PLLC

(57) ABSTRACT

An electronic device manufacturing method includes performing scanning exposure in which plural scan fields of a first photosensitive substrate are exposed to pulse laser light having a reference wavelength, measuring overlay errors at plural positions in each of the plural scan fields, calculating the average of the overlay errors at each of the plural positions in scan fields scanned in the same scan direction out of the plural scan fields, calculating the amount of wavelength adjustment with respect to the reference wavelength in such a way that a first overlay error parameter calculated from the averages and distortions produced when the wavelength of the pulse laser light is changed from the reference wavelength is smaller than a second overlay error parameter calculated from the averages, causing a laser apparatus to generate the pulse laser light having a wavelength controlled by using the amount of wavelength adjustment, outputting the pulse laser light to an exposure apparatus, and exposing a second photosensitive substrate to the (Continued)

pulse laser light in the exposure apparatus to manufacture electronic devices.

17 Claims, 43 Drawing Sheets

(56) References Cited

U.S. PATENT DOCUMENTS

| | | | | |
|---|---|---|---|---|
| 10,809,624 | B2 * | 10/2020 | Lee | G03F 7/70033 |
| 11,061,336 | B2 * | 7/2021 | Simons | G03F 7/70516 |
| 2006/0040191 | A1 * | 2/2006 | Okita | G03F 9/7003 430/30 |
| 2018/0356736 | A1 | 12/2018 | Danilin | |
| 2019/0072859 | A1 | 3/2019 | Jak et al. | |
| 2020/0026202 | A1 | 1/2020 | Takakura | |

FOREIGN PATENT DOCUMENTS

| | | | |
|---|---|---|---|
| JP | 2005-353818 | A | 12/2005 |
| JP | 2011-254076 | A | 12/2011 |
| JP | 2020-017581 | A | 1/2020 |
| JP | 2020-532759 | A | 11/2020 |

OTHER PUBLICATIONS

International Preliminary Report On Patentability and Written Opinion issued in PCT/JP2021/038992; issued Apr. 23, 2024.

* cited by examiner

FIG. 1

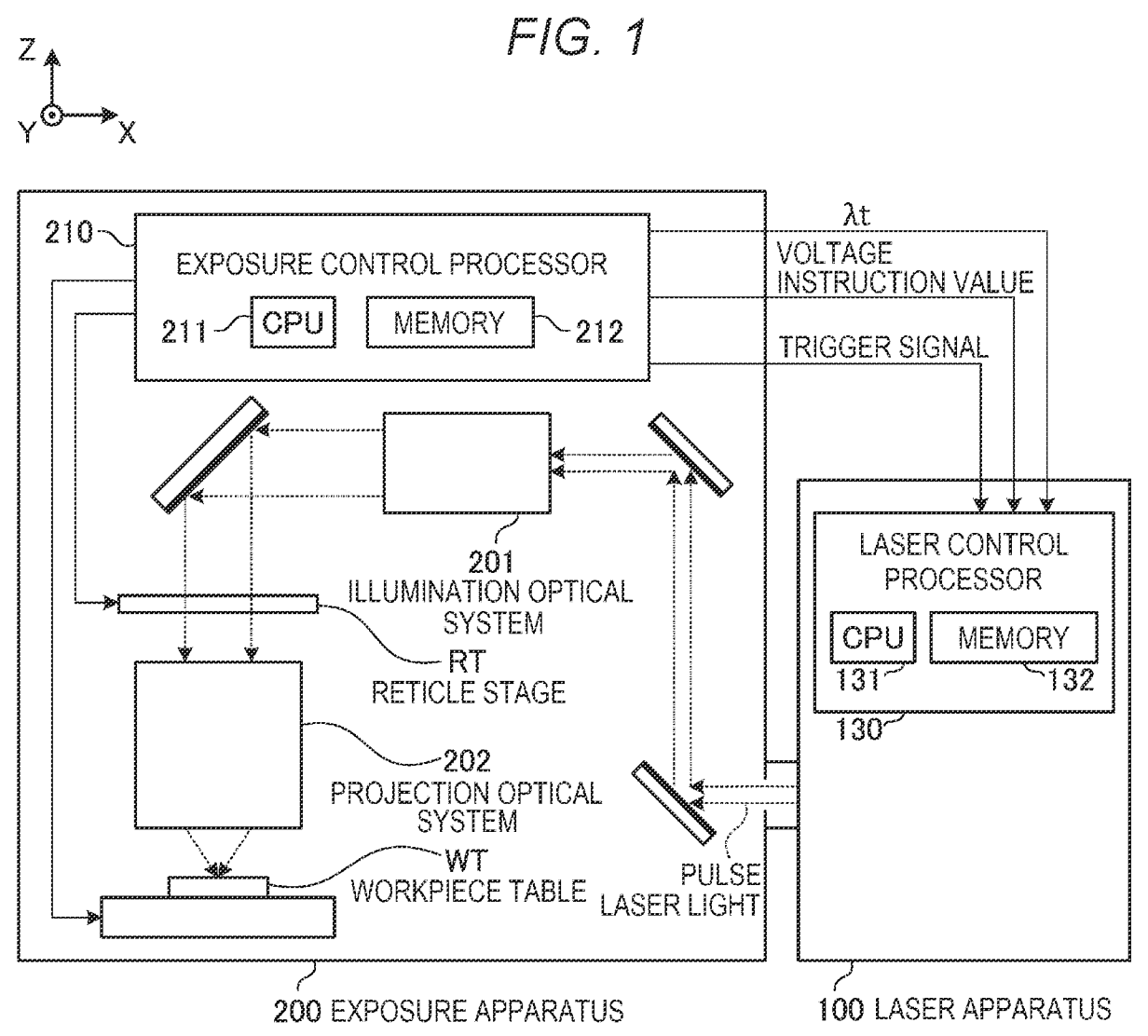

λt
VOLTAGE INSTRUCTION VALUE
TRIGGER SIGNAL
LASER CONTROL PROCESSOR
CPU
131
MEMORY
132
130
100 LASER APPARATUS
PULSE LASER LIGHT
EXPOSURE CONTROL PROCESSOR
CPU
211
MEMORY
212
210
201 ILLUMINATION OPTICAL SYSTEM
RT RETICLE STAGE
202 PROJECTION OPTICAL SYSTEM
WT WORKPIECE TABLE
200 EXPOSURE APPARATUS
Z
Y
X

LASER CONTROL PROCESSOR
CPU
MEMORY
131
132
130
PO
24
20a
21a
21b
20
20b
25
B2
17
17a
17b
BEAM MONITOR
32
31
B1
MO
15
10b
11a
11b
10
10a
14a
14c
14b
14
100
200
EXPOSURE APPARATUS

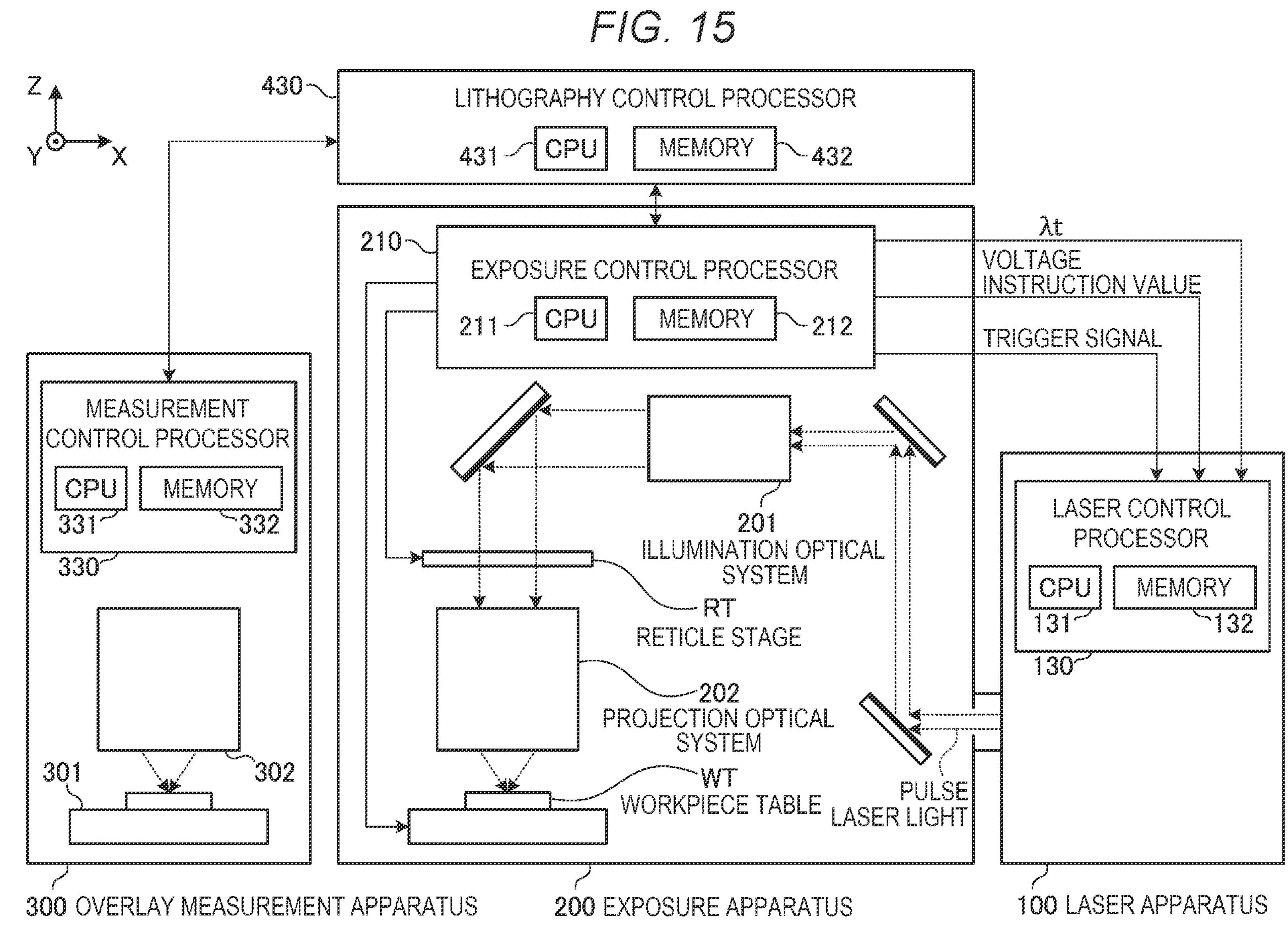
FIG. 15
Z
Y
X
430
LITHOGRAPHY CONTROL PROCESSOR
431
CPU
MEMORY
432
210
EXPOSURE CONTROL PROCESSOR
211
CPU
MEMORY
212
λt
VOLTAGE INSTRUCTION VALUE
TRIGGER SIGNAL
MEASUREMENT CONTROL PROCESSOR
CPU
MEMORY
331
332
330
201
ILLUMINATION OPTICAL SYSTEM
RT
RETICLE STAGE
202
PROJECTION OPTICAL SYSTEM
WT
WORKPIECE TABLE
PULSE LASER LIGHT
LASER CONTROL PROCESSOR
CPU
MEMORY
131
132
130
301
302
300 OVERLAY MEASUREMENT APPARATUS
200 EXPOSURE APPARATUS
100 LASER APPARATUS

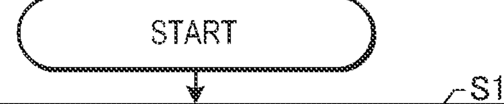

FIG. 16

START

S1 PRELIMINARY EXPOSURE

S2 OVERLAY MEASUREMENT APPARATUS MEASURES OVERLAY ERROR $D_{kij}$ ASSOCIATED WITH SEMICONDUCTOR WAFER HAVING UNDERGONE PRELIMINARY EXPOSURE S3 LITHOGRAPHY CONTROL PROCESSOR CALCULATES AMOUNTS OF WAVELENGTH ADJUSTMENT $\Delta\lambda_{Pj}$ AND $\Delta\lambda_{Mj}$ AND AMOUNTS OF FOCUS SHIFT $\Delta Z_{Pj}$ AND $\Delta Z_{Mj}$ DUE TO WAVELENGTH ADJUSTMENT S4 TRANSMIT TARGET WAVELENGTH $\lambda t$ TO LASER CONTROL PROCESSOR S5 LASER CONTROL PROCESSOR CONTROLS WAVELENGTH OF PULSE LASER LIGHT
LASER APPARATUS GENERATES AND OUTPUTS PULSE LASER LIGHT TO EXPOSURE APPARATUS S6 CONTROL Z-DIRECTION POSITION OF WORKPIECE TABLE IN ACCORDANCE WITH AMOUNTS OF FOCUS SHIFT WHILE PERFORMING SYNCHRONOUS CONTROL OF RETICLE STAGE AND WORKPIECE TABLE, AND EXPOSE SEMICONDUCTOR WAFER TO PULSE LASER LIGHT

S7 SHOULD EXPOSURE OPERATION BE TERMINATED?

NO

YES

END

*FIG. 19*

MEASURE OVERLAY ERROR $D_{kij}$ ASSOCIATED WITH SEMICONDUCTOR WAFER HAVING UNDERGONE PRELIMINARY EXPOSURE

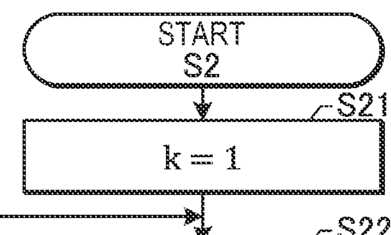

S22

MEASURE OVERLAY ERROR $D_{kij}$ AT k-TH SCAN FIELD FOR EACH IN-SCAN-FIELD POSITION (i, j)

S23

STORE OVERLAY ERROR $D_{kij}$ IN ASSOCIATION WITH METADATA, SUCH AS WAFER NUMBER, SCAN FIELD NUMBER k, AND SCAN DIRECTION

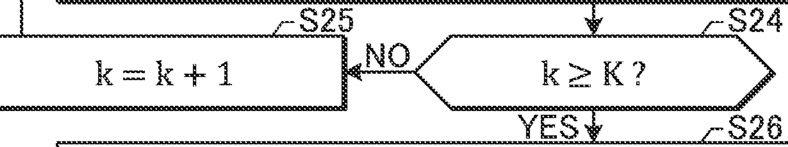

S26

TRANSMIT OVERLAY ERROR $D_{kij}$ AND METADATA TO LITHOGRAPHY CONTROL PROCESSOR

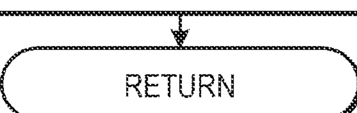

OVERLAY ERRORS $D_{1ij}$, $D_{3ij}$, AND $D_{5ij}$ IN SCAN FIELDS THAT UNDERGO FORWARD SCAN

AVERAGE $D_{PAij}$ OF OVERLAY ERRORS IN FORWARD SCAN

FIG. 25

OVERLAY ERROR $D_{kij}$

WAFER NUMBER 1

| SCAN FIELD NUMBER k = 1 | | | | | |
|---|---|---|---|---|---|
| FORWARD SCAN | | X-DIRECTION POSITION i | | | |
| | | 1 | 2 | ... | Imax |
| Y-DIRECTION POSITION j | 1 | $D_{111}$ | $D_{121}$ | ... | $D_{1Imax1}$ |
| | 2 | $D_{112}$ | $D_{122}$ | ... | $D_{1Imax2}$ |
| | ... | ... | ... | ... | ... |
| | Jmax | $D_{11Jmax}$ | $D_{12Jmax}$ | ... | $D_{1ImaxJmax}$ |
| SCAN FIELD NUMBER k = 2 | | | | | |
| REVERSE SCAN | | X-DIRECTION POSITION i | | | |
| | | 1 | 2 | ... | Imax |
| Y-DIRECTION POSITION j | 1 | $D_{211}$ | $D_{221}$ | ... | $D_{2Imax1}$ |
| | 2 | $D_{212}$ | $D_{222}$ | ... | $D_{2Imax2}$ |
| | ... | ... | ... | ... | ... |
| | Jmax | $D_{21Jmax}$ | $D_{22Jmax}$ | ... | $D_{2ImaxJmax}$ |
| SCAN FIELD NUMBER k = 3 | | | | | |
| FORWARD SCAN | | X-DIRECTION POSITION i | | | |
| | | 1 | 2 | ... | Imax |
| Y-DIRECTION POSITION j | 1 | $D_{311}$ | $D_{321}$ | ... | $D_{3Imax1}$ |
| | 2 | $D_{312}$ | $D_{322}$ | ... | $D_{3Imax2}$ |
| | ... | ... | ... | ... | ... |
| | Jmax | $D_{31Jmax}$ | $D_{32Jmax}$ | ... | $D_{3ImaxJmax}$ |
| ... | | | | | |
| SCAN FIELD NUMBER k = K | | | | | |
| REVERSE SCAN | | X-DIRECTION POSITION i | | | |
| | | 1 | 2 | ... | Imax |
| Y-DIRECTION POSITION j | 1 | $D_{K11}$ | $D_{K21}$ | ... | $D_{KImax1}$ |
| | 2 | $D_{K12}$ | $D_{K22}$ | ... | $D_{KImax2}$ |
| | ... | ... | ... | ... | ... |
| | Jmax | $D_{K1Jmax}$ | $D_{K2Jmax}$ | ... | $D_{KImaxJmax}$ |

FIG. 26

AVERAGE $D_{PAij}$ OF OVERLAY ERRORS IN FORWARD SCAN

| | | X-DIRECTION POSITION i | | | |
|---|---|---|---|---|---|
| | | 1 | 2 | ··· | Imax |
| Y-DIRECTION POSITION j | 1 | $D_{PA11}$ | $D_{PA21}$ | ··· | $D_{PAImax1}$ |
| | 2 | $D_{PA12}$ | $D_{PA22}$ | ··· | $D_{PAImax2}$ |
| | ··· | ··· | ··· | ··· | ··· |
| | Jmax | $D_{PA1Jmax}$ | $D_{PA2Jmax}$ | ··· | $D_{PAImaxJmax}$ |

FIG. 27

AVERAGE $D_{MAij}$ OF OVERLAY ERRORS IN REVERSE SCAN

| | | X-DIRECTION POSITION i | | | |
|---|---|---|---|---|---|
| | | 1 | 2 | ··· | Imax |
| Y-DIRECTION POSITION j | 1 | $D_{MA11}$ | $D_{MA21}$ | ··· | $D_{MAImax1}$ |
| | 2 | $D_{MA12}$ | $D_{MA22}$ | ··· | $D_{MAImax2}$ |
| | ··· | ··· | ··· | ··· | ··· |
| | Jmax | $D_{MA1Jmax}$ | $D_{MA2Jmax}$ | ··· | $D_{MAImaxJmax}$ |

FIG. 28
CALCULATE DISTORTION SENSITIVITY $(d\beta/d\lambda)_i$ OF PROJECTION OPTICAL SYSTEM WITH RESPECT TO WAVELENGTH
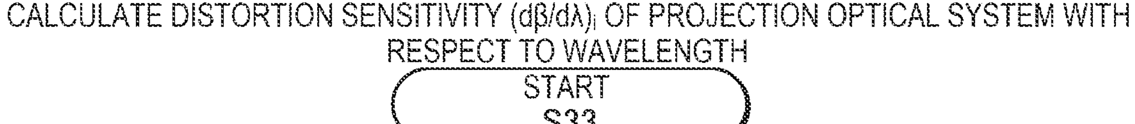
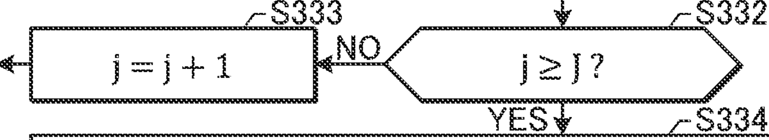
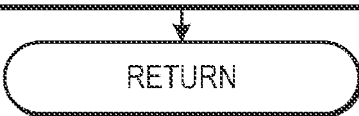

FIG. 29

DISTORTION SENSITIVITY $(d\beta/d\lambda)_{ij}$ AT POSITIONS (i, j) IN BEAM CROSS-SECTION

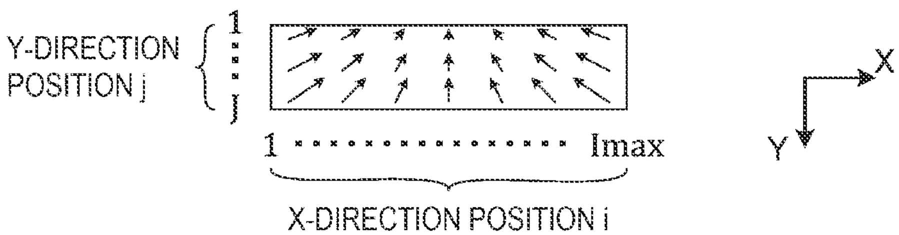

FIG. 30

DISTORTION SENSITIVITY $(d\beta/d\lambda)_i$ AT X-DIRECTION POSITIONS i

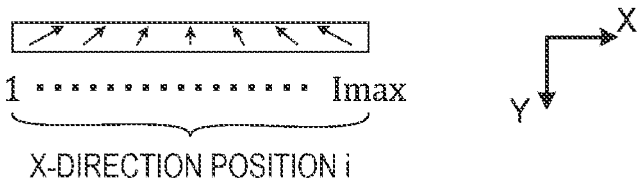

FIG. 31

DISTORTION SENSITIVITY $(d\beta/d\lambda)_{ij}$ AT POSITIONS (i, j) IN BEAM CROSS-SECTION

| | | X-DIRECTION POSITION i | | | |
|---|---|---|---|---|---|
| | | 1 | 2 | ··· | Imax |
| Y-DIRECTION POSITION j | 1 | $(d\beta/d\lambda)_{11}$ | $(d\beta/d\lambda)_{21}$ | ··· | $(d\beta/d\lambda)_{Imax1}$ |
| | 2 | $(d\beta/d\lambda)_{12}$ | $(d\beta/d\lambda)_{22}$ | ··· | $(d\beta/d\lambda)_{Imax2}$ |
| | 3 | $(d\beta/d\lambda)_{13}$ | $(d\beta/d\lambda)_{23}$ | ··· | $(d\beta/d\lambda)_{Imax3}$ |

FIG. 32

| X-DIRECTION POSITION i | 1 | 2 | ··· | Imax |
|---|---|---|---|---|
| DISTORTION SENSITIVITY $(d\beta/d\lambda)_i$ AT X-DIRECTION POSITIONS i | $(d\beta/d\lambda)_1$ | $(d\beta/d\lambda)_2$ | ··· | $(d\beta/d\lambda)_{Imax}$ |

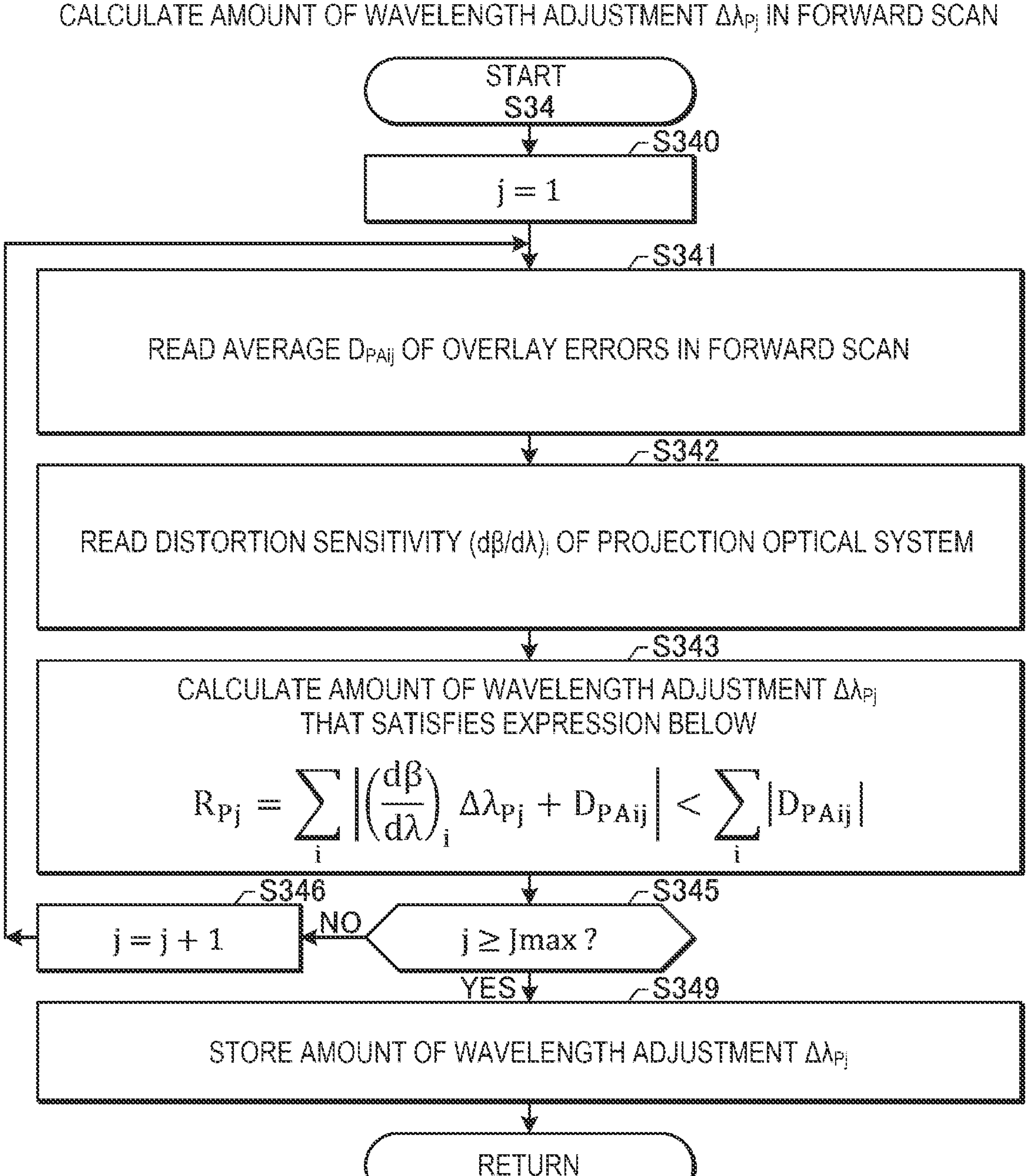
FIG. 33
CALCULATE AMOUNT OF WAVELENGTH ADJUSTMENT $\Delta\lambda_{Pj}$ IN FORWARD SCAN
START
S34
S340
$j = 1$
S341
READ AVERAGE $D_{PAij}$ OF OVERLAY ERRORS IN FORWARD SCAN
S342
READ DISTORTION SENSITIVITY $(d\beta/d\lambda)_i$ OF PROJECTION OPTICAL SYSTEM
S343
CALCULATE AMOUNT OF WAVELENGTH ADJUSTMENT $\Delta\lambda_{Pj}$
THAT SATISFIES EXPRESSION BELOW
$R_{Pj} = \sum_i \left| \left(\frac{d\beta}{d\lambda}\right)_i \Delta\lambda_{Pj} + D_{PAij} \right| < \sum_i |D_{PAij}|$
S346
$j = j + 1$
NO
S345
$j \geq Jmax$ ?
YES
S349
STORE AMOUNT OF WAVELENGTH ADJUSTMENT $\Delta\lambda_{Pj}$
RETURN DISTORTION SENSITIVITY $(d\beta/d\lambda)_i$ AT X-DIRECTION POSITIONS i

1

REVERSE SCAN

Y-DIRECTION POSITION j

AVERAGE $D_{MAij}$ OF OVERLAY ERRORS IN REVERSE SCAN

Jmax

X

Y

1 Imax

X-DIRECTION POSITION i

FIG. 39

IN FORWARD SCAN

| Y-DIRECTION POSITION j | AMOUNT OF WAVELENGTH ADJUSTMENT $\Delta\lambda_{Pj}$ | AMOUNT OF FOCUS SHIFT $\Delta Z_{Pj}$ |
|---|---|---|
| 1 | $\Delta\lambda_{P1}$ | $\Delta Z_{P1}$ |
| 2 | $\Delta\lambda_{P2}$ | $\Delta Z_{P2}$ |
| ... | ... | ... |
| Jmax | $\Delta\lambda_{PJmax}$ | $\Delta Z_{PJmax}$ |

FIG. 40

IN REVERSE SCAN

| Y-DIRECTION POSITION j | AMOUNT OF WAVELENGTH ADJUSTMENT $\Delta\lambda_{Mj}$ | AMOUNT OF FOCUS SHIFT $\Delta Z_{Mj}$ |
|---|---|---|
| 1 | $\Delta\lambda_{M1}$ | $\Delta Z_{M1}$ |
| 2 | $\Delta\lambda_{M2}$ | $\Delta Z_{M2}$ |
| ... | ... | ... |
| Jmax | $\Delta\lambda_{MJmax}$ | $\Delta Z_{MJmax}$ |

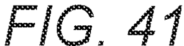

FIG. 41

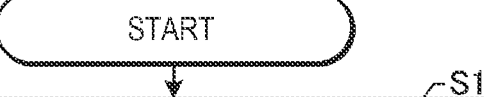

S1: PRELIMINARY EXPOSURE

S2: OVERLAY MEASUREMENT APPARATUS MEASURES OVERLAY ERROR $D_{kij}$ ASSOCIATED WITH SEMICONDUCTOR WAFER HAVING UNDERGONE PRELIMINARY EXPOSURE S3b: LITHOGRAPHY CONTROL PROCESSOR CALCULATES AMOUNTS OF WAVELENGTH ADJUSTMENT $\Delta\lambda_{XPj}$ AND $\Delta\lambda_{XMj}$, SYNCHRONOUS CONTROL CORRECTION VALUES $S_{YPj}$ AND $S_{YMj}$, AND AMOUNTS OF FOCUS SHIFT $\Delta Z_{XPj}$ and $\Delta Z_{XMj}$ DUE TO WAVELENGTH ADJUSTMENT S4: TRANSMIT TARGET WAVELENGTH λt TO LASER CONTROL PROCESSOR S5: LASER CONTROL PROCESSOR CONTROLS WAVELENGTH OF PULSE LASER LIGHT
LASER APPARATUS GENERATES AND OUTPUTS PULSE LASER LIGHT TO EXPOSURE APPARATUS S6: CONTROL Z-DIRECTION POSITION OF WORKPIECE TABLE IN ACCORDANCE WITH AMOUNTS OF FOCUS SHIFT WHILE PERFORMING SYNCHRONOUS CONTROL OF RETICLE STAGE AND WORKPIECE TABLE, AND EXPOSE SEMICONDUCTOR WAFER TO PULSE LASER LIGHT

S7: SHOULD EXPOSURE OPERATION BE TERMINATED?

NO

YES

END

FIG. 42

CALCULATE AMOUNTS OF WAVELENGTH ADJUSTMENT $\Delta\lambda_{XPj}$ AND $\Delta\lambda_{XMj}$, SYNCHRONOUS CONTROL CORRECTION VALUES $S_{YPj}$ AND $S_{YMj}$, AND AMOUNTS OF FOCUS SHIFT $\Delta Z_{XPj}$ and $\Delta Z_{XMj}$ DUE TO WAVELENGTH ADJUSTMENT

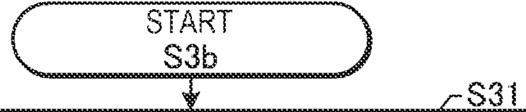

S31: CALCULATE AVERAGE $D_{PAij}$ OF OVERLAY ERRORS IN FORWARD SCAN FOR EACH IN-SCAN-FIELD POSITION (i, j)

S32: CALCULATE AVERAGE $D_{MAij}$ OF OVERLAY ERRORS IN REVERSE SCAN FOR EACH IN-SCAN-FIELD POSITION (i, j)

S33: CALCULATE DISTORTION SENSITIVITY $(d\beta/d\lambda)_i$ OF PROJECTION OPTICAL SYSTEM WITH RESPECT TO WAVELENGTH S34b: CALCULATE AMOUNT OF WAVELENGTH ADJUSTMENT $\Delta\lambda_{XPj}$ AND SYNCHRONOUS CONTROL CORRECTION VALUE $S_{YPj}$ IN FORWARD SCAN S35b: CALCULATE AMOUNT OF WAVELENGTH ADJUSTMENT $\Delta\lambda_{XMj}$ AND SYNCHRONOUS CONTROL CORRECTION VALUE $S_{YMj}$ IN REVERSE SCAN S36b: CALCULATE AMOUNTS OF FOCUS SHIFT $\Delta Z_{XPj}$ and $\Delta Z_{XMj}$ FROM AMOUNTS OF WAVELENGTH ADJUSTMENT $\Delta\lambda_{XPj}$ AND $\Delta\lambda_{XMj}$ AND FOCUS SENSITIVITY $dF/d\lambda$ OF PROJECTION OPTICAL SYSTEM WITH RESPECT TO WAVELENGTH S37b: TRANSMIT TARGET WAVELENGTH $\lambda t$, SYNCHRONOUS CONTROL CORRECTION VALUES $S_{YPj}$ AND $S_{YMj}$, AND AMOUNTS OF FOCUS SHIFT $\Delta Z_{XPj}$ AND $\Delta Z_{XMj}$ TO EXPOSURE CONTROL PROCESSOR

RETURN

FIG. 43

CALCULATE AMOUNT OF WAVELENGTH ADJUSTMENT $\Delta\lambda_{XPj}$ AND SYNCHRONOUS CONTROL CORRECTION VALUE $S_{YPj}$ IN FORWARD SCAN

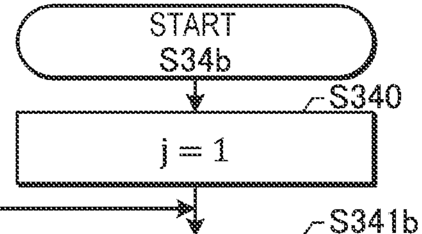

S341b: READ AVERAGE $D_{PAij}$ OF OVERLAY ERRORS IN FORWARD SCAN, AND CALCULATE VECTOR X-DIRECTION COMPONENT $D_{XPAij}$ AND Y-DIRECTION VECTOR COMPONENT $D_{YPAij}$

S342b: READ DISTORTION SENSITIVITY $(d\beta/d\lambda)_i$ OF PROJECTION OPTICAL SYSTEM, AND CALCULATE X-DIRECTION VECTOR COMPONENT $(d\beta_X/d\lambda)_i$ AND Y-DIRECTION VECTOR COMPONENT $(d\beta_Y/d\lambda)_i$ S343b: CALCULATE AMOUNT OF WAVELENGTH ADJUSTMENT $\Delta\lambda_{XPj}$ THAT SATISFIES EXPRESSION BELOW $$R_{XPj} = \sum_i \left| \left(\frac{d\beta_X}{d\lambda}\right)_i \Delta\lambda_{XPj} + D_{XPAij} \right| < \sum_i \left| D_{XPAij} \right|$$

S344b: CALCULATE SYNCHRONOUS CONTROL CORRECTION VALUE $S_{YPj}$ $$S_{YPj} = \frac{1}{Imax} \sum_{i=1}^{Imax} \left[ \left(\frac{d\beta_Y}{d\lambda}\right)_i \Delta\lambda_{XPj} + D_{YPAij} \right]$$

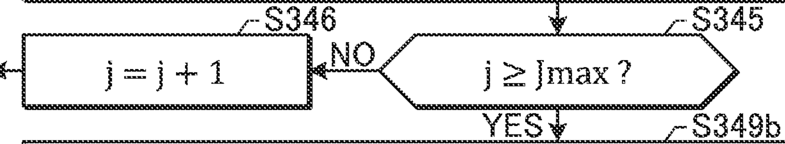

YES

S349b: STORE AMOUNT OF WAVELENGTH ADJUSTMENT $\Delta\lambda_{XPj}$ AND SYNCHRONOUS CONTROL CORRECTION VALUE $S_{YPj}$

RETURN

FIG. 44

CALCULATE AMOUNT OF WAVELENGTH ADJUSTMENT $\Delta\lambda_{XMj}$ AND SYNCHRONOUS CONTROL CORRECTION VALUE $S_{YMj}$ IN REVERSE SCAN

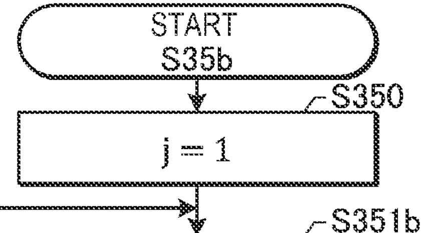

S351b

READ AVERAGE $D_{MAij}$ OF OVERLAY ERRORS IN REVERSE SCAN, AND CALCULATE X-DIRECTION VECTOR COMPONENT $D_{XMAij}$ AND Y-DIRECTION VECTOR COMPONENT $D_{YMAij}$

S352b

READ DISTORTION SENSITIVITY $(d\beta/d\lambda)_i$ OF PROJECTION OPTICAL SYSTEM, AND CALCULATE X-DIRECTION VECTOR COMPONENT $(d\beta_X/d\lambda)_i$ AND Y-DIRECTION VECTOR COMPONENT $(d\beta_Y/d\lambda)_i$ S353b CALCULATE AMOUNT OF WAVELENGTH ADJUSTMENT $\Delta\lambda_{XMj}$ THAT SATISFIES EXPRESSION BELOW $$R_{XMj} = \sum_i \left| \left(\frac{d\beta_X}{d\lambda}\right)_i \Delta\lambda_{XMj} + D_{XMAij} \right| < \sum_i \left| D_{XMAij} \right|$$

S354b

CALCULATE SYNCHRONOUS CONTROL CORRECTION VALUE $S_{YMj}$ $$S_{YMj} = \frac{1}{Imax} \sum_{i=1}^{Imax} \left[ \left(\frac{d\beta_Y}{d\lambda}\right)_i \Delta\lambda_{XMj} + D_{YMAij} \right]$$

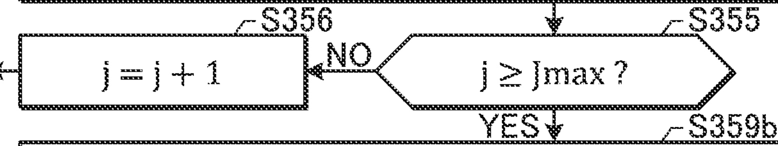

S359b

STORE AMOUNT OF WAVELENGTH ADJUSTMENT $\Delta\lambda_{XMj}$ AND SYNCHRONOUS CONTROL CORRECTION VALUE $S_{YMj}$

RETURN

FIG. 52

IN FORWARD SCAN

| Y-DIRECTION POSITION j | AMOUNT OF WAVELENGTH ADJUSTMENT $\Delta\lambda_{XPj}$ | SYNCHRONOUS CONTROL CORRECTION VALUE $S_{YPj}$ | AMOUNT OF FOCUS SHIFT $\Delta Z_{XPj}$ |
|---|---|---|---|
| 1 | $\Delta\lambda_{XP1}$ | $S_{YP1}$ | $\Delta Z_{XP1}$ |
| 2 | $\Delta\lambda_{XP2}$ | $S_{YP2}$ | $\Delta Z_{XP2}$ |
| ... | ... | ... | ... |
| Jmax | $\Delta\lambda_{XPJmax}$ | $S_{YPJmax}$ | $\Delta Z_{XPJmax}$ |

FIG. 53

IN REVERSE SCAN

| Y-DIRECTION POSITION j | AMOUNT OF WAVELENGTH ADJUSTMENT $\Delta\lambda_{XMj}$ | SYNCHRONOUS CONTROL CORRECTION VALUE $S_{YMj}$ | AMOUNT OF FOCUS SHIFT $\Delta Z_{XMj}$ |
|---|---|---|---|
| 1 | $\Delta\lambda_{XM1}$ | $S_{YM1}$ | $\Delta Z_{XM1}$ |
| 2 | $\Delta\lambda_{XM2}$ | $S_{YM2}$ | $\Delta Z_{XM2}$ |
| ... | ... | ... | ... |
| Jmax | $\Delta\lambda_{XMJmax}$ | $S_{YMJmax}$ | $\Delta Z_{XMJmax}$ |

CALCULATE AMOUNT OF WAVELENGTH ADJUSTMENT $\Delta\lambda_{nj}$ AND AMOUNT OF FOCUS SHIFT $\Delta Z_{nj}$ DUE TO WAVELENGTH ADJUSTMENT

FIG. 58

AVERAGE $D_{Anij}$ OF OVERLAY ERRORS

| SCAN FIELD NUMBER n = 1 | | | | | |
|---|---|---|---|---|---|
| FORWARD SCAN | | X-DIRECTION POSITION i | | | |
| | | 1 | 2 | ・・・ | Imax |
| Y-DIRECTION POSITION j | 1 | $D_{A111}$ | $D_{A121}$ | ・・・ | $D_{A1Imax1}$ |
| | 2 | $D_{A112}$ | $D_{A122}$ | ・・・ | $D_{A1Imax2}$ |
| | ・・・ | ・・・ | ・・・ | ・・・ | ・・・ |
| | Jmax | $D_{A11Jmax}$ | $D_{A12Jmax}$ | ・・・ | $D_{A1ImaxJmax}$ |
| SCAN FIELD NUMBER n = 2 | | | | | |
| REVERSE SCAN | | X-DIRECTION POSITION i | | | |
| | | 1 | 2 | ・・・ | Imax |
| Y-DIRECTION POSITION j | 1 | $D_{A211}$ | $D_{A221}$ | ・・・ | $D_{A2Imax1}$ |
| | 2 | $D_{A212}$ | $D_{A222}$ | ・・・ | $D_{A2Imax2}$ |
| | ・・・ | ・・・ | ・・・ | ・・・ | ・・・ |
| | Jmax | $D_{A21Jmax}$ | $D_{A22Jmax}$ | ・・・ | $D_{A2ImaxJmax}$ |
| SCAN FIELD NUMBER n = 3 | | | | | |
| FORWARD SCAN | | X-DIRECTION POSITION i | | | |
| | | 1 | 2 | ・・・ | Imax |
| Y-DIRECTION POSITION j | 1 | $D_{A311}$ | $D_{A321}$ | ・・・ | $D_{A3Imax1}$ |
| | 2 | $D_{A312}$ | $D_{A322}$ | ・・・ | $D_{A3Imax2}$ |
| | ・・・ | ・・・ | ・・・ | ・・・ | ・・・ |
| | Jmax | $D_{A31Jmax}$ | $D_{A32Jmax}$ | ・・・ | $D_{A3ImaxJmax}$ |
| ・・・ | | | | | |
| SCAN FIELD NUMBER n = Nmax | | | | | |
| REVERSE SCAN | | X-DIRECTION POSITION i | | | |
| | | 1 | 2 | ・・・ | Imax |
| Y-DIRECTION POSITION j | 1 | $D_{ANmax11}$ | $D_{ANmax21}$ | ・・・ | $D_{ANmaxImax1}$ |
| | 2 | $D_{ANmax12}$ | $D_{ANmax22}$ | ・・・ | $D_{ANmaxImax2}$ |
| | ・・・ | ・・・ | ・・・ | ・・・ | ・・・ |
| | Jmax | $D_{ANmax1Jmax}$ | $D_{ANmax2Jmax}$ | ・・・ | $D_{ANmaxImaxJmax}$ |

*FIG. 60*

| SCAN FIELD NUMBER $n = 1$ | | |
|---|---|---|
| j | $\Delta\lambda_{nj}$ | $\Delta Z_{nj}$ |
| 1 | $\Delta\lambda_{11}$ | $\Delta Z_{11}$ |
| 2 | $\Delta\lambda_{12}$ | $\Delta Z_{12}$ |
| ... | ... | ... |
| Jmax | $\Delta\lambda_{1Jmax}$ | $\Delta Z_{1Jmax}$ |
| SCAN FIELD NUMBER $n = 2$ | | |
| j | $\Delta\lambda_{nj}$ | $\Delta Z_{nj}$ |
| 1 | $\Delta\lambda_{21}$ | $\Delta Z_{21}$ |
| 2 | $\Delta\lambda_{22}$ | $\Delta Z_{22}$ |
| ... | ... | ... |
| Jmax | $\Delta\lambda_{2Jmax}$ | $\Delta Z_{2Jmax}$ |
| SCAN FIELD NUMBER $n = 3$ | | |
| j | $\Delta\lambda_{nj}$ | $\Delta Z_{nj}$ |
| 1 | $\Delta\lambda_{31}$ | $\Delta Z_{31}$ |
| 2 | $\Delta\lambda_{32}$ | $\Delta Z_{32}$ |
| ... | ... | ... |
| Jmax | $\Delta\lambda_{3Jmax}$ | $\Delta Z_{3Jmax}$ |
| ... | | |
| SCAN FIELD NUMBER $n = Nmax$ | | |
| j | $\Delta\lambda_{nj}$ | $\Delta Z_{nj}$ |
| 1 | $\Delta\lambda_{Nmax1}$ | $\Delta Z_{Nmax1}$ |
| 2 | $\Delta\lambda_{Nmax2}$ | $\Delta Z_{Nmax2}$ |
| ... | ... | ... |
| Jmax | $\Delta\lambda_{NmaxJmax}$ | $\Delta Z_{NmaxJmax}$ |

FIG. 63

CALCULATE AMOUNT OF WAVELENGTH ADJUSTMENT $\Delta\lambda_{Xnj}$ AND SYNCHRONOUS CONTROL CORRECTION VALUE $S_{Ynj}$

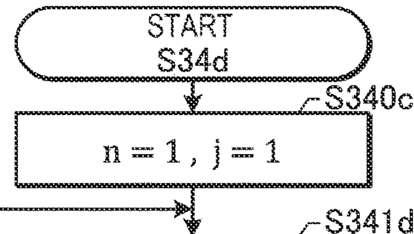

S341d: READ AVERAGE $D_{Anij}$ OF OVERLAY ERRORS, AND CALCULATE X-DIRECTION VECTOR COMPONENT $D_{XAnij}$ AND Y-DIRECTION VECTOR COMPONENT $D_{YAnij}$ S342b: READ DISTORTION SENSITIVITY $(d\beta/d\lambda)_i$ OF PROJECTION OPTICAL SYSTEM, AND CALCULATE X-DIRECTION VECTOR COMPONENT $(d\beta_X/d\lambda)_i$ AND Y-DIRECTION VECTOR COMPONENT $(d\beta_Y/d\lambda)_i$ S343d: CALCULATE AMOUNT OF WAVELENGTH ADJUSTMENT $\Delta\lambda_{Xnj}$ THAT SATISFIES EXPRESSION BELOW $$R_{Xnj} = \sum_i \left| \left(\frac{d\beta_X}{d\lambda}\right)_i \Delta\lambda_{Xnj} + D_{XAnij} \right| < \sum_i \left| D_{XAnij} \right|$$

S344d: CALCULATE SYNCHRONOUS CONTROL CORRECTION VALUE $S_{Ynj}$ $$S_{Ynj} = \frac{1}{Imax} \sum_{i=1}^{Imax} \left[ \left(\frac{d\beta_Y}{d\lambda}\right)_i \Delta\lambda_{Xnj} + D_{YAnij} \right]$$

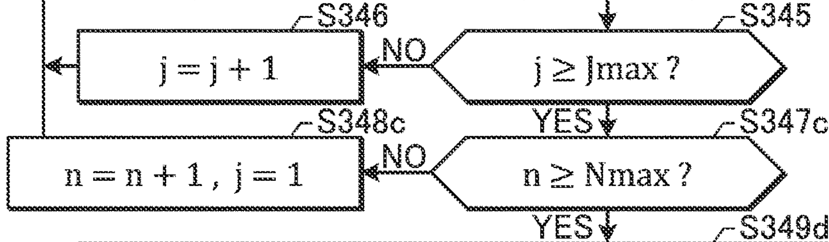

S349d: STORE AMOUNT OF WAVELENGTH ADJUSTMENT $\Delta\lambda_{Xnj}$ AND SYNCHRONOUS CONTROL CORRECTION VALUE $S_{Ynj}$

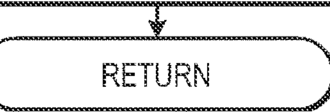

FIG. 64

| SCAN FIELD NUMBER n = 1 | | | |
|---|---|---|---|
| j | $\Delta\lambda_{Xnj}$ | $S_{Ynj}$ | $\Delta Z_{Xnj}$ |
| 1 | $\Delta\lambda_{X11}$ | $S_{Y11}$ | $\Delta Z_{X11}$ |
| 2 | $\Delta\lambda_{X12}$ | $S_{Y12}$ | $\Delta Z_{X12}$ |
| ... | ... | ... | ... |
| Jmax | $\Delta\lambda_{X1Jmax}$ | $S_{Y1Jmax}$ | $\Delta Z_{X1Jmax}$ |
| SCAN FIELD NUMBER n = 2 | | | |
| j | $\Delta\lambda_{Xnj}$ | $S_{Ynj}$ | $\Delta Z_{Xnj}$ |
| 1 | $\Delta\lambda_{X21}$ | $S_{Y21}$ | $\Delta Z_{X21}$ |
| 2 | $\Delta\lambda_{X22}$ | $S_{Y22}$ | $\Delta Z_{X22}$ |
| ... | ... | ... | ... |
| Jmax | $\Delta\lambda_{X2Jmax}$ | $S_{Y2Jmax}$ | $\Delta Z_{X2Jmax}$ |
| SCAN FIELD NUMBER n = 3 | | | |
| j | $\Delta\lambda_{Xnj}$ | $S_{Ynj}$ | $\Delta Z_{Xnj}$ |
| 1 | $\Delta\lambda_{X31}$ | $S_{Y31}$ | $\Delta Z_{X31}$ |
| 2 | $\Delta\lambda_{X32}$ | $S_{Y32}$ | $\Delta Z_{X32}$ |
| ... | ... | ... | ... |
| Jmax | $\Delta\lambda_{X3Jmax}$ | $S_{Y3Jmax}$ | $\Delta Z_{X3Jmax}$ |
| ... | | | |
| SCAN FIELD NUMBER n = Nmax | | | |
| j | $\Delta\lambda_{Xnj}$ | $S_{Ynj}$ | $\Delta Z_{Xnj}$ |
| 1 | $\Delta\lambda_{XNmax1}$ | $S_{YNmax1}$ | $\Delta Z_{XNmax1}$ |
| 2 | $\Delta\lambda_{XNmax2}$ | $S_{YNmax2}$ | $\Delta Z_{XNmax2}$ |
| ... | ... | ... | ... |
| Jmax | $\Delta\lambda_{XNmaxJmax}$ | $S_{YNmaxJmax}$ | $\Delta Z_{XNmaxJmax}$ |

ELECTRONIC DEVICE MANUFACTURING METHOD AND LITHOGRAPHY CONTROL PROCESSOR

CROSS-REFERENCE TO RELATED APPLICATIONS

The present application is a continuation application of International Application No. PCT/JP2021/038992, filed on Oct. 21, 2021, the entire contents of which are hereby incorporated by reference.

BACKGROUND

1. Technical Field

The present disclosure relates to an electronic device manufacturing method and a lithography control processor.

2. Related Art

In recent years, a semiconductor exposure apparatus is required to improve the resolution thereof as semiconductor integrated circuits are increasingly miniaturized and highly integrated. To this end, reduction in the wavelength of light emitted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

The light from spontaneously oscillating KrF and ArF excimer laser apparatuses has a wide spectral linewidth ranging from 350 to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light output from the gas laser apparatus needs to be narrow enough to make the chromatic aberrations negligible. To this end, a line narrowing module (LNM) including a line narrowing element (such as etalon and grating) is provided in some cases in a laser resonator of the gas laser apparatus to narrow the spectral linewidth. A gas laser apparatus providing a narrowed spectral linewidth is hereinafter referred to as a narrowed-line laser apparatus.

CITATION LIST

Patent Literature

[PTL 1] JPH07-245251A
[PTL 2] U.S. Pat. No. 6,256,086B

SUMMARY

In an aspect of the present disclosure, an electronic device manufacturing method includes performing scanning exposure in which plural scan fields of a first photosensitive substrate are exposed to pulse laser light having a reference wavelength, measuring overlay errors at plural positions in each of the plural scan fields, calculating an average of the overlay errors at each of the plural positions in scan fields scanned in the same scan direction out of the plural scan fields, calculating an amount of wavelength adjustment with respect to the reference wavelength in such a way that a first overlay error parameter calculated from the averages and distortions produced when a wavelength of the pulse laser light is changed from the reference wavelength is smaller than a second overlay error parameter calculated from the averages, causing a laser apparatus to generate the pulse laser light having a wavelength controlled by using the amount of wavelength adjustment, outputting the pulse laser light to an exposure apparatus, and exposing a second photosensitive substrate to the pulse laser light in the exposure apparatus to manufacture electronic devices.

In another aspect of the present disclosure, a lithography control processor includes a non-transitory computer-readable storage medium configured to store a lithography control program, and a CPU. The lithography control program causes the CPU to acquire overlay errors at plural positions in each of plural scan fields of a first photosensitive substrate that undergoes scanning exposure in which the plural scan fields are exposed to pulse laser light having a reference wavelength, calculate an average of the overlay errors at each of the plural positions in scan fields scanned in the same scan direction out of the plural scan fields, and calculate an amount of wavelength adjustment with respect to the reference wavelength in such a way that a first overlay error parameter calculated from the averages and distortions produced when a wavelength of the pulse laser light is changed from the reference wavelength is smaller than a second overlay error parameter calculated from the averages.

BRIEF DESCRIPTION OF DRAWINGS

Embodiments of the present disclosure will be described below only by way of example with reference to the accompanying drawings.

FIG. 1 schematically shows the configuration of a lithography system in Comparative Example.

FIG. 15 schematically shows the configuration of the lithography system in a first embodiment.

FIG. 16 is a flowchart showing the process of exposing the semiconductor wafer to the pulse laser light in such a way that the overlay errors are reduced in the first embodiment.

FIG. 19 is a flowchart showing the process of measuring the overlay error in detail.

FIG. 25 shows a data table of the overlay errors stored in a memory in S23 in FIG. 19.

FIG. 26 shows a data table of the average of the overlay errors in the forward scan.

FIG. 27 shows a data table of the average of the overlay errors in the reverse scan.

FIG. 28 is a flowchart showing the process of calculating distortion sensitivity at an X-direction position in detail.

FIG. 29 conceptually shows the distortion sensitivity at X-direction and Y-direction positions.

FIG. 30 conceptually shows the distortion sensitivity at an X-direction position.

FIG. 31 shows a data table of the distortion sensitivity at X-direction and Y-direction positions.

FIG. 32 shows a data table of the distortion sensitivity at X-direction positions.

FIG. 33 is a flowchart showing the process of calculating the amount of wavelength adjustment in the forward scan in detail.

FIG. 39 shows a data table of the amount of wavelength adjustment and the amount of focus shift in the forward scan.

FIG. 40 shows a data table of the amount of wavelength adjustment and the amount of focus shift in the reverse scan.

FIG. 41 is a flowchart showing the process of exposing the semiconductor wafer to the pulse laser light in such a way that the overlay errors are reduced in a second embodiment.

FIG. 42 is a flowchart showing the process of calculating the amounts of wavelength adjustment, synchronous control correction values, and the amounts of focus shift in detail.

FIG. 43 is a flowchart showing the process of calculating the amount of wavelength adjustment and the synchronous control correction value in the forward scan in detail.

FIG. 44 is a flowchart showing the process of calculating the amount of wavelength adjustment and the synchronous control correction value in the reverse scan in detail.

FIG. 52 shows a data table of the amount of wavelength adjustment, the synchronous control correction value, and the amount of focus shift in the forward scan.

FIG. 53 shows a data table of the amount of wavelength adjustment, the synchronous control correction value, and the amount of focus shift in the reverse scan.

FIG. 58 shows a data table of the average of the overlay errors.

FIG. 60 shows a data table of the amount of wavelength adjustment and the amount of focus shift.

FIG. 63 is a flowchart showing the process of calculating the amount of wavelength adjustment and the synchronous control correction value in detail.

FIG. 64 shows a data table of the amount of wavelength adjustment, the synchronous control correction value, and the amount of focus shift.

DETAILED DESCRIPTION

Contents

Figure 2:
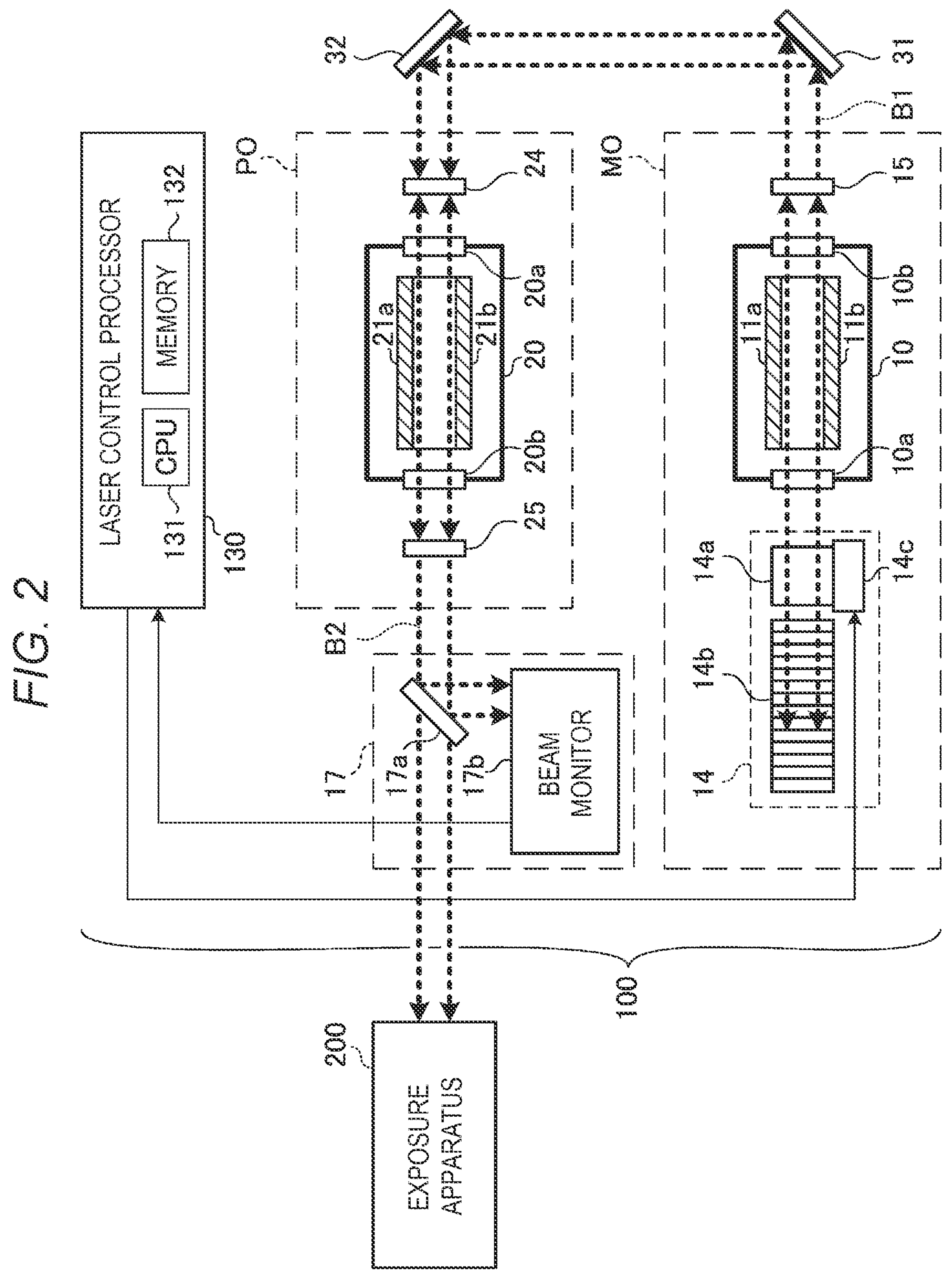
FIG. 2 schematically shows the configuration of a laser apparatus in Comparative Example.

1. Comparative Example
1.1 Lithography system
1.2 Exposure apparatus 200
1.2.1 Configuration
1.2.2 Operation
1.3 Laser apparatus 100
1.3.1 Configuration
1.3.2 Operation
1.4 Scanning exposure
1.5 Problems with Comparative Example
2. Lithography system that calculates amounts of wavelength adjustment $\Delta\lambda_{Pj}$ and $\Delta\lambda_{Mj}$ and amounts of focus shift $\Delta Z_{Pj}$ and $\Delta Z_{Mj}$ for each scan direction
2.1 Configuration
2.2 Operation
2.2.1 Main procedure
2.2.2 Preliminary exposure
2.2.3 Measurement of overlay error $D_{kij}$
2.2.4 Calculation of amounts of wavelength adjustment $\Delta\lambda_{Pj}$ and $\Delta\lambda_{Mj}$ and amounts of focus shift $\Delta Z_{Pj}$ and $\Delta Z_{Mj}$
2.2.4.1 Calculation of distortion sensitivity $(d\beta/d\lambda)_i$
2.2.4.2 Calculation of amounts of wavelength adjustment $\Delta\lambda_{Pj}$ and $\Delta\lambda_{Mj}$
2.3 Effects
3. Lithography system that calculates synchronous control correction values $S_{YPj}$ and $S_{YMj}$ for each scan direction
3.1 Operation
3.1.1 Main procedure
3.1.2 Calculation of amounts of wavelength adjustment $\Delta\lambda_{XPj}$ and $\Delta\lambda_{XMj}$, synchronous control correction values $S_{YPj}$ and $S_{YMj}$, and amounts of focus shift $\Delta Z_{XPj}$ and $\Delta Z_{XMj}$
3.1.3 Calculation of amounts of wavelength adjustment $\Delta\lambda_{XPj}$ and $\Delta\lambda_{XMj}$ and synchronous control correction values $S_{YPj}$ and $S_{YMj}$
3.2 Effects
4. Lithography system that calculates amount of wavelength adjustment $\Delta\lambda_{nj}$ and amount of focus shift $\Delta Z_{nj}$ for each scan field number n
4.1 Operation
4.1.1 Main procedure
4.1.2 Measurement of overlay error $D_{nij}$
4.1.3 Calculation of amount of wavelength adjustment $\Delta\lambda_{nj}$ and amount of focus shift $\Delta Z_{nj}$
4.1.4 Calculation of amount of wavelength adjustment $\Delta\lambda_{nj}$
4.2 Effects
5. Lithography system that calculates synchronous control correction value $S_{Ynj}$ for each scan field number n
5.1 Operation
5.1.1 Main procedure
5.1.2 Calculation of amount of wavelength adjustment $\Delta\lambda_{Xnj}$, synchronous control correction value $S_{Ynj}$, and amount of focus shift $\Delta Z_{Xnj}$
5.1.3 Calculation of amount of wavelength adjustment $\Delta\lambda_{Xnj}$ and synchronous control correction value $S_{Ynj}$
5.2 Effects
6. Others Embodiments of the present disclosure will be described below in detail with reference to the drawings. The embodiments described below show some examples of the present disclosure and are not intended to limit the contents of the present disclosure. Furthermore, all configurations and operations described in the embodiments are not necessarily essential as configurations and operations in the present disclosure. The same component has the same reference character, and no redundant description of the same component will be made.

1. Comparative Example

1.1 Lithography System

FIG. 1 schematically shows the configuration of a lithography system in Comparative Example. Comparative Example in the present disclosure is an aspect that the applicant is aware of as known only by the applicant, and is not a publicly known example that the applicant is self-aware of.

The lithography system includes a laser apparatus 100 and an exposure apparatus 200. FIG. 1 shows the laser apparatus 100 in a simplified form.

The laser apparatus 100 includes a laser control processor 130. The laser control processor 130 is a processing apparatus including a memory 132, which stores a control program, and a CPU (central processing unit) 131, which executes the control program. The memory 132 includes a non-transitory computer-readable storage medium. The laser control processor 130 is specially configured or programmed to carry out a variety of processes described in the present disclosure. The laser apparatus 100 is configured to output pulse laser light toward the exposure apparatus 200.

1.2 Exposure Apparatus 200

1.2.1 Configuration

The exposure apparatus 200 includes an illumination optical system 201, a projection optical system 202, and an exposure control processor 210, as shown in FIG. 1.

The illumination optical system 201 illuminates a reticle pattern of a reticle that is not shown but is placed at a reticle stage RT with the pulse laser light having entered the exposure apparatus 200 from the laser apparatus 100.

The projection optical system 202 performs reduction projection on the pulse laser light having passed through the reticle to bring the pulse laser light into focus at a workpiece that is not shown but is placed at a workpiece table WT. The workpiece is a photosensitive substrate, such as a semiconductor wafer coated with a photoresist film.

The exposure control processor 210 is a processing apparatus including a memory 212, which stores a control program, and a CPU 211, which executes the control program. The memory 212 includes a non-transitory computer-readable storage medium. The exposure control processor 210 is specially configured or programmed to carry out a variety of processes described in the present disclosure. The exposure control processor 210 oversees the control of the exposure apparatus 200.

1.2.2 Operation

The exposure control processor 210 transmits a variety of parameters including a target wavelength λt and a voltage instruction value, and a trigger signal to the laser control processor 130. The laser control processor 130 controls the laser apparatus 100 in accordance with the parameters and the signal.

The exposure control processor 210 translates the reticle stage RT and the workpiece table WT in opposite directions in synchronization with each other. The workpiece is thus exposed to the pulse laser light having reflected the reticle pattern. The exposure step described above causes the reticle pattern to be transferred to the semiconductor wafer. Plural steps that follow the exposure step allow manufacture of electronic devices.

1.3 Laser Apparatus 100

1.3.1 Configuration

FIG. 2 schematically shows the configuration of the laser apparatus 100 in Comparative Example. FIG. 2 shows the exposure apparatus 200 in a simplified form.

The laser apparatus 100 includes a master oscillator MO, a power oscillator PO, a monitor module 17, and highly reflective mirrors 31 and 32 as well as the laser control processor 130.

The master oscillator MO includes a laser chamber 10, a line narrowing module 14, and an output coupling mirror 15. The line narrowing module 14 and the output coupling mirror 15 constitute a first optical resonator.

The laser chamber 10 is disposed in the optical path of the first optical resonator. The laser chamber 10 is provided with windows 10*a* and 10*b*.

The laser chamber 10 accommodates a pair of discharge electrodes 11*a* and 11*b*. The laser chamber 10 is filled with a laser gas containing, for example, an argon or krypton gas as a rare gas, a fluorine gas as a halogen gas, and a neon gas as a buffer gas.

The line narrowing module 14 includes a prism 14*a* and a grating 14*b*. The prism 14*a* is disposed in the optical path of the light beam having exited via the window 10*a*. The prism 14*a* is so disposed that the surfaces of the prism 14*a* on which the light beam is incident and via which the light beam exits out are parallel to the direction of discharge between the discharge electrodes 11*a* and 11*b*, and the prism 14*a* is supported by a holder that is not shown. A rotary stage 14*c* allows the prism 14*a* to rotate around an axis parallel to the discharge direction.

The grating 14*b* is disposed in the optical path of the light beam having passed through the prism 14*a*. The direction of the grooves of the grating 14*b* is parallel to the discharge direction. The grating 14*b* is supported by a holder that is not shown.

The output coupling mirror 15 includes a partially reflective mirror.

The highly reflective mirrors 31 and 32 are disposed in this order in the optical path of pulse laser light B1 output via the output coupling mirror 15.

The power oscillator PO includes a laser chamber 20, a rear mirror 24, and an output coupling mirror 25. The rear mirror 24 and the output coupling mirror 25 constitute a second optical resonator.

The rear mirror 24 and the output coupling mirror 25 each includes a partially reflective mirror. The rear mirror 24 has a reflectance higher than that of the output coupling mirror 25.

The laser chamber 20 is disposed in the optical path of the second optical resonator. The laser chamber 20 is provided with windows 20*a* and 20*b*.

The laser chamber 20 accommodates a pair of discharge electrodes 21*a* and 21*b*. The laser gas sealed in the laser chamber 20 is the same as that sealed in the laser chamber 10.

The monitor module 17 includes a beam splitter 17*a* and a beam monitor 17*b*. The beam splitter 17*a* is disposed in the optical path of pulse laser light B2 output via the output coupling mirror 25. The beam monitor 17*b* is disposed in the optical path of the pulse laser light B2 reflected off the beam splitter 17*a*. The pulse laser light B2 having passed through the beam splitter 17*a* is output to the exposure apparatus 200.

1.3.2 Operation

The laser control processor 130 transmits a control signal to the line narrowing module 14 based on the target wavelength λt received from the exposure control processor 210. The laser control processor 130 sets the voltage instruction value received from the exposure control processor 210 in a power supply apparatus that is not shown but is accommodated in each of the master oscillator MO and the power oscillator PO.

The laser control processor 130 transmits an oscillation trigger signal based on the trigger signal received from the exposure control processor 210 to the power supply apparatuses of the master oscillator MO and the power oscillator PO.

Upon reception of the oscillation trigger signal from the laser control processor 130, the power supply apparatus of the master oscillator MO applies a pulse-shaped high voltage according to the voltage instruction value to the space between the discharge electrodes 11*a* and 11*b*.

When the high voltage is applied to the space between the discharge electrodes 11*a* and 11*b*, discharge occurs in the discharge space between the discharge electrodes 11*a* and 11*b*. The energy of the discharge excites the laser gas in the laser chamber 10, and the excited laser gas transitions to a high energy level. Thereafter, when the excited laser gas transitions to a low energy level, the laser gas emits light having a wavelength according to the difference between the energy levels.

The light generated in the laser chamber 10 exits out of the laser chamber 10 via the windows 10*a* and 10*b*. The light having exited via the window 10*a* enters the line narrowing module 14. The light having entered the line narrowing module 14 is enlarged in terms of beam width by the prism 14*a* and is then incident on the grating 14*b*.

The light incident on the grating 14*b* is reflected off and diffracted by the plural grooves of the grating 14*b* in the direction according to the wavelength of the light. The prism 14*a* reduces the beam width of the diffracted light from the grating 14*b* and causes the light to return to the laser chamber 10 via the window 10*a*.

Light having a desired wavelength and therearound out of the light having entered the line narrowing module 14 is thus returned to the laser chamber 10.

The output coupling mirror 15 transmits and outputs part of the light having exited via the window 10*b* as the pulse laser light B1 and reflects the other part of the light back into the laser chamber 10.

The light output from the laser chamber 10 thus travels back and forth between the line narrowing module 14 and the output coupling mirror 15. The light is amplified whenever passing through the discharge space in the laser chamber 10. Furthermore, the light is narrowed in terms of linewidth whenever deflected back by the line narrowing module 14, and becomes light having a steep wavelength distribution having a center wavelength being part of the range of wavelengths selected by the line narrowing module 14. The light thus having undergone the laser oscillation and the line narrowing operation is output as the pulse laser light B1 via the output coupling mirror 15.

The pulse laser light B1 is guided by the highly reflective mirrors 31 and 32 to the rear mirror 24 of the power oscillator PO.

Upon reception of the oscillation trigger signal from the laser control processor 130, the power supply apparatus of the power oscillator PO applies a pulse-shaped high voltage according to the voltage instruction value to the space between the discharge electrodes 21*a* and 21*b*. The delay period by which the oscillation trigger signal to the power oscillator PO is delayed from the oscillation trigger signal to the master oscillator MO is so set that the timing at which the discharge occurs in the space between the discharge electrodes 21*a* and 21*b* is synchronized with the timing at which the pulse laser light B1 enters the laser chamber 20 via the rear mirror 24 and the window 20*a*.

The pulse laser light B1 having entered the laser chamber 20 travels back and forth between the rear mirror 24 and the output coupling mirror 25 and is amplified whenever passing through the discharge space between the discharge electrodes 21*a* and 21*b*. The amplified light is output as the pulse laser light B2 via the output coupling mirror 25.

The laser control processor 130 controls the rotary stage 14*c* in the line narrowing module 14 via a driver that is not shown. The angle of incidence of the light beam incident on the grating 14*b* changes in accordance with the angle of rotation of the rotary stage 14*c*, and the wavelengths selected by the line narrowing module 14 change accordingly.

The beam monitor 17*b* measures the wavelength of the pulse laser light B2 and transmits the measured wavelength to the laser control processor 130. The laser control processor 130 performs feedback control on the rotary stage 14*c* based on the target wavelength λt received from the exposure control processor 210 and the measured wavelength. Unless otherwise specified, the wavelength of the pulse laser light B2 assumed to be the center wavelength.

The pulse laser light B2 having passed through the beam splitter 17*a* enters the exposure apparatus 200.

The case where the master oscillator MO includes a gas laser apparatus has been described above, and the master oscillator MO may include a solid-state laser. Moreover, the case where the second optical resonator accommodated in the power oscillator PO is a Fabry-Perot type resonator has been described above, the second optical resonator may include a ring-shaped resonator.

1.4 Scanning Exposure

Figure 3:
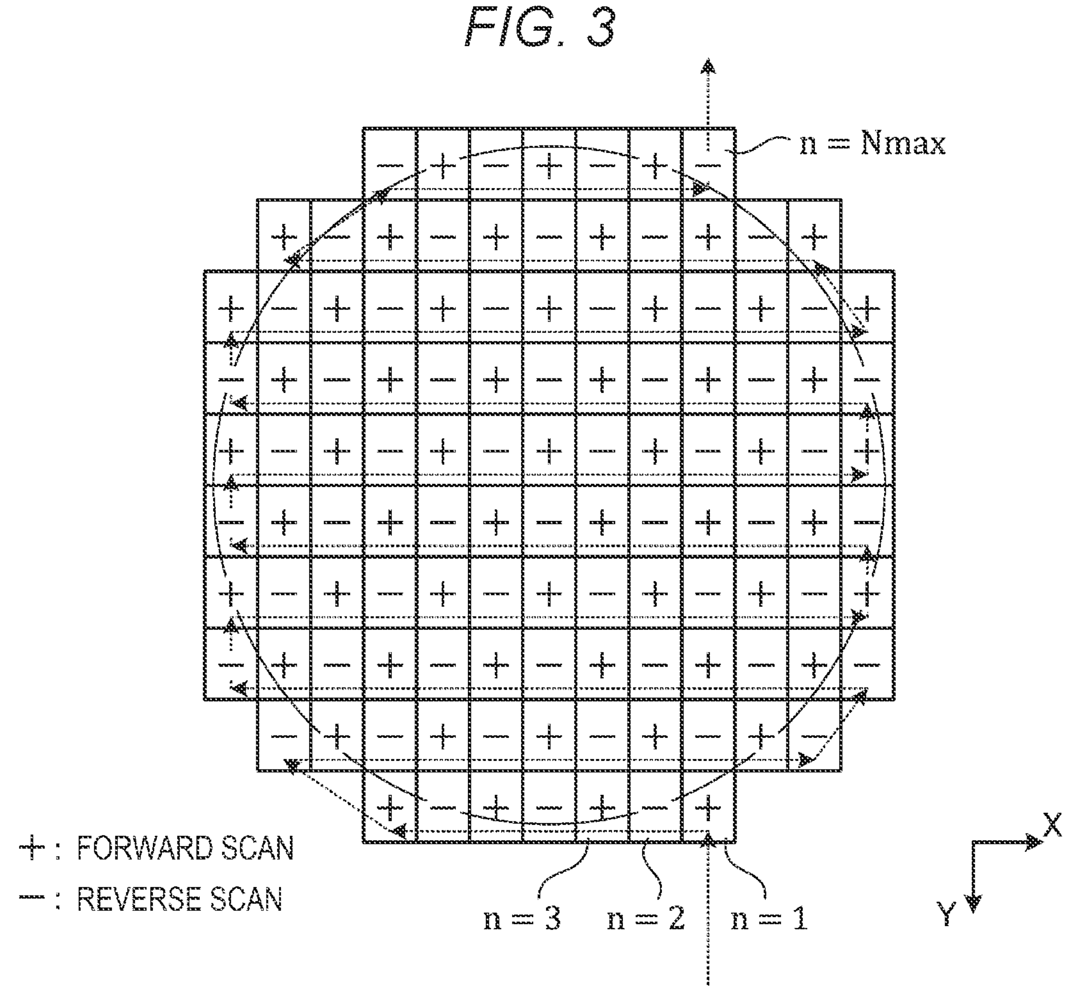
FIG. 3 shows a semiconductor wafer exposed to light by an exposure apparatus.

FIG. 3 shows a semiconductor wafer exposed to the pulse laser light by the exposure apparatus 200. The semiconductor wafer is, for example, a single crystal silicon plate having a substantially disk-like shape. The semiconductor wafer is coated, for example, with a photosensitive resist film. Exposure of the semiconductor wafer is performed on a scan field basis, the scan field having a scan field number n, which is an integer ranging from 1 to Nmax. The scan fields each correspond to a region onto which the reticle pattern of a single reticle is transferred.

First, the semiconductor wafer is so moved that the first scan field having a scan field number n of 1 is irradiated with the pulse laser light, so that the first scan field is exposed to the pulse laser light. The first scan field undergoes the scanning exposure while the semiconductor wafer is moved toward the positive end of the Y-direction with respect to the optical axis of the pulse laser light. This scan is called a forward scan in the present disclosure. The scan field that undergoes the scanning exposure in the forward scan is indicated by a symbol "+" in FIG. 3. The scan direction in the forward scan corresponds to the first direction in the present disclosure.

The semiconductor wafer is next so moved that the second scan field having a scan field number n of 2 is irradiated with the pulse laser light, so that the second scan field is exposed to the pulse laser light. The second scan field undergoes the scanning exposure while the semiconductor wafer is moved toward the negative end of the Y-direction with respect to the optical axis of the pulse laser light. This scan is called a reverse scan in the present disclosure. The scan field that undergoes the scanning exposure in the reverse scan is indicated by a symbol "−" in FIG. 3. The scan direction in the reverse scan corresponds to the second direction in the present disclosure.

The other scan fields are also sequentially exposed to the pulse laser light, and after the last scan field having a scan field number n Nmax is exposed to the pulse laser light, the exposure of the semiconductor wafer ends.

FIGS. 4 to 7 show how the semiconductor wafer is moved with respect to the position of the pulse laser light to change the position of each of the scan fields. In FIGS. 4 to 7, the scan field is shown by a solid-line frame, and the beam cross-section of the pulse laser light at the position of the workpiece table WT is shown by a broken-line frame. The width of the scan field in the X-direction is equal to the width of the beam cross-section of the pulse laser light in the X-direction. The width of the scan field in the Y-direction is greater than the width of the beam cross-section of the pulse laser light in the Y-direction.

Figure 4:
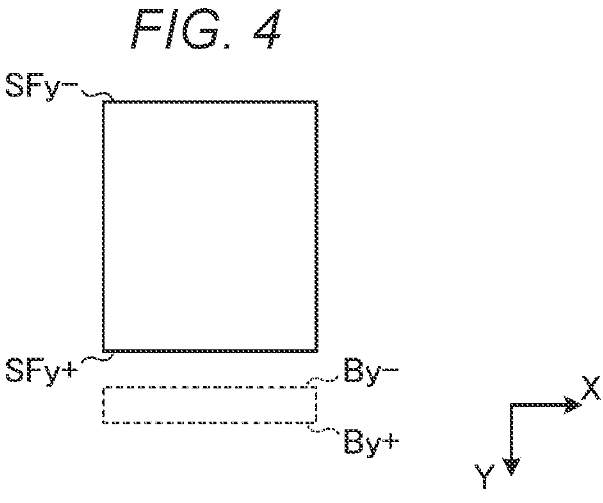
FIG. 4 shows how the semiconductor wafer is moved with respect to the position of pulse laser light to change the position of a scan field.
Figure 5:
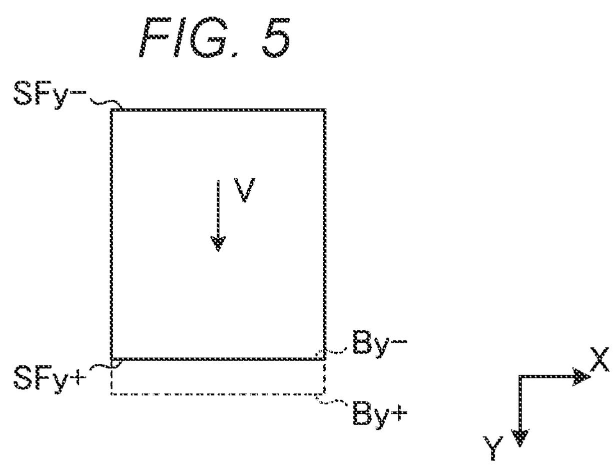
FIG. 5 shows how the semiconductor wafer is moved with respect to the position of pulse laser light to change the position of the scan field.
Figure 6:
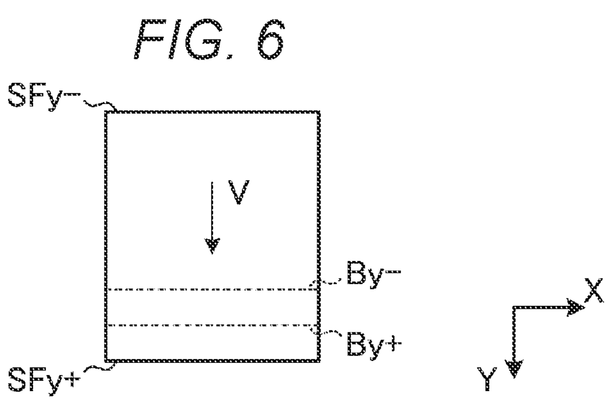
FIG. 6 shows how the semiconductor wafer is moved with respect to the position of pulse laser light to change the position of the scan field.
Figure 7:
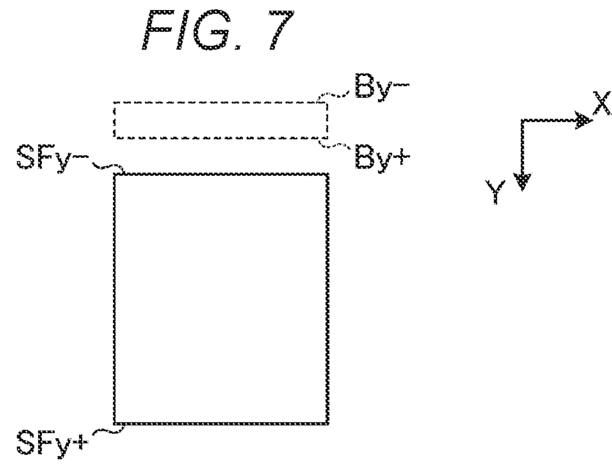
FIG. 7 shows how the semiconductor wafer is moved with respect to the position of pulse laser light to change the position of the scan field.

In the forward scan, the scan field is exposed to the pulse laser light in the order of FIGS. 4, 5, 6, and 7. First, the workpiece table WT is so positioned that an end SFy+ of the scan field, which is the end facing the positive end of the Y-direction, is located at a position separate by a predetermined distance in the Y-direction toward the negative end thereof from the position of an end By− of the beam cross-section, which is the end facing the negative end of the Y-direction, as shown in FIG. 4. The workpiece table WT is then accelerated toward the positive end of the Y-direction. The travel speed of the workpiece table WT reaches V by the time when the end SFy+ of the scan field, which is the end facing the positive end of the Y-direction, coincides with the position of the end By− of the beam cross-section, which is the end facing the negative end of the Y-direction, as shown in FIG. 5. The scan field is exposed to the pulse laser light while the workpiece table WT is so moved that the position of the scan field makes uniform linear motion at the travel speed V with respect to the position of the beam cross-section, as shown in FIG. 6. The exposure of the scan field ends after the workpiece table WT is moved until an end SFy− of the scan field, which is the end facing the negative end of the Y-direction, passes through the position of an end By+ of the beam cross-section, which is the end facing the positive end of the Y-direction, as shown in FIG. 7. The exposure is thus performed while the scan field is moved with respect to the position of the beam cross-section.

The reverse scan is performed by moving the scan field in the opposite direction to the direction in which the forward scan is performed.

1.5 Problems with Comparative Example

Figure 8:
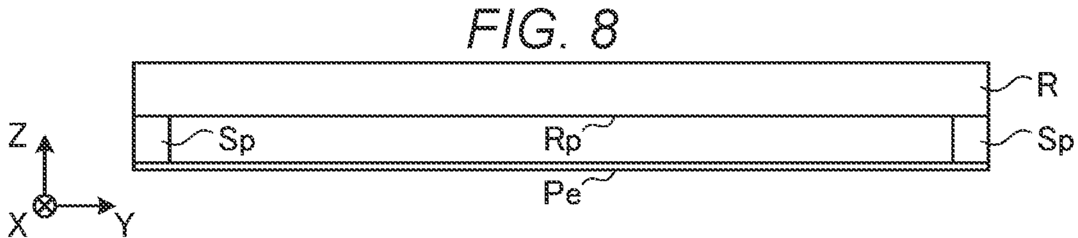
FIG. 8 is a cross-sectional view of a reticle supported by a reticle stage.

FIG. 8 is a cross-sectional view of a reticle R supported by the reticle stage RT. The reticle R is made of a material that is transparent to the wavelength of the pulse laser light, and has one surface at which a reticle pattern Rp is formed. To suppress adhesion of dust to the reticle pattern Rp, a thin film called a pellicle Pe is attached to the reticle R via a spacer Sp. A gap is formed between the reticle pattern Rp and the pellicle Pe, so that the image of the pellicle Pe is defocused when the image of the reticle pattern Rp is brought into focus at the semiconductor wafer. Therefore, even when dust adheres to the pellicle Pe, the adverse effect of the dust on the image formed at the semiconductor wafer is suppressed.

Figure 9:
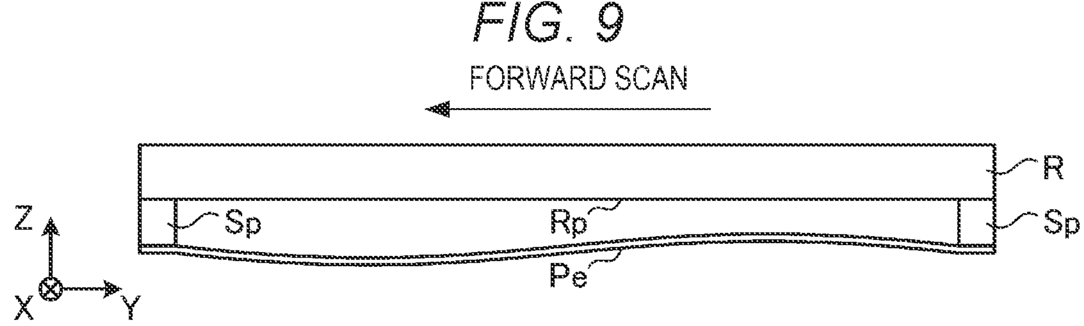
FIG. 9 shows a bend of a pellicle produced when the reticle is moved.
Figure 10:
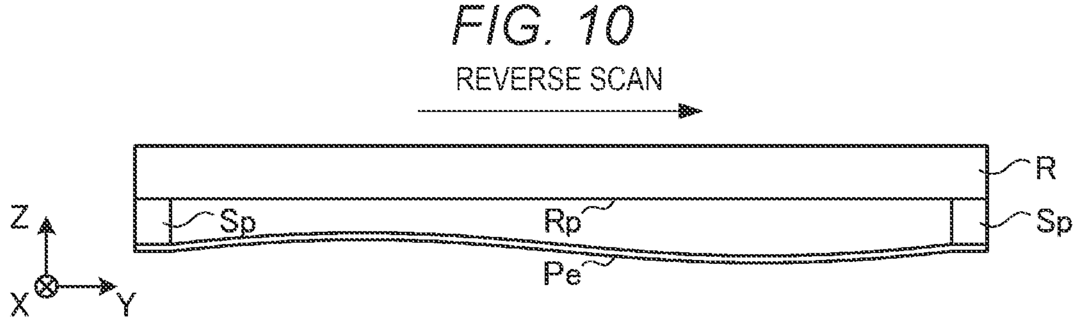
FIG. 10 shows a bend of the pellicle produced when the reticle is moved.

FIGS. 9 and 10 show bends of the pellicle Pe produced when the reticle R is moved. The travel direction of the reticle R is opposite to the travel direction of the semiconductor wafer; in the forward scan, the reticle R is moved toward the negative end of the Y-direction, whereas in the reverse scan, the reticle R is moved toward the positive end of the Y-direction. When scanning exposure is performed by using the reticle R to which the pellicle Pe has been attached, the pellicle Pe may be bent. The bend depends on the travel direction and the speed of the reticle R and the position of the bend within the pellicle Pe. When an attempt to perform high-speed scanning is made, the magnitude of the bend of the pellicle Pe increases.

Figures 11, 12:
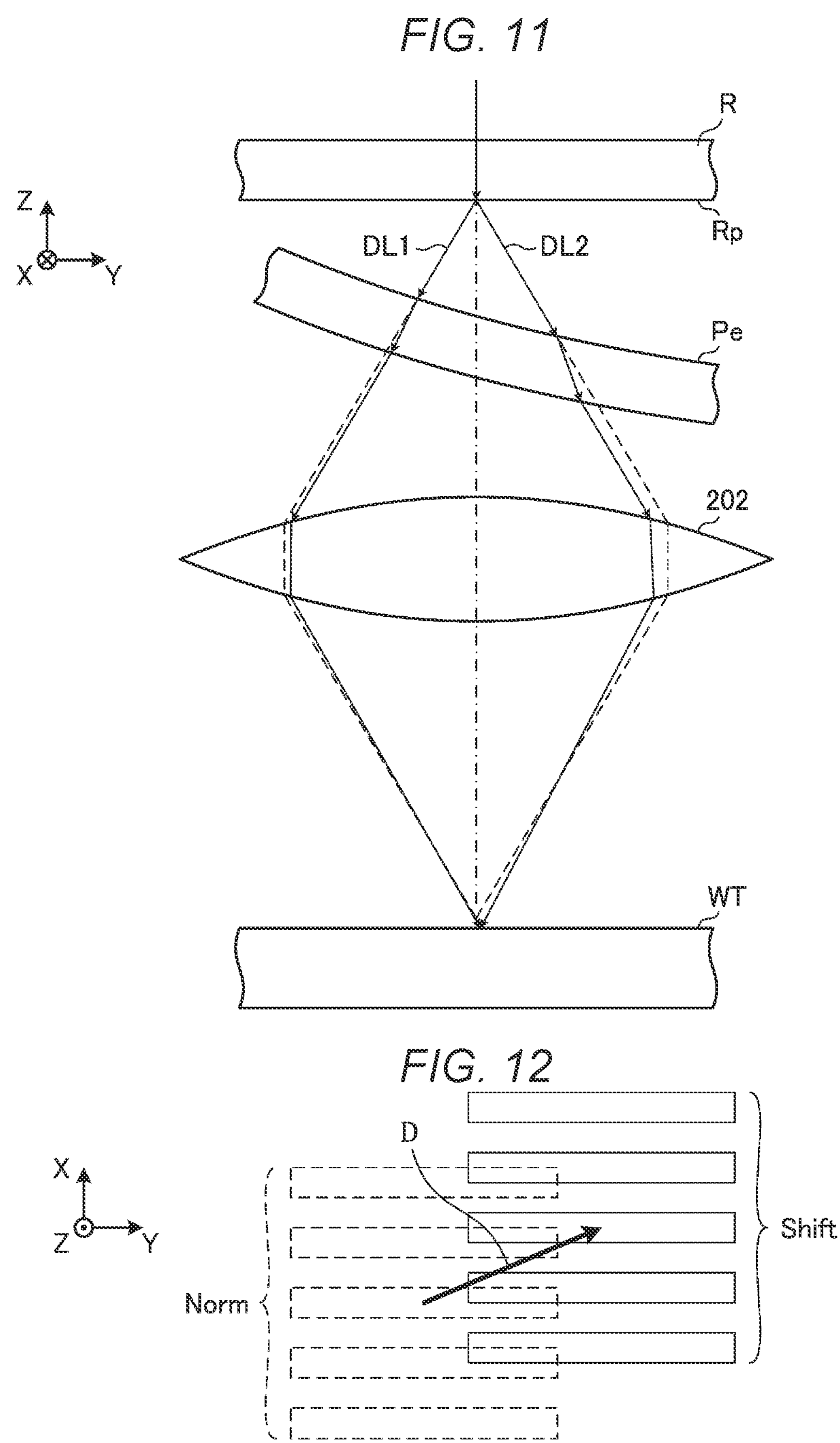
FIG. 11 shows how an overlay error occurs due to the bend of the pellicle.
FIG. 12 shows a pattern formed at the surface of the semiconductor wafer when no shift of the image formation position occurs, and a pattern formed at the surface of the semiconductor wafer when the image formation position is shifted by diffracted light having been asymmetrically refracted.

FIG. 11 shows how an overlay error occurs due to the bend of the pellicle Pe. The pulse laser light is incident on the reticle R in the Z-direction toward the negative end thereof, which is perpendicular to the reticle pattern Rp. The pulse laser light incident on the reticle R is diffracted by the reticle pattern Rp, exits out of the reticle R as diffracted light DL1, diffracted light DL2, and other types of diffracted light that are not shown, and all the types of diffracted light are incident on the pellicle Pe. The angles of incidence of the diffracted light DL1, the diffracted light DL2, and the other types of diffracted light incident on the pellicle Pe differ depending on the order of diffraction and the bend of the pellicle Pe. When the pellicle Pe is not bent, the diffracted light DL1 and the diffracted light DL2 travel as indicated by the broken lines in FIG. 11, whereas when the diffracted light DL1 and the diffracted light DL2 pass through the pellicle Pe that has been bent, the angles of refraction at the surface of the pellicle Pe vary due to the difference in the angle of incidence described above, as indicated by the solid lines in FIG. 11. Therefore, as compared with the case where there is no bend, the symmetry of the travel directions of the diffracted light DL1, the diffracted light DL2, and the other types of diffracted light with respect to the optical axis in the Z-direction toward the negative end thereof changes, which shifts the position where the projection optical system 202 forms an image at the surface of the semiconductor wafer.

FIG. 12 shows a pattern Norm, which is formed at the surface of the semiconductor wafer when no shift of the image formation position occurs, and a pattern Shift, which is formed at the surface of the semiconductor wafer when the image formation position is shifted by the diffracted light having been asymmetrically refracted. The shift of the image formation position is an overlay error D. D stands for a vector.

Figure 13:
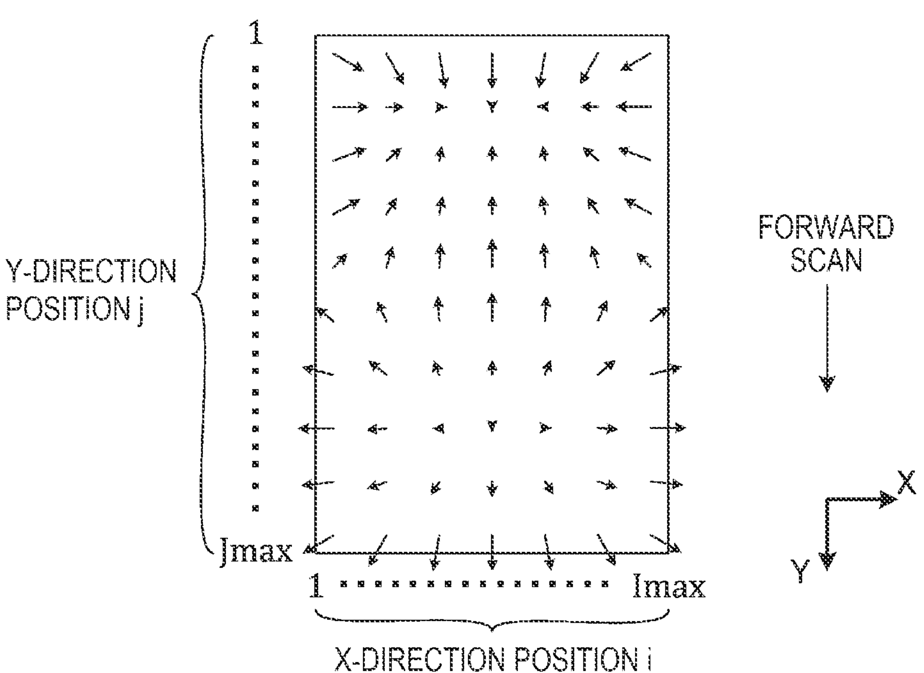
FIG. 13 conceptually shows a distribution of an overlay error in a scan field of the semiconductor wafer.
Figure 14:
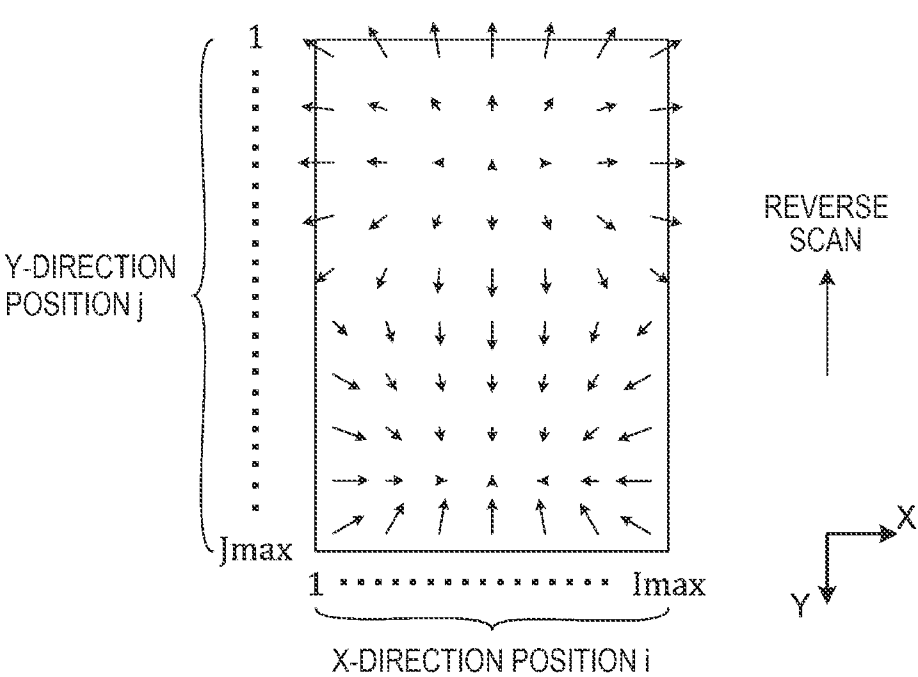
FIG. 14 conceptually shows another distribution of the overlay error in the scan field of the semiconductor wafer.

FIGS. 13 and 14 conceptually show the distributions of overlay errors $D_{Pij}$ and $D_{Mij}$ in a scan field of a semiconductor wafer. The overlay errors $D_{Pij}$ and $D_{Mij}$ are each expressed in the form of a displacement vector starting from the position where the semiconductor wafer should originally be exposed to the pulse laser light to the position where the semiconductor wafer is actually exposed to the pulse laser light. The magnitude of the vector is exaggerated. The overlay errors $D_{Pij}$ and $D_{Mij}$ depend on the travel direction and the speed of the reticle R and the position (i, j) in the scan field. The subscripts i and j of $D_{Pij}$ and $D_{Mij}$ mean that the overlay errors $D_{Pij}$ and $D_{Mij}$ are calculated for each position (i, j) specified by the X-direction position i and the Y-direction position j in the scan field. FIG. 13 shows the distribution of the overlay error $D_{Pij}$ in the forward scan, and FIG. 14 shows the distribution of the overlay error $D_{Mij}$ in the reverse scan. The subscripts i and j are each an integer greater than or equal to one. In FIGS. 13 and 14, Imax is the maximum value of i, and Jmax is the maximum value of j.

The reticle R used in the exposure apparatus 200 includes the pellicle Pe attached thereto in some cases, and does not include the pellicle Pe attached thereto in other cases, and the pellicle Pe may be made of a different material or may have a different thickness. The overlay errors $D_{Pij}$ and $D_{Mij}$ may cause a misalignment between a first layer in which one reticle pattern Rp is transferred to a scan field and a second layer in which another reticle pattern Rp is transferred to the same scan field.

It is conceivable to correct the overlay errors $D_{Pij}$ and $D_{Mij}$ by moving some optical elements of the projection optical system 202 in synchronization with the scanning exposure, but in this case, it is necessary to move an optical element having a mass of the order of several kilograms, so that it is difficult to support high-speed scanning. It is also conceivable to create a reticle pattern Rp that is offset in advance, which cannot, however, deal with the overlay errors $D_{Pij}$ and $D_{Mij}$ that depend on the scan direction.

In the embodiments described below, distortion is generated by adjusting the target wavelength λt transmitted to the laser apparatus 100 to reduce the overlay errors $D_{Pij}$ and $D_{Mij}$.

2. Lithography System that Calculates Amounts of Wavelength Adjustment $\Delta\lambda_{Pj}$ and $\Delta\lambda_{Mj}$ and Amounts of Focus Shift $\Delta Z_{Pj}$ and $\Delta Z_{Mj}$ for Each Scan Direction

2.1 Configuration

FIG. 15 schematically shows the configuration of the lithography system in a first embodiment. The lithography system includes an overlay measurement apparatus 300 and a lithography control processor 430 in addition to the components shown in FIG. 1.

The overlay measurement apparatus 300 includes a wafer stage 301, a measurement unit 302, and a measurement control processor 330.

The measurement unit 302 radiates light or an electron beam onto an exposed, developed semiconductor wafer placed on the wafer stage 301, and measures the light radiated onto the semiconductor wafer and reflected off or diffracted by the semiconductor wafer, or measures the electron beam radiated onto the semiconductor wafer and scattered by the semiconductor wafer to measure an overlay error $D_{kij}$. The subscripts k, i, and j of the overlay error $D_{kij}$ mean that the overlay error $D_{kij}$ is measured for each scan field number k and for each in-scan-field position (i, j). The wafer stage 301 adjusts the position of the semiconductor wafer in such a way that the light or electron beam emitted from the measurement unit 302 is radiated to a desired measurement position on the semiconductor wafer.

The measurement control processor 330 is a processing apparatus including a memory 332, which stores a control program, and a CPU 331, which executes the control program. The memory 332 includes a non-transitory computer-readable storage medium. The measurement control processor 330 is specially configured or programmed to carry out a variety of processes described in the present disclosure. The measurement control processor 330 controls the wafer stage 301 and the measurement unit 302 and transmits a measured overlay error $D_{kij}$ to the lithography control processor 430.

The function of measuring the overlay error $D_{kij}$ may be the function of the exposure apparatus 200.

The lithography control processor 430 is a processing apparatus including a memory 432, which stores a control program, and a CPU 431, which executes the control program. The memory 432 includes a non-transitory computer-readable storage medium. The lithography control processor 430 is specially configured or programmed to carry out a variety of processes described in the present disclosure. The lithography control processor 430 calculates the amounts of wavelength adjustment $\Delta\lambda_{Pj}$ and $\Delta\lambda_{Mj}$ and the amounts of focus shift $\Delta Z_{Pj}$ and $\Delta Z_{Mj}$ based on the overlay error $D_{kij}$ measured by the overlay measurement apparatus 300.

2.2 Operation

2.2.1 Main Procedure

FIG. 16 is a flowchart showing the process of exposing the semiconductor wafer to the pulse laser light in such a way that the overlay errors are reduced in the first embodiment. FIG. 16 shows processes carried out by the exposure control processor 210 unless otherwise specified.

In S1, the exposure control processor 210 performs preliminary exposure of the semiconductor wafer. The semiconductor wafer to undergo the preliminary exposure corresponds to the first photosensitive substrate in the present disclosure. The preliminary exposure processes will be described later with reference to FIG. 18. The semiconductor wafer having undergone the preliminary exposure is conveyed to the overlay measurement apparatus 300.

In S2, the overlay measurement apparatus 300 measures the overlay error $D_{kij}$ associated with the semiconductor wafer having undergone the preliminary exposure. The process of measuring the overlay error $D_{kij}$ will be described later with reference to FIG. 19. The measured overlay error $D_{kij}$ is transmitted to the lithography control processor 430.

Figure 17:
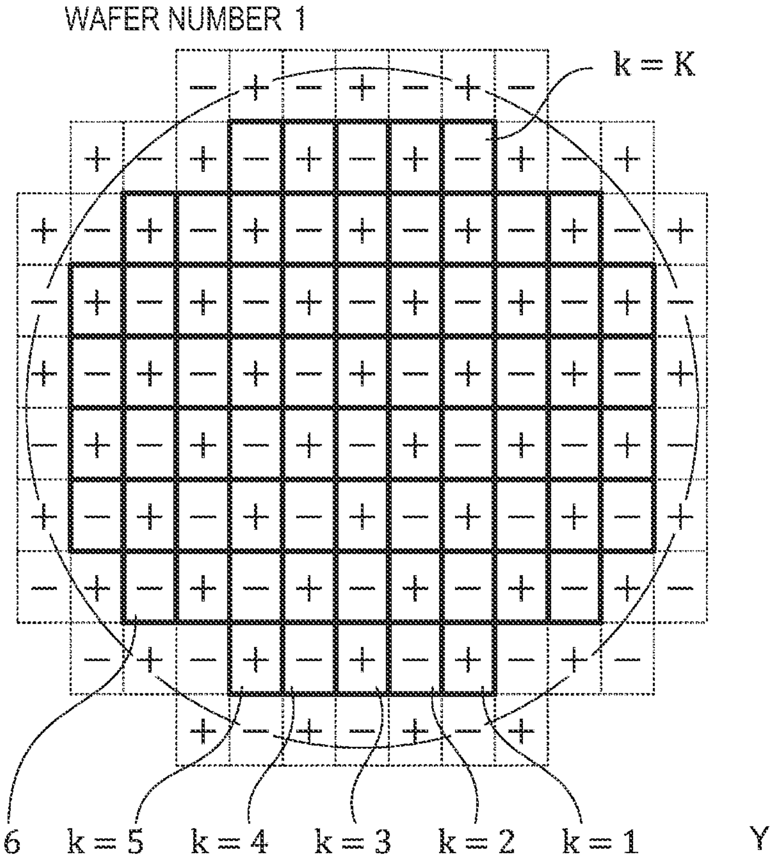
FIG. 17 shows a semiconductor wafer where the overlay error is measured.

FIG. 17 shows the semiconductor wafer where the overlay error $D_{kij}$ is measured. The scan field number k is assigned to each of K scan fields where the overlay error $D_{kij}$ is measured. The K scan fields are part of the Nmax scan fields described with reference to FIG. 3. A scan field having a scan field number k of 1, 3, or 5 is a scan field that undergoes the scanning exposure in the forward scan, and a scan field having a scan field number k of 2, 4, or 6 is a scan field that undergoes the scanning exposure in the reverse scan.

The outer edge of each of the K scan fields, where the overlay error $D_{kij}$ is measured, is located inside the outer edge of the semiconductor wafer. On the other hand, scan fields each having an outer edge that intersects with the outer edge of the semiconductor wafer are indicated by the broken lines, and these scan fields are not subjected to the measurement of the overlay error $D_{kij}$. FIG. 17 shows one semiconductor wafer, but plural semiconductor wafers may be subjected to the measurement of the overlay error $D_{kij}$.

Referring again to FIG. 16, the lithography control processor 430 calculates the amounts of wavelength adjustment $\Delta\lambda_{Pj}$ and $\Delta\lambda_{Mj}$ and the amounts of focus shift $\Delta Z_{Pj}$ and $\Delta Z_{Mj}$ in S3. The process of calculating the amounts described above will be described later with reference to FIGS. 20 to 40. The lithography control processor 430 further calculates the target wavelength λt by using the amounts of wavelength adjustment $\Delta\lambda_{Pj}$ and $\Delta\lambda_{Mj}$. The calculated target wavelength λt and the amounts of focus shift $\Delta Z_{Pj}$ and $\Delta Z_{Mj}$ are transmitted to the exposure control processor 210.

In S4, the exposure control processor 210 transmits the target wavelength λt to the laser control processor 130.

In S5, the laser control processor 130 controls the wavelength of the pulse laser light by using the target wavelength λt. The laser apparatus 100 generates and outputs the pulse laser light to the exposure apparatus 200.

In S6, the exposure control processor 210 controls the Z-direction position of the workpiece table WT in accordance with the amounts of focus shift $\Delta Z_{Pj}$ and $\Delta Z_{Mj}$ while performing the synchronous control of the reticle stage RT and the workpiece table WT, and exposes the semiconductor wafer to the pulse laser light. The semiconductor wafer exposed to the pulse laser light in S6 is a semiconductor wafer different from the semiconductor wafer that undergoes the preliminary exposure in S1. The semiconductor wafer exposed to the pulse laser light in S6 corresponds to the second photosensitive substrate in the present disclosure.

In step S7, the exposure control processor 210 evaluates whether the exposure operation should be terminated. When the exposure operation should not be terminated (NO in S7), the exposure control processor 210 returns to the process in S5. When the exposure operation should be terminated (YES in S7), the exposure control processor 210 terminates the processes in the present flowchart.

2.2.2 Preliminary Exposure

Figure 18:
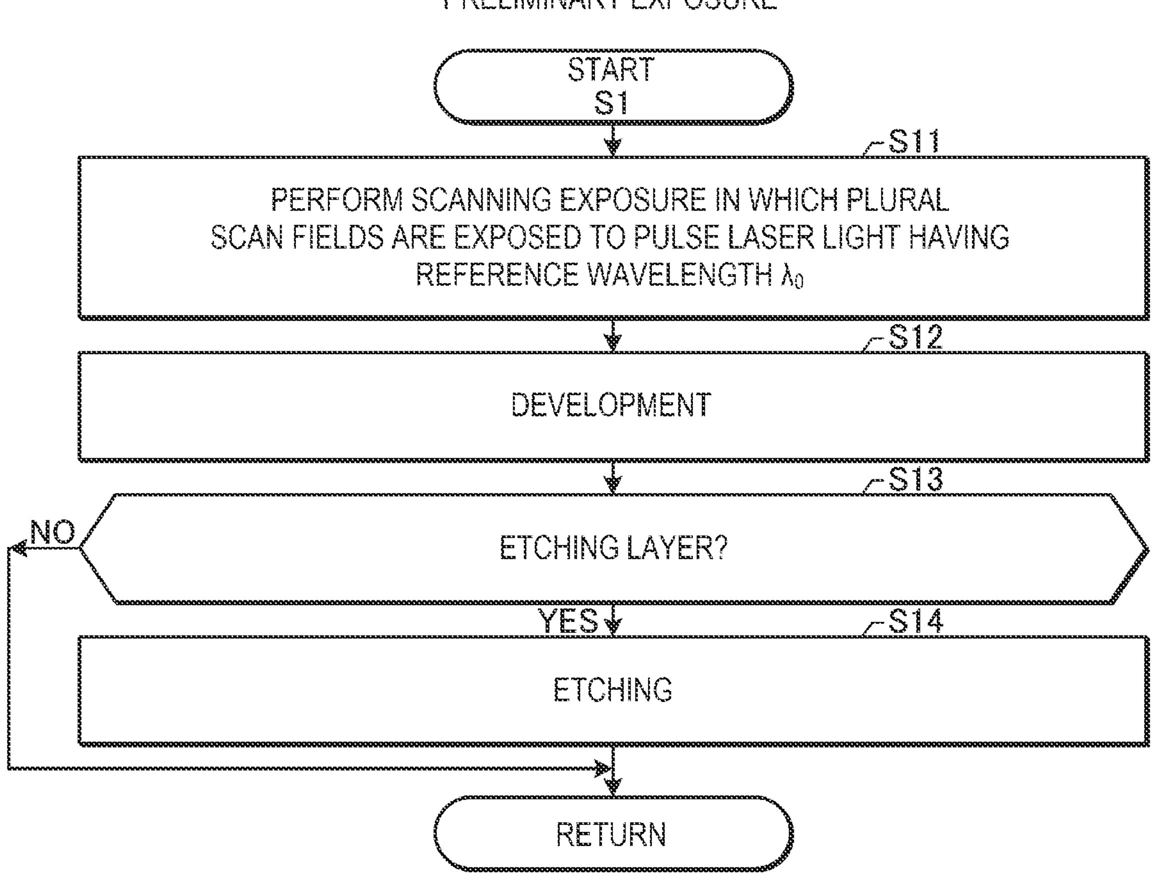
FIG. 18 is a flowchart showing preliminary exposure processes in detail.

FIG. 18 is a flowchart showing preliminary exposure processes in detail. The processes shown in FIG. 18 correspond to the subroutine S1 shown in FIG. 16.

In S11, the exposure control processor 210 performs the scanning exposure in which plural scan fields of the semiconductor wafer are exposed to the pulse laser light having a reference wavelength $\lambda_0$. The plural scan fields may be the Nmax scan fields shown FIG. 3.

In S12, the exposure control processor 210 controls a conveyor that is not shown to transport the semiconductor wafer to a developer that is not shown and is external to the exposure apparatus 200, and the developer develops the semiconductor wafer. For example, when a semiconductor wafer coated with a positive photoresist film is exposed to the pulse laser light, the exposed portions of the photoresist film are dissolved and removed by the development, whereas when the semiconductor wafer coated with a negative photoresist film is exposed to the pulse laser light, the unexposed portions of the photoresist film are removed by the development, and the photoresist film is thus patterned.

In S13, the next step differs depending on whether the layer below the photoresist film is an etching layer.

When the layer below the photoresist film is an etching layer (YES in S13), etching is performed in S14. The portions that form the surface of the semiconductor wafer and are exposed after the photoresist film is removed are etched, whereas the portions that form the surface of the semiconductor wafer and are covered with the photoresist film are protected from being etched. After S14, the exposure control processor 210 terminates the processes of the present flowchart and returns to the processes shown in FIG. 16. The overlay error $D_{kij}$ may be measured in S2 through measurement of the etched semiconductor wafer.

When the layer below the photoresist film is not an etching layer (NO in S13), the exposure control processor 210 terminates the processes of the present flowchart and returns to the processes shown in FIG. 16. The layer that is not an etched layer is a layer that is not etched but is subjected to ion implantation or other processing. In the ion implantation, impurity ions are implanted into the portions that form the semiconductor wafer and are exposed after the photoresist film is removed, whereas the portions that form the semiconductor wafer and are covered with the photoresist film are protected from the ion implantation. The ion implantation is, however, not necessarily performed in the present flowchart, and the measurement of the overlay error $D_{kij}$ in S2 may be performed through measurement of only the patterned photoresist film.

2.2.3 Measurement of Overlay Error $D_{kij}$

FIG. 19 is a flowchart showing the process of measuring the overlay error $D_{kij}$ in detail. The processes shown in FIG. 19 correspond to the subroutine S2 shown in FIG. 16.

In S21, the measurement control processor 330 of the overlay measurement apparatus 300 sets the value of the scan field number k at 1.

In S22, the overlay measurement apparatus 300 measures the overlay error $D_{kij}$ at the k-th scan field for each in-scan-field position (i, j).

In S23, the measurement control processor 330 causes the memory 332 to store the overlay error $D_{kij}$ in association with metadata, such as the wafer number, the scan field number k, and the scan direction.

In S24, the measurement control processor 330 evaluates whether the scan field number k is greater than or equal to K. K is an integer greater than or equal to two but smaller than or equal to Nmax. When the scan field number k is smaller than K (NO in S24), the measurement control processor 330 proceeds to the process in S25. When the scan field number k is greater than or equal to K (YES in S24), the measurement control processor 330 proceeds to the process in S26.

In S25, the measurement control processor 330 adds one to the scan field number k to update the value of k. After S25, the measurement control processor 330 returns to the process in S22.

In S26, the measurement control processor 330 transmits the combination of the overlay error $D_{kij}$ and the metadata to the lithography control processor 430. The lithography control processor 430 acquires the combination of the overlay error $D_{kij}$ and the metadata. After S26, the measurement control processor 330 terminates the processes of the present flowchart and returns to the processes shown in FIG. 16.

Figure 20:
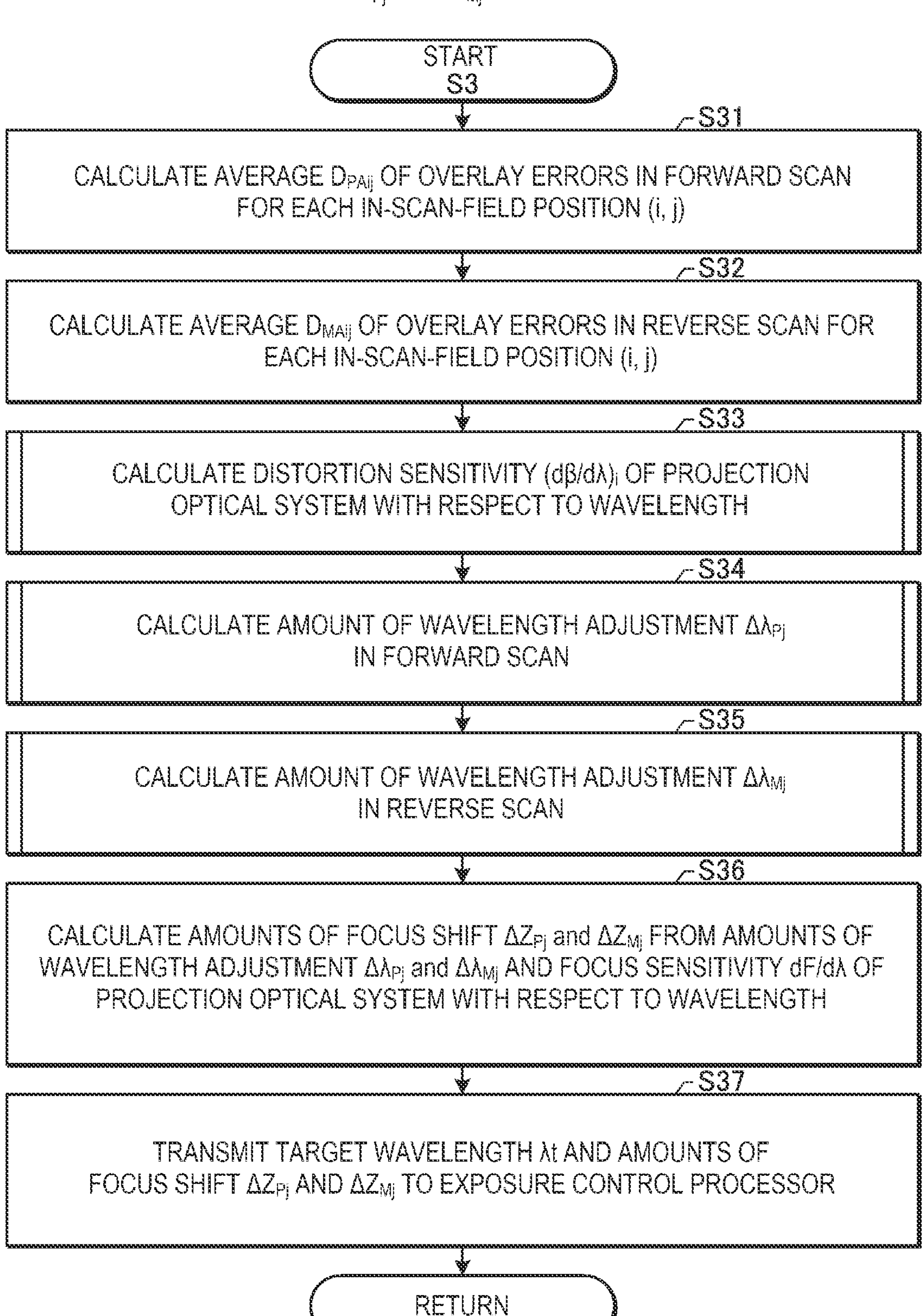
FIG. 20 is a flowchart showing the process of calculating the amounts of wavelength adjustment and the amounts of focus shift in detail.

2.2.4 Calculation of Amounts of Wavelength Adjustment $\Delta\lambda_{Pj}$ and $\Delta\lambda_{Mj}$ and Amounts of Focus Shift $\Delta Z_{Pj}$ and $\Delta Z_{Mj}$ FIG. 20 is a flowchart showing the process of calculating the amounts of wavelength adjustment $\Delta\lambda_{Pj}$ and $\Delta\lambda_{Mj}$ and the amounts of focus shift $\Delta Z_{Pj}$ and $\Delta Z_{Mj}$ in detail. The processes shown in FIG. 20 correspond to the subroutine S3 shown in FIG. 16.

In S31, the lithography control processor 430 calculates an average $D_{PAij}$ of the overlay errors in the forward scan for each in-scan-field position (i, j).

Figure 21:
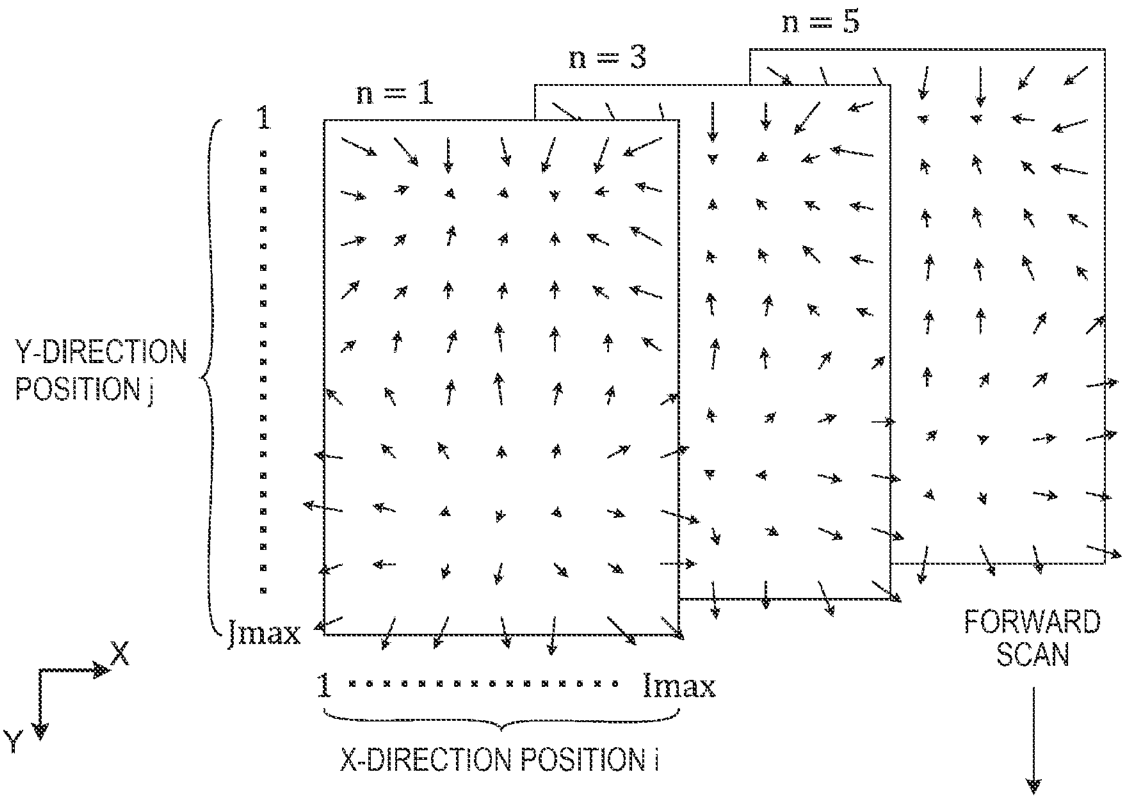
FIG. 21 conceptually shows overlay errors in scan fields that undergo a forward scan.

FIG. 21 conceptually shows overlay errors $D_{1ij}$, $D_{3ij}$, and $D_{5ij}$ in the corresponding scan fields that undergo the forward scan. The overlay errors $D_{1ij}$, $D_{3ij}$, and $D_{5ij}$ are the overlay errors $D_{kij}$ measured in the scan fields having the scan field number k of 1, 3, and 5, respectively. A scan field that undergoes the forward scan corresponds to the first scan field in the present disclosure.

Figure 22:
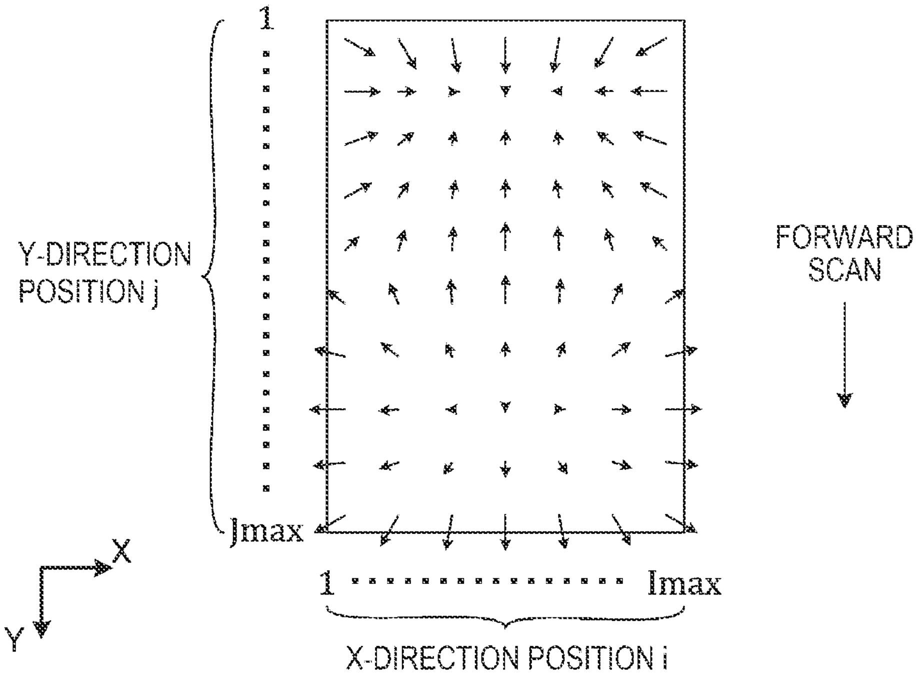
FIG. 22 conceptually shows the average of the overlay errors in the forward scan.

FIG. 22 conceptually shows the average $D_{PAij}$ of the overlay errors in the forward scan. For example, when K is an even number and the scan field number k of the scan fields that undergo the scanning exposure in the forward scan is an odd number from 1 to K−1, the average $D_{PAij}$ is calculated by the following expression:

$$D_{PAij}=(D_{1ij}+D_{3ij}+D_{5ij}+\ldots+D_{(K-1)ij})\times 2/K$$

The case where the average $D_{PAij}$ of the overlay errors $D_{kij}$ measured for plural scan fields that undergo the scanning exposure in the forward scan is calculated has been described, but the number of scan fields that undergo the scanning exposure in the forward scan may be one. In this case, when the scan field number k is 1, the average $D_{PAij}$ is $D_{1ij}$.

Referring back to FIG. 20, in S32, the lithography control processor 430 calculates an average $D_{MAij}$ of the overlay errors in the reverse scan for each in-scan-field position (i, j).

Figure 23:
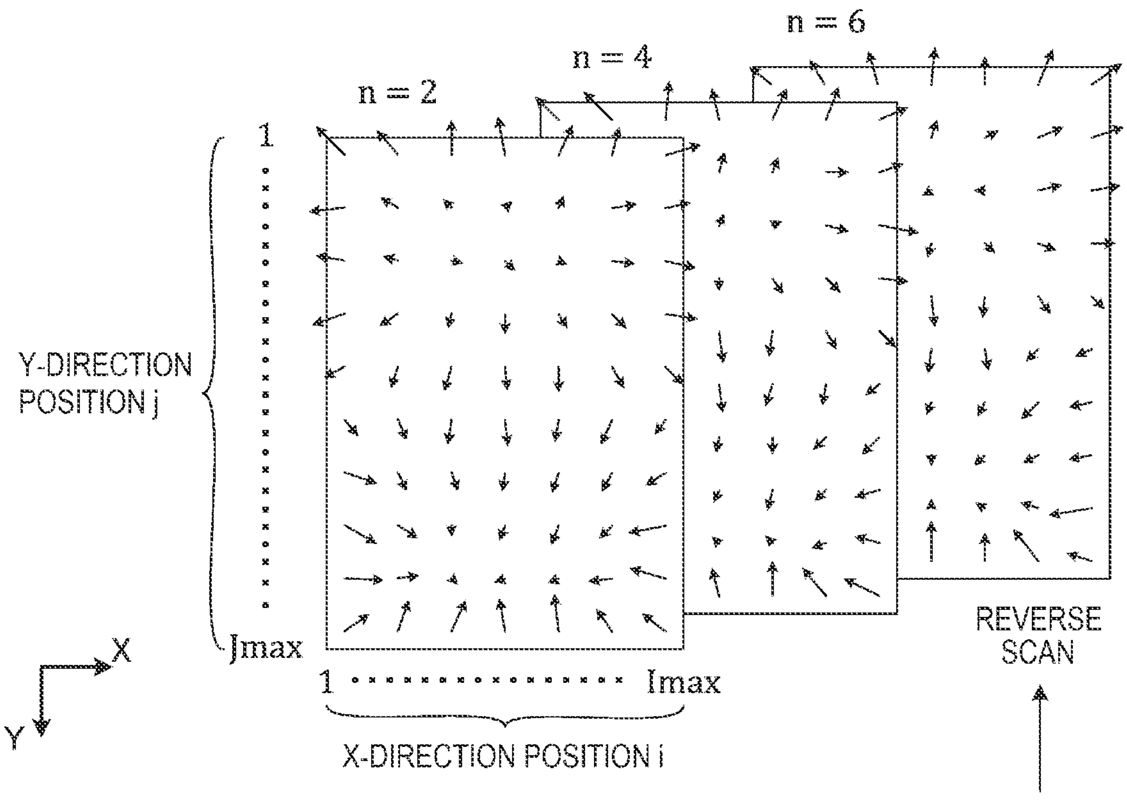
FIG. 23 conceptually shows the overlay errors in scan fields that undergo a reverse scan.

FIG. 23 conceptually shows overlay errors $D_{2ij}$, $D_{4ij}$, and $D_{6ij}$ in the corresponding scan fields that undergo the reverse scan. The overlay errors $D_{2ij}$, $D_{4ij}$, and $D_{6ij}$ are the overlay errors $D_{kij}$ measured in the scan fields having the scan field number k of 2, 4, and 6, respectively. A scan field that undergoes the reverse scan corresponds to the second scan field in the present disclosure.

Figure 24:
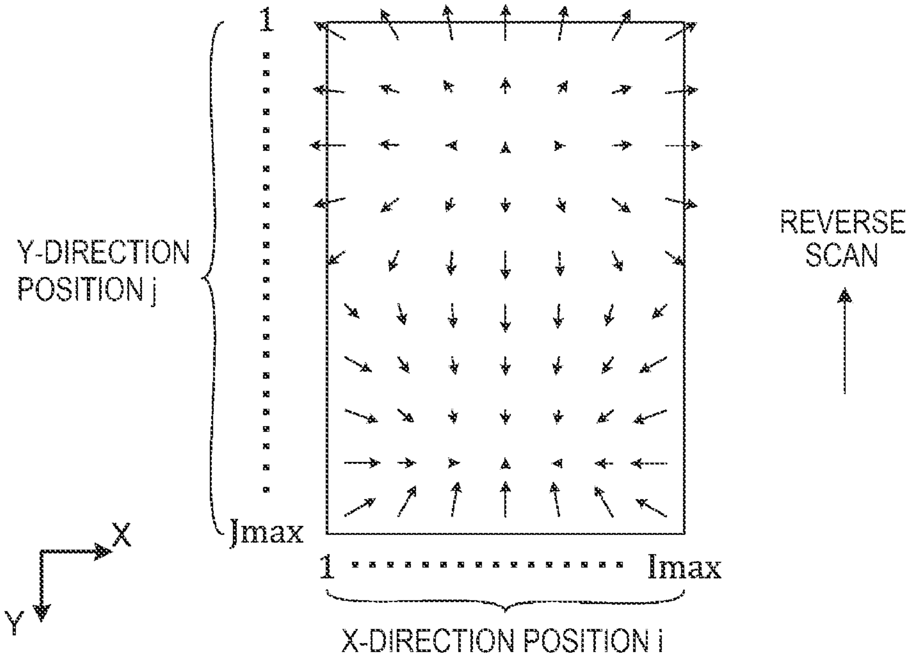
FIG. 24 conceptually shows the average of the overlay errors in the reverse scan.

FIG. 24 conceptually shows the average $D_{MAij}$ of the overlay errors in the reverse scan. For example, when K is an even number and the scan field number k of the scan fields that undergo the scanning exposure in the reverse scan is an even number from 2 to K, the average $D_{MAij}$ is calculated by the following expression:

$$D_{MAij}=(D_{2ij}+D_{4ij}+D_{6ij}+\ldots+D_{Kij})\times 2/K$$

The case where the average $D_{MAij}$ of the overlay errors $D_{kij}$ measured for plural scan fields that undergo the scanning exposure in the reverse scan is calculated has been described, but the number of scan fields that undergo the scanning exposure in the reverse scan may be one. In this case, when the scan field number k is 2, the average $D_{MAij}$ is $D_{2ij}$.

FIG. 25 shows a data table of the overlay error $D_{kij}$ stored in the memory 332 in S23 in FIG. 19. The overlay error $D_{kij}$ is measured for each scan field number k and for each in-scan-field position (i, j). A wafer number as the metadata is assigned to each wafer, and the scan field number k and the scan direction are assigned for each scan field number k.

FIG. 26 shows a data table of the average $D_{PAij}$ of the overlay errors in the forward scan. The average $D_{PAij}$ is calculated for each in-scan-field position (i, j).

FIG. 27 shows a data table of the average $D_{MAij}$ of the overlay errors in the reverse scan. The average $D_{MAij}$ is calculated for each in-scan-field position (i, j).

Referring again to FIG. 20, in S33, the lithography control processor 430 calculates distortion sensitivity $(d\beta/d\lambda)_i$ of the projection optical system 202 with respect to the wavelength, for each X-direction position i in a scan field. The calculation of the distortion sensitivity $(d\beta/d\lambda)_i$ will be described later with reference to FIGS. 28 to 32.

In S34, the lithography control processor 430 calculates the amount of wavelength adjustment $\Delta\lambda_{Pj}$ in the forward scan for each Y-direction position j in a scan field by using the average $D_{PAij}$ and the distortion sensitivity $(d\beta/d\lambda)_i$. The calculation of the amount of wavelength adjustment $\Delta\lambda_{Pj}$ will be described later with reference to FIGS. 33, 35, 36, and 39.

In S35, the lithography control processor 430 calculates the amount of wavelength adjustment $\Delta\lambda_{Mj}$ in the reverse scan by using the average $D_{MAij}$ and the distortion sensitivity $(d\beta/d\lambda)_i$ for each Y-direction position j in a scan field. The calculation of the amount of wavelength adjustment $\Delta\lambda_{Mj}$ will be described later with reference to FIGS. 34, 37, 38, and 40.

In S36, the lithography control processor 430 calculates the amounts of focus shift $\Delta Z_{Pj}$ and $\Delta Z_{Mj}$ for each Y-direction position j in a scan field from the amounts of wavelength adjustment $\Delta\lambda_{Pj}$ and $\Delta\lambda_{Mj}$ and focus sensitivity $dF/d\lambda$ of the projection optical system 202 with respect to the wavelength. The calculation of the amounts of focus shift $\Delta Z_{Pj}$ and $\Delta Z_{Mj}$ will be described later with reference to FIGS. 36 and 38.

In S37, the lithography control processor 430 transmits the target wavelength at and the amounts of focus shift $\Delta Z_{Pj}$ and $\Delta Z_{Mj}$ to the exposure control processor 210. The target wavelength at is the sum of the reference wavelength $\lambda_0$ used in the preliminary exposure and the amounts of wavelength adjustment $\Delta\lambda_{Pj}$ and $\Delta\lambda_{Mj}$, and is calculated for each Y-direction position j in a scan field and for each scan direction.

After S37, the lithography control processor 430 terminates the processes of the present flowchart and returns to the processes shown in FIG. 16.

2.2.4.1 Calculation of Distortion Sensitivity $(d\beta/d\lambda)_i$

FIG. 28 is a flowchart showing the process of calculating the distortion sensitivity $(d\beta/d\lambda)_i$ in detail. The processes shown in FIG. 28 correspond to the subroutine S33 shown in FIG. 20.

In S330, the lithography control processor 430 sets one as the value of the X-direction position i and the Y-direction position j in the beam cross-section at the position of the workpiece table WT.

In S331, the lithography control processor 430 calculates distortion sensitivity $(d\beta/d\lambda)_{ij}$ at the position (i, j) in the beam cross-section.

FIG. 29 conceptually shows the distortion sensitivity $(d\beta/d\lambda)_{ij}$. The distortion sensitivity $(d\beta/d\lambda)_{ij}$ is a characteristic of the projection optical system 202 of the exposure apparatus 200. The projection optical system 202 is so designed that a variety of aberrations are optimized at a design wavelength, and the image formation position is shifted in accordance with a shift of the wavelength of the pulse laser light from the design wavelength. A vector representing the ratio of the shift of the image formation position to the shift of the wavelength and the direction of the shift of the image formation position is defined as the distortion sensitivity $(d\beta/d\lambda)_{ij}$, which is shown by the arrows in FIG. 29. For example, when the wavelength is lengthened, the image formation position shifts in the directions of the arrows, whereas when the wavelength is shortened, the image formation position shifts in the opposite directions to the directions of the arrows. The distortion sensitivity $(d\beta/d\lambda)_{ij}$ is calculated for each position (i, j) in the beam cross-section by using the design value of the projection optical system 202. The subscripts i and j are each an integer greater than or equal to one. In FIG. 29, Imax is the maximum value of i, and J is the maximum value of j. It is desirable that J is smaller than Jmax but greater than or equal to three.

Referring again to FIG. 28, in S332, the lithography control processor 430 evaluates whether the value of j is greater than or equal to J. When the value of j is smaller than J (NO in S332), the lithography control processor 430 proceeds to the process in S333. When the value of j is greater than or equal to J (YES in S332), the lithography control processor 430 proceeds to the process in S334.

In S333, the lithography control processor 430 adds one to the value of j to update the value of j. After S333, the lithography control processor 430 returns to the process in S331.

In S334, the lithography control processor 430 calculates the distortion sensitivity $(d\beta/d\lambda)_i$ at the X-direction position i by using the expression indicated by Expression (1) below.

$$(d\beta/d\lambda)_i = \frac{1}{J}\sum_{i=1}^{J}(d\beta/d\lambda)_{ij} \tag{1}$$

That is, the distortion sensitivity $(d\beta/d\lambda)_i$ at the X-direction position i is the average obtained by summing along the Y-direction the values of the distortion sensitivity $(d\beta/d\lambda)_{ij}$ at the positions (i, j) in the beam cross-section and dividing the sum by J.

FIG. 30 conceptually shows the distortion sensitivity $(d\beta/d\lambda)_i$. The distortion sensitivity $(d\beta/d\lambda)_i$ is calculated for each X-direction position i in the beam cross-section.

Referring again to FIG. 28, in S335, the lithography control processor 430 evaluates whether the value of i is greater than or equal to Imax. When the value of i is smaller than Imax (NO in S335), the lithography control processor 430 proceeds to the process in S336. When the value of i is greater than or equal to Imax (YES in S335), the lithography control processor 430 proceeds to the process in S337.

In S336, the lithography control processor 430 adds one to the value of i to update the value of i and resets the value of j to one. After S336, the lithography control processor 430 returns to the process in S331.

In S337, the lithography control processor 430 causes the memory 432 to store the distortion sensitivity $(d\beta/d\lambda)_i$ for each X-direction position i.

After S337, the lithography control processor 430 terminates the processes of the present flowchart and returns to the processes shown in FIG. 20.

FIG. 31 shows a data table of the distortion sensitivity $(d\beta/d\lambda)_{ij}$. The maximum value J of j may be three.

FIG. 32 shows a data table of the distortion sensitivity $(d\beta/d\lambda)_i$.

2.2.4.2 Calculation of Amounts of Wavelength Adjustment $\Delta\lambda_{Pj}$ and $\Delta\lambda_{Mj}$ FIG. 33 is a flowchart showing the process of calculating the amount of wavelength adjustment $\Delta\lambda_{Pj}$ in the forward scan in detail. The processes shown in FIG. 33 correspond to the subroutine S34 shown in FIG. 20.

In S340, the lithography control processor 430 sets the Y-direction position j in a scan field at one.

In S341, the lithography control processor 430 reads the average $D_{PAij}$ of the overlay errors in the forward scan calculated in S31 in FIG. 20. Since one Y-direction position j is determined in S340 or S346, the latter of which will be described later, the average $D_{PAij}$ is read for each X-direction position i in S341.

In S342, the lithography control processor 430 reads the distortion sensitivity $(d\beta/d\lambda)_i$ for each X-direction position i calculated in S334 in FIG. 28.

In S343, the lithography control processor 430 calculates the amount of wavelength adjustment $\Delta\lambda_{Pj}$ in the forward scan in such a way that the inequality indicated by Expression (2) below is satisfied.

$$R_{Pj} = \sum_i \left| \left( \frac{d\beta}{d\lambda} \right)_i \Delta\lambda_{Pj} + D_{PAij} \right| < \sum_i |D_{PAij}| \quad (2)$$

The left side $R_{Pj}$ of Expression (2) is the value obtained by summing along the X-direction the absolute value $|(d\beta/d\lambda)_i\Delta\lambda_{Pj}+D_{PAij}|$ of the sum of the average $D_{PAij}$ of the overlay errors and the distortion $(d\beta/d\lambda)_i\Delta\lambda_{Pj}$ in the forward scan, and corresponds to the first overlay error parameter in the present disclosure. The distortion $(d\beta/d\lambda)_i\Delta\lambda_{Pj}$ is the value obtained by multiplying the distortion sensitivity $(d\beta/d\lambda)_i$ by the amount of wavelength adjustment $\Delta\lambda_{Pj}$.

The right side of Expression (2) is the value obtained by summing along the X-direction the absolute value $|D_{Paij}|$ of the average $D_{Paij}$ of the overlay errors in the forward scan, and corresponds to the second overlay error parameter in the present disclosure. The second overlay error parameter corresponds to the first overlay error parameter in a case where all the values of the distortion $(d\beta/d\lambda)_i\Delta\lambda_{Pj}$ are set at zero. It is more desirable that the amount of wavelength adjustment $\Delta\lambda_{Pj}$ is so calculated that the left side $R_{Pj}$ of Expression (2) is minimized.

In S345, the lithography control processor 430 evaluates whether the value of j is greater than or equal to Jmax. When the value of j is smaller than Jmax (NO in S345), the lithography control processor 430 proceeds to the process in S346. When the value of j is greater than or equal to Jmax (YES in S345), the lithography control processor 430 proceeds to the process in S349.

In S346, the lithography control processor 430 adds one to the value of j to update the value of j. After S346, the lithography control processor 430 returns to the process in S341.

In S349, the lithography control processor 430 causes the memory 432 to store the amount of wavelength adjustment $\Delta\lambda_{Pj}$ for each Y-direction position j.

After S349, the lithography control processor 430 terminates the processes of the present flowchart and returns to the processes shown in FIG. 20.

Figure 34:
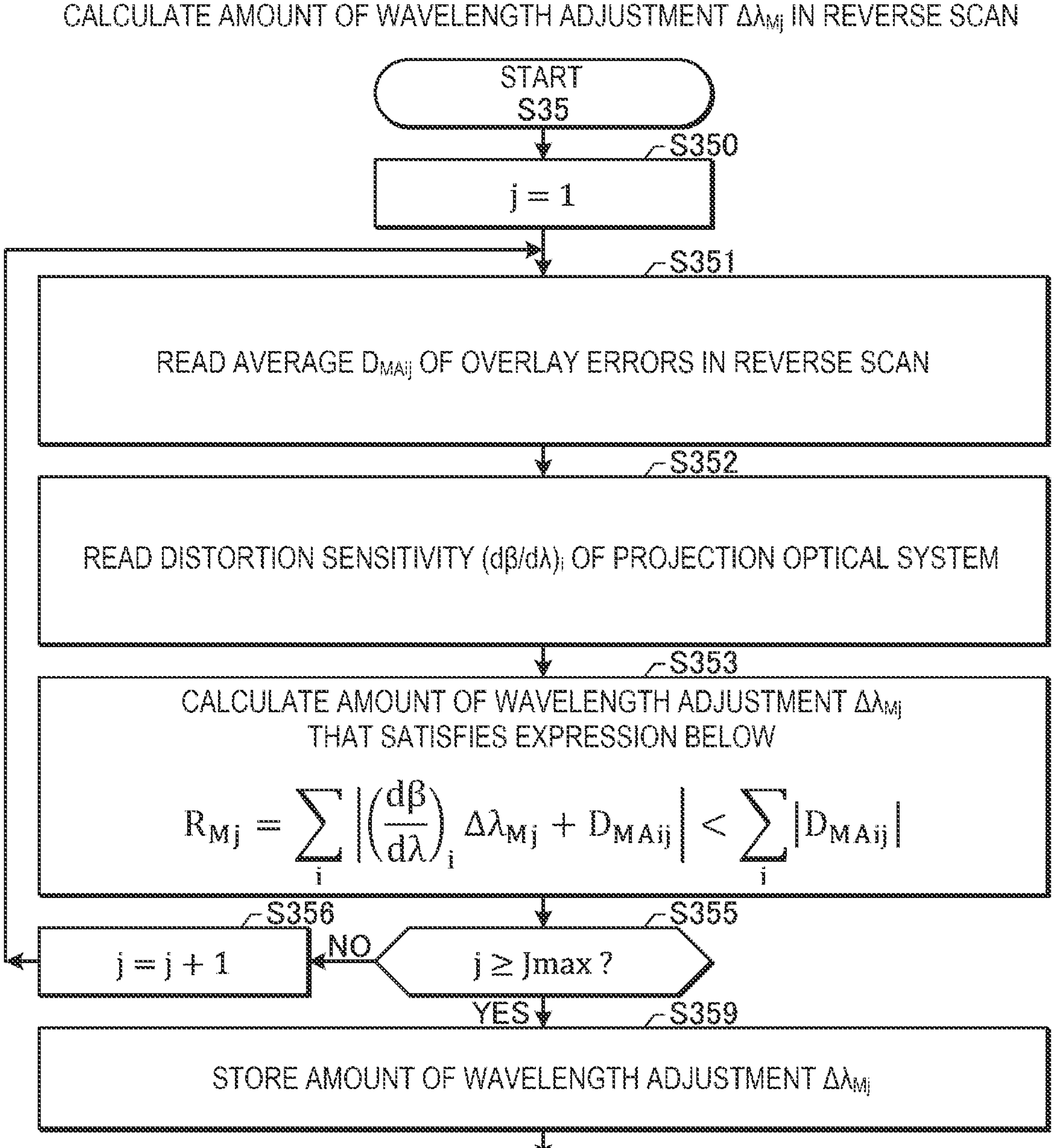
FIG. 34 is a flowchart showing the process of calculating the amount of wavelength adjustment in the reverse scan in detail.

FIG. 34 is a flowchart showing the process of calculating the amount of wavelength adjustment $\Delta\lambda_{Mj}$ in the reverse scan in detail. The processes shown in FIG. 34 correspond to the subroutine S35 shown in FIG. 20.

The processes shown in FIG. 34 differ from the processes shown in FIG. 33 in that the average $D_{Maij}$ of the overlay errors in the reverse scan is used in place of the average $D_{Paij}$ of the overlay errors in the forward scan to calculate the amount of wavelength adjustment $\Delta\lambda_{Mj}$ in the reverse scan, but are the same as those shown in FIG. 33 in other respects.

Figure 35:
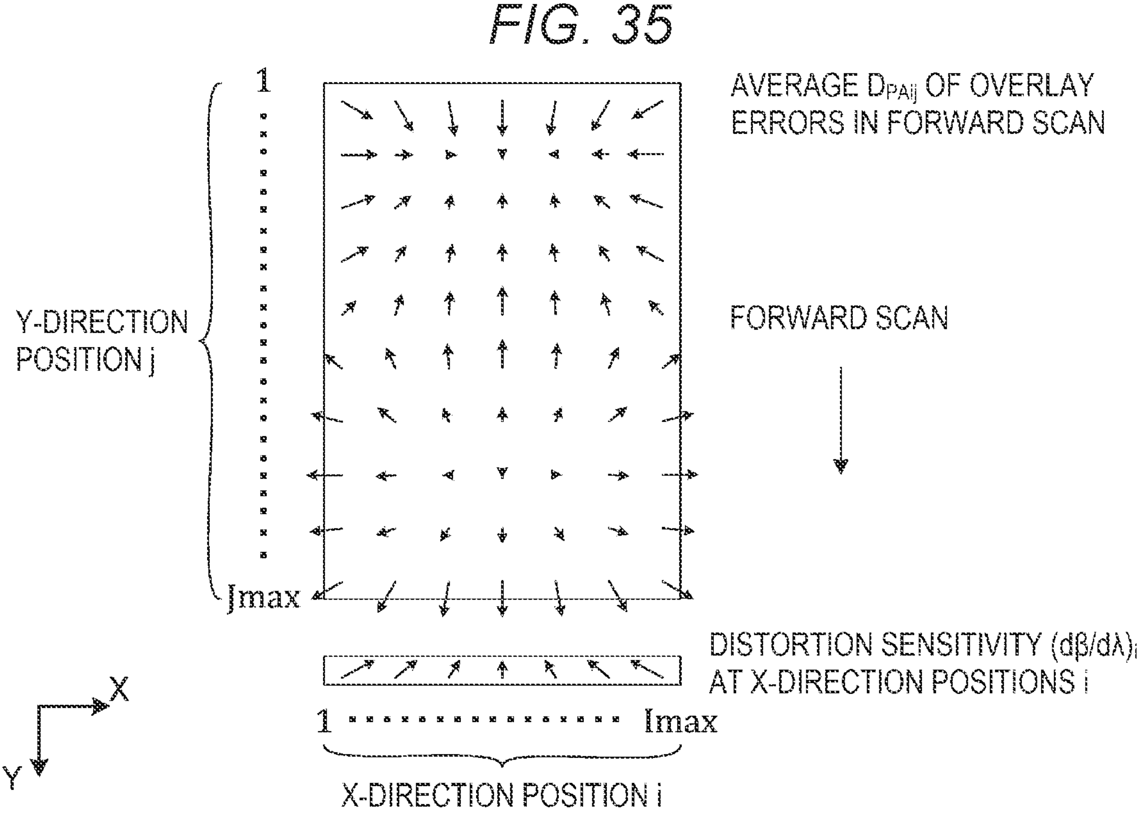
FIG. 35 shows the relationship between the average of the overlay errors and the distortion sensitivity at X-direction positions in the forward scan.

FIG. 35 shows the relationship between the average $D_{Paij}$ of the overlay errors and the distortion sensitivity $(d\beta/d\lambda)_i$ in the forward scan. The average $D_{Paij}$ contains Imax×Jmax vectors, and the distortion sensitivity $(d\beta/d\lambda)_i$ contains Imax vectors. In the forward scan, the pulse laser light is first radiated to the Y-direction position j being Jmax and then sequentially radiated in the direction in which the value of j decreases. Appropriately calculating the amount of wavelength adjustment $\Delta\lambda_{Pj}$ for each Y-direction position j allows generation of distortion according to the distortion sensitivity $(d\beta/d\lambda)_i$ and reduces the overlay errors.

Figure 36:
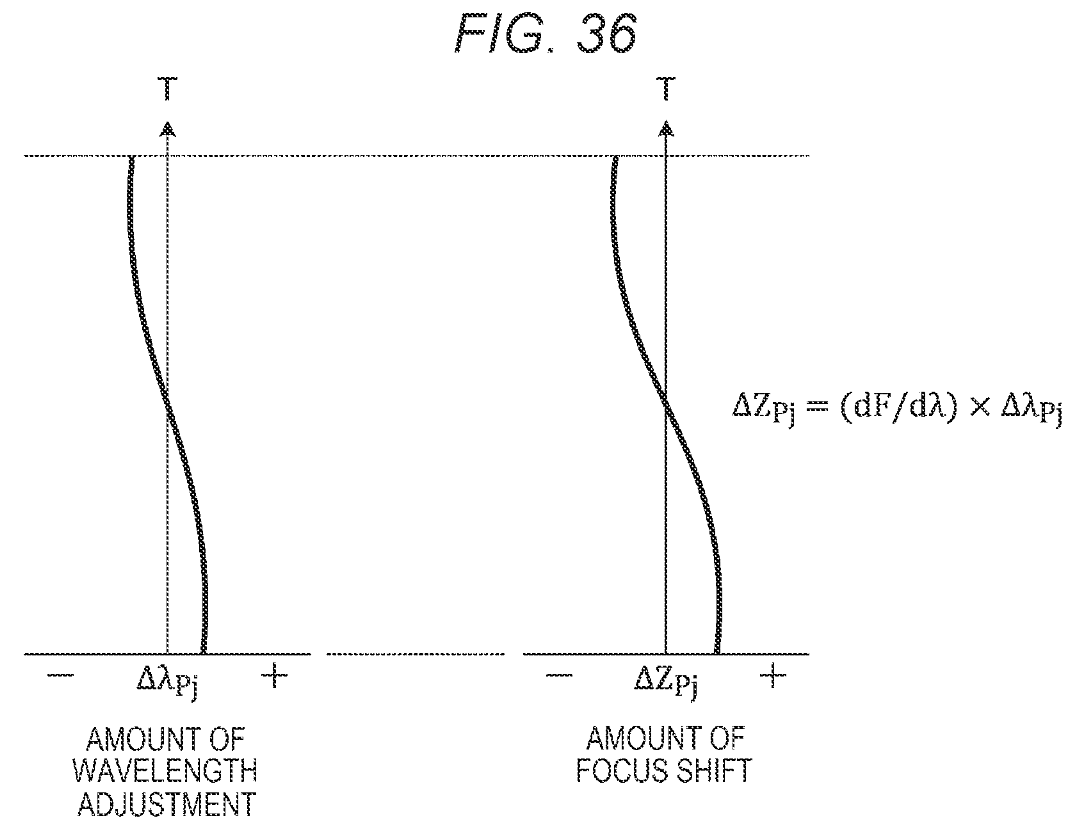
FIG. 36 shows an example of the amount of wavelength adjustment and the amount of focus shift in the forward scan.

FIG. 36 shows an example of the amount of wavelength adjustment $\Delta\lambda_{Pj}$ and the amount of focus shift $\Delta Z_{Pj}$ in the forward scan. The vertical axis of FIG. 36 represents time T measured from the start of scanning exposure performed on one scan field. The amount of wavelength adjustment $\Delta\lambda_{Pj}$ and the amount of focus shift $\Delta Z_{Pj}$ are so set that the two amounts change with the time T.

When the wavelength of the pulse laser light is changed by using the amount of wavelength adjustment $\Delta\lambda_{Pj}$, the angle of refraction in the projection optical system 202 changes, so that the position where the projection optical system 202 brings the pulse laser light into focus changes in the Z-direction. Therefore, the amount of focus shift $\Delta Z_{Pj}$ is calculated by using the expression below, and the Z-direction position of the workpiece table WT is adjusted in accordance with the amount of focus shift $\Delta Z_{Pj}$.

$$\Delta Z_{Pj} = (dF/d\lambda) \times \Delta\lambda_{Pj}$$

The amount of focus shift $\Delta Z_{Pj}$ is calculated in S36 in FIG. 20.

Figures 37, 38:
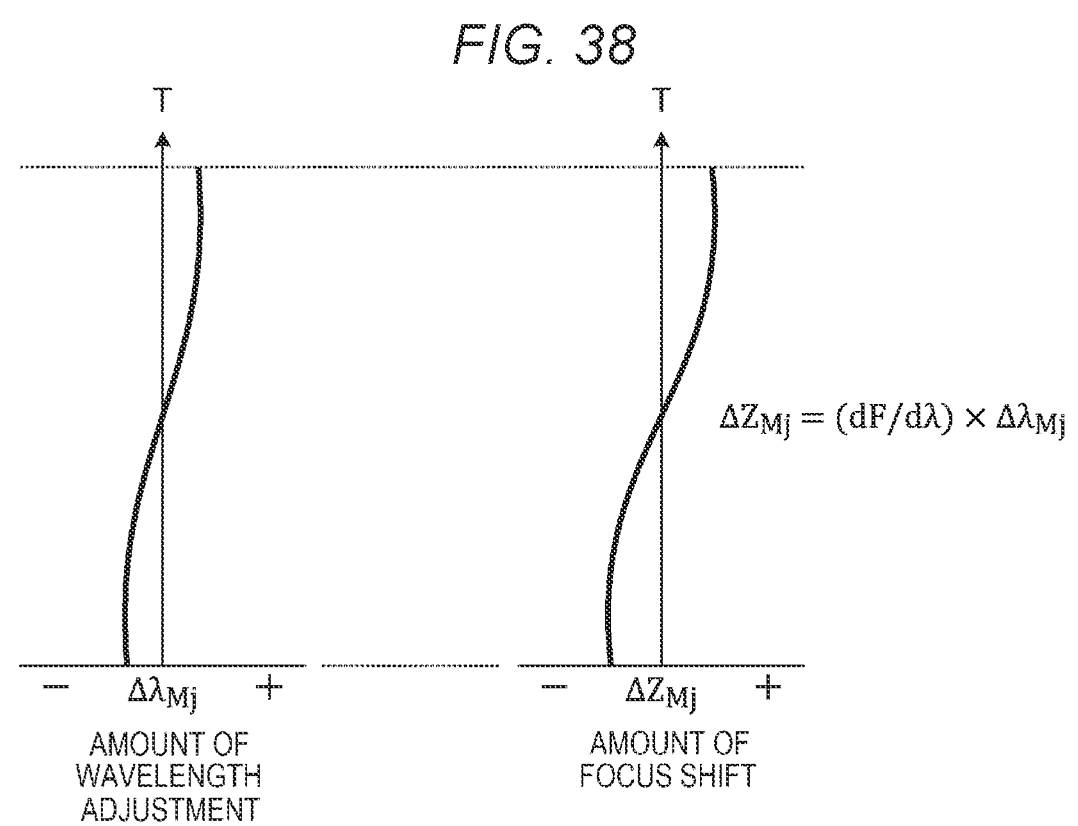
FIG. 37 shows the relationship between the average of the overlay errors and the distortion sensitivity at X-direction positions in the reverse scan.
FIG. 38 shows an example of the amount of wavelength adjustment and the amount of focus shift in the reverse scan.

FIG. 37 shows the relationship between the average $D_{MAij}$ of the overlay errors and the distortion sensitivity $(d\beta/d\lambda)_i$ in the reverse scan. In the reverse scan, the pulse laser light is first radiated to the Y-direction position j being one and then sequentially radiated in the direction in which the value of j increases. Appropriately calculating the amount of wavelength adjustment $\Delta\lambda_{Mj}$ allows reduction in the overlay errors.

FIG. 38 shows an example of the amount of wavelength adjustment $\Delta\lambda_{Mj}$ and the amount of focus shift $\Delta Z_{Mj}$ in the reverse scan. The vertical axis of FIG. 38 represents time T. The amount of focus shift $\Delta Z_{Mj}$ is calculated by the following expression.

$$\Delta Z_{Mj} = (dF/d\lambda) \times \Delta\lambda_{Mj}$$

In other respects, the amount of wavelength adjustment $\Delta\lambda_{Mj}$ and the amount of focus shift $\Delta Z_{Mj}$ are the same as the amount of wavelength adjustment $\Delta\lambda_{Pj}$ and the amount of focus shift $\Delta Z_{Pj}$.

FIG. 39 shows a data table of the amount of wavelength adjustment $\Delta\lambda_{Pj}$ and the amount of focus shift $\Delta Z_{Pj}$ in the forward scan. These values are calculated for each Y-direction position j.

FIG. 40 shows a data table of the amount of wavelength adjustment $\Delta\lambda_{Mj}$ and the amount of focus shift $\Delta Z_{Mj}$ in the reverse scan. These values are also calculated for each Y-direction position j.

2.3 Effects (1) According to the first embodiment, the exposure apparatus 200 performs the scanning exposure, in which plural scan fields of a semiconductor wafer are exposed to the pulse laser light having the reference wavelength 4*o*. The overlay measurement apparatus 300 measures the overlay error $D_{kij}$ in each of the plural scan fields for each of plural positions (i, j) in the scan field. The lithography control processor 430 calculates the averages $D_{Paij}$ and $D_{Maij}$ of the overlay errors in scan fields scanned in the same direction out of the plural scan fields for each of the plural positions (i, j). The lithography control processor 430 calculates the amounts of wavelength adjustment $\Delta\lambda_{Pj}$ and $\Delta\lambda_{Mj}$ with respect to the reference wavelength $\lambda_0$ in such a way that first overlay error parameters $R_{Pj}$ and $R_{M}j$ calculated from the averages $D_{Paij}$ and $D_{Maij}$ and the values of the distortions $(d\beta/d\lambda)_i\Delta\lambda_{Pj}$ and $(d\beta/d\lambda)_i\Delta\lambda_{Mj}$ obtained when the wavelength of the pulse laser light is changed from the reference wavelength $\lambda_0$ are smaller than second overlay error parameters $$\Sigma_i|D_{Paij}| \text{ and } \Sigma_i|D_{Maij}|$$

calculated from the averages $D_{Paij}$ and $D_{Maij}$. The laser apparatus 100 generates the pulse laser light having a wavelength controlled by using the amounts of wavelength adjustment $\Delta\lambda_{Pj}$ and $\Delta\lambda_{Mj}$, and outputs the generated pulse laser light to the exposure apparatus 200. The exposure apparatus 200 exposes the semiconductor wafer to the pulse laser light in the exposure apparatus 200 to manufacture electronic devices. The configuration described above allows appropriate reduction in the overlay error $D_{kij}$, which varies depending on the scan direction.

(2) According to the first embodiment, the lithography control processor 430 calculates the average $D_{PAij}$ of the overlay errors in plural first scan fields that undergo the forward scan and the average $D_{MAij}$ of the overlay errors in plural second scan fields that undergo the reverse scan. According to the configuration described above, the overlay error $D_{kij}$ can be reduced by appropriately reducing the size of the data for each of the scan fields scanned in the same direction.

(3) According to the first embodiment, the outer edge of each of the first and second scan fields is located inside the outer edge of the semiconductor wafer. According to the configuration described above, in which the overlay errors $D_{kij}$ in all the scan fields are used, data bias can be suppressed.

(4) According to the first embodiment, the lithography control processor 430 calculates the amounts of wavelength adjustment $\Delta\lambda_{Pj}$ and $\Delta\lambda_{Mj}$ for each of plural Y-direction positions j. The configuration described above allows adjustment of the wavelength for each of the Y-direction positions j and appropriate reduction in the overlay error $D_{kij}$.

(5) According to the first embodiment, the first overlay error parameter is the value obtained by summing along the X-direction the absolute value $|(d\beta/d\lambda)_i\Delta\lambda_{Pj}+D_{PAij}|$ and $|(d\beta/d\lambda)_i\Delta\lambda_{Mj}+D_{MAij}|$ of the sum of the averages $D_{PAij}$ and $D_{MAij}$ and the distortions $(d\beta/d\lambda)_i\Delta\lambda_{Pj}$ and $(d\beta/d\lambda)_i\Delta\lambda_{Mj}$. According to the configuration described above, in which the amounts of wavelength adjustment $\Delta\lambda_{Pj}$ and $\Delta\lambda_{Mj}$ are calculated from the overall characteristics in the X-direction, the overlay error $D_{kij}$ can be appropriately reduced.

(6) According to the first embodiment, the second overlay error parameters $$\Sigma_i|D_{PAij}| \text{ and } \Sigma_i|D_{MAij}|$$

and $\Sigma_i|D_{MAij}|$ are obtained by summing the absolute values of the averages $D_{PAij}$ and $D_{MAij}$ along the X-direction. According to the configuration described above, the overlay error $D_{kij}$ can be further reduced as compared with a case where none of the distortions $(d\beta/d\lambda)_i\Delta\lambda_{Pj}$ and $(d\beta/d\lambda)_i\Delta\lambda_{Mj}$ due to a change in wavelength is generated.

(7) According to the first embodiment, the lithography control processor 430 calculates the amounts of focus shift $\Delta Z_{Pj}$ and $\Delta Z_{Mj}$ in the exposure apparatus 200 by using the amounts of wavelength adjustment $\Delta\lambda_{Pj}$ and $\Delta\lambda_{Mj}$. The exposure apparatus 200 controls the Z-direction position of the semiconductor wafer in accordance with the amounts of focus shift $\Delta Z_{Pj}$ and $\Delta Z_{Mj}$. According to the configuration described above, in which the Z-direction position is controlled in accordance with the amounts of focus shift $\Delta Z_{Pj}$ and $\Delta Z_{Mj}$, which occur due to a change in wavelength, an image can be appropriately formed at the semiconductor wafer.

As for the other points, the first embodiment is the same as Comparative Example.

3. Lithography System that Calculates Synchronous Control Correction Values $S_{YPj}$ and $S_{YMj}$ for Each Scan Direction

3.1 Operation

3.1.1 Main Procedure

FIG. 41 is a flowchart showing the process of exposing the semiconductor wafer to the pulse laser light in such a way that the overlay errors are reduced in a second embodiment. The configuration of the lithography system according to the second embodiment is the same as that in the first embodiment. The operation in the second embodiment differs from that in the first embodiment in that S3 in FIG. 16 is replaced with S3*b*, as shown in FIG. 41. The processes in S1, S2, and S4 to S7 are the same as those in the first embodiment.

In S3*b*, the lithography control processor 430 calculates synchronous control correction values $S_{YPj}$ and $S_{YMj}$ as well as the amounts of wavelength adjustment $\Delta\lambda_{XPj}$ and $\Delta\lambda_{XMj}$ and the amounts of focus shift $\Delta Z_{XPj}$ and $\Delta Z_{XMj}$. The process in S3*b* will be described later in detail with reference to FIGS. 42 to 53.

The synchronous control correction values $S_{YPj}$ and $S_{YMj}$ are used to perform the synchronous control of the reticle stage RT and the workpiece table WT in S6.

3.1.2 Calculation of Amounts of Wavelength Adjustment $\Delta\lambda_{XPj}$ and $\Delta\lambda_{XMj}$, Synchronous Control Correction Values $S_{YPj}$ and $S_{YMj}$, and Amounts of Focus Shift $\Delta Z_{XPj}$ and $\Delta Z_{XMj}$ FIG. 42 is a flowchart showing the process of calculating the amounts of wavelength adjustment $\Delta\lambda_{XPj}$ and $\Delta\lambda_{XMj}$, the synchronous control correction values $S_{YPj}$ and $S_{YMj}$, and the amounts of focus shift $\Delta Z_{XPj}$ and $\Delta Z_{XMj}$ in detail. The processes shown in FIG. 42 correspond to the subroutine S3*b* shown in FIG. 41.

The processes in S31 to S33 are the same as those in the first embodiment shown in FIG. 20. In the second embodiment, the processes in S34*b* to S37*b* are carried out in place of those in S34 to S37.

In S34*b*, the lithography control processor 430 calculates the amount of wavelength adjustment $\Delta\lambda_{XPj}$ and the synchronous control correction value $S_{YPj}$ in the forward scan.

In S35*b*, the lithography control processor 430 calculates the amount of wavelength adjustment $\Delta\lambda_{XMj}$ and the synchronous control correction value $S_{YMj}$ in the reverse scan.

The amounts of wavelength adjustment $\Delta\lambda_{XPj}$ and $\Delta\lambda_{XMj}$ are calculated by using X-direction components $D_{XPAij}$, $D_{XMAij}$, and $(d\beta_X/d\lambda)_i$ of the averages $D_{PAij}$ and $D_{MAij}$ of the overlay errors and the distortion sensitivity $(d\beta/d\lambda)_i$. The synchronous control correction values $S_{YPj}$ and $S_{YMj}$ are calculated by using Y-direction components $D_{YPAij}$, $D_{YMAij}$, and $(d\beta_Y/d\lambda)_i$ of the averages $D_{PAij}$ and $D_{MAij}$ of the overlay errors and the distortion sensitivity $(d\beta/d\lambda)_i$. These processes will be described later in detail with reference to FIGS. 43 to 48.

In S36*b*, the lithography control processor 430 calculates the amounts of focus shift $\Delta Z_{XPj}$ and $\Delta Z_{XMj}$ for each Y-direction position j in a scan field from the amounts of wavelength adjustment $\Delta\lambda_{XPj}$ and $\Delta\lambda_{XMj}$ and the focus sensitivity $dF/d\lambda$ of the projection optical system 202 with respect to the wavelength.

In S37*b*, the lithography control processor 430 transmits the target wavelength λt, the synchronous control correction values $S_{YPj}$ and $S_{YMj}$, and the amounts of focus shift $\Delta Z_{XPj}$ and $\Delta Z_{XMj}$ to the exposure control processor 210. The target wavelength at is the sum of the reference wavelength $\lambda_0$ and the amount of wavelength adjustment $\Delta\lambda_{XPj}$ or $\Delta\lambda_{XMj}$.

3.1.3 Calculation of Amounts of Wavelength Adjustment $\Delta\lambda_{XPj}$ and $\Delta\lambda_{XMj}$ and Synchronous Control Correction Values $S_{YPj}$ and $S_{YMj}$ FIG. 43 is a flowchart showing the process of calculating the amount of wavelength adjustment $\Delta\lambda_{XPj}$ and the synchronous control correction value $S_{YPj}$ in the forward scan in detail. The processes shown in FIG. 43 correspond to the subroutine S34*b* shown in FIG. 42.

The processes in S340, S345, and S346 are the same as those in the first embodiment shown in FIG. 33. In the second embodiment, the processes in S341*b* to S344*b* and S349*b* are carried out in place of those in S341 to S343 and S349.

In S341*b*, the lithography control processor 430 reads the average $D_{PAij}$ of the overlay errors in the forward scan, and calculates an X-direction component $D_{XPAij}$ and a Y-direction component $D_{YPAij}$.

In S342*b*, the lithography control processor 430 reads the distortion sensitivity $(d\beta/d\lambda)_i$ and calculates an X-direction component $(d\beta_X/d\lambda)_i$ and a Y-direction component $(d\beta_Y/d\lambda)_i$.

In S343*b*, the lithography control processor 430 calculates the amount of wavelength adjustment $\Delta\lambda_{XPj}$ in the forward scan in such a way that the inequality indicated by Expression (3) below is satisfied.

$$R_{XPj} = \sum_i \left| \left(\frac{d\beta_X}{d\lambda}\right)_i \Delta\lambda_{XPj} + D_{XPAij} \right| < \sum_i |D_{XPAij}| \tag{3}$$

It is more desirable that the amount of wavelength adjustment $\Delta\lambda_{XPj}$ is so calculated that the left side $R_{XPj}$ of Expression (3) is minimized.

In S344*b*, the lithography control processor 430 calculates the synchronous control correction value $S_{YPj}$ in the forward scan by using Expression (4) below.

$$S_{YPj} = \frac{1}{Imax} \sum_{i=1}^{Imax} \left[ \left(\frac{d\beta_Y}{d\lambda}\right)_i \Delta\lambda_{XPj} + D_{YPAij} \right] \tag{4}$$

That is, the synchronous control correction value $S_{YPj}$ is the average obtained by summing along the X-direction the sum of the Y-direction component $D_{YPAij}$ of the average $D_{PAij}$ of the overlay errors and the Y-direction component $(d\beta_Y/d\lambda)_i\Delta\lambda_{XPj}$ of the distortion $(d\beta/d\lambda)_i\Delta\lambda_{XPj}$ and dividing the resultant sum by Imax.

In S349*b*, the lithography control processor 430 causes the memory 432 to store the amount of wavelength adjustment $\Delta\lambda_{XPj}$ and the synchronous control correction value $S_{YPj}$ for each Y-direction position j.

FIG. 44 is a flowchart showing the process of calculating the amount of wavelength adjustment $\Delta\lambda_{XMj}$ and the synchronous control correction value $S_{YMj}$ in the reverse scan in detail. The processes shown in FIG. 44 correspond to the subroutine S35*b* shown in FIG. 42.

The processes shown in FIG. 44 differ from the processes shown in FIG. 43 in that the average $D_{MAij}$ of the overlay errors in the reverse scan is used in place of the average $D_{PAij}$ of the overlay errors in the forward scan, but are the same as those shown in FIG. 43 in other respects.

Figure 45:
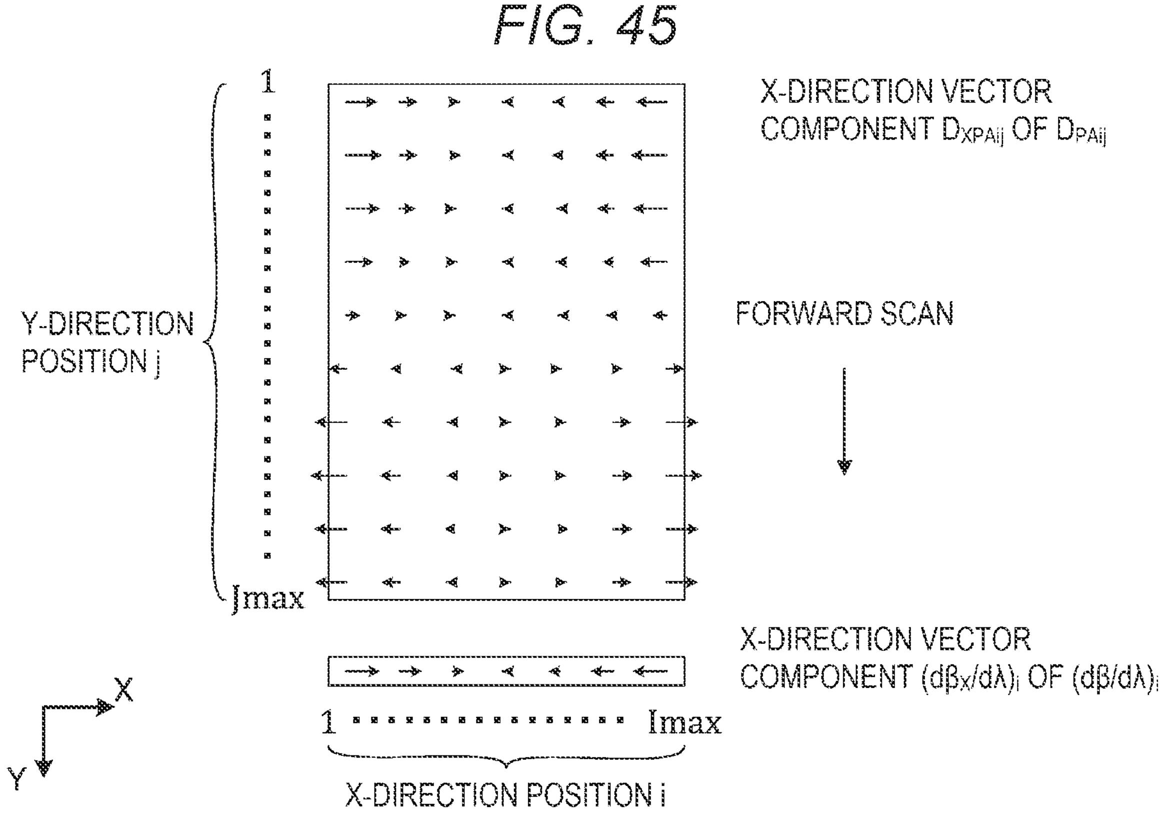
FIG. 45 shows the relationship between an X-direction component of the average of the overlay errors and an X-direction component of the distortion sensitivity at X-direction positions in the forward scan.

FIG. 45 shows the relationship between the X-direction component $D_{XPAij}$ of the average $D_{PAij}$ of the overlay errors and the X-direction component $(d\beta_X/d\lambda)_i$ of the distortion sensitivity $(d\beta/d\lambda)_i$ in the forward scan. Appropriately calculating the amount of wavelength adjustment $\Delta\lambda_{XPj}$ allows generation of distortion according to the distortion sensitivity $(d\beta/d\lambda)_i$ and reduces the overlay errors in the X-direction.

Figure 46:
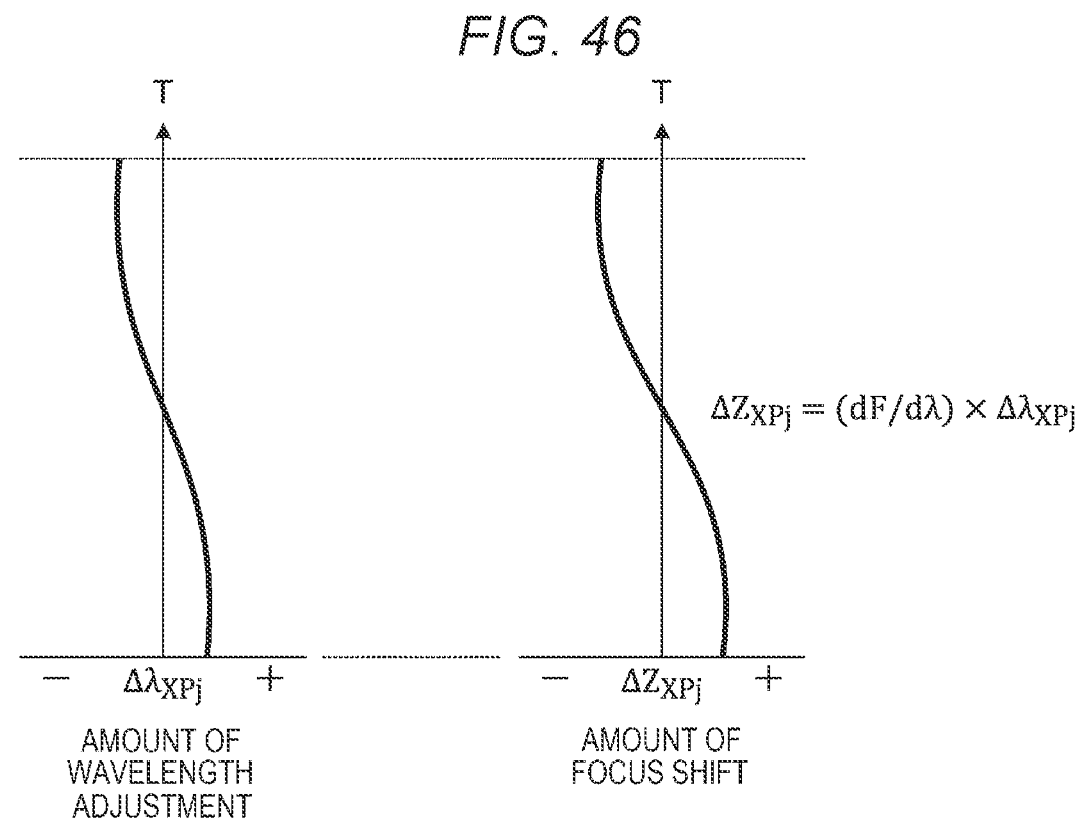
FIG. 46 shows an example of the amount of wavelength adjustment and the amount of focus shift in the forward scan.

FIG. 46 shows an example of the amount of wavelength adjustment $\Delta\lambda_{XPj}$ and the amount of focus shift $\Delta Z_{XPj}$ in the forward scan. The vertical axis of FIG. 46 represents time T. The amount of focus shift $\Delta Z_{XPj}$ is calculated by the following expression.

$$\Delta Z_{XPj} = (dF/d\lambda) \times \Delta\lambda_{XPj}$$

Figure 47:
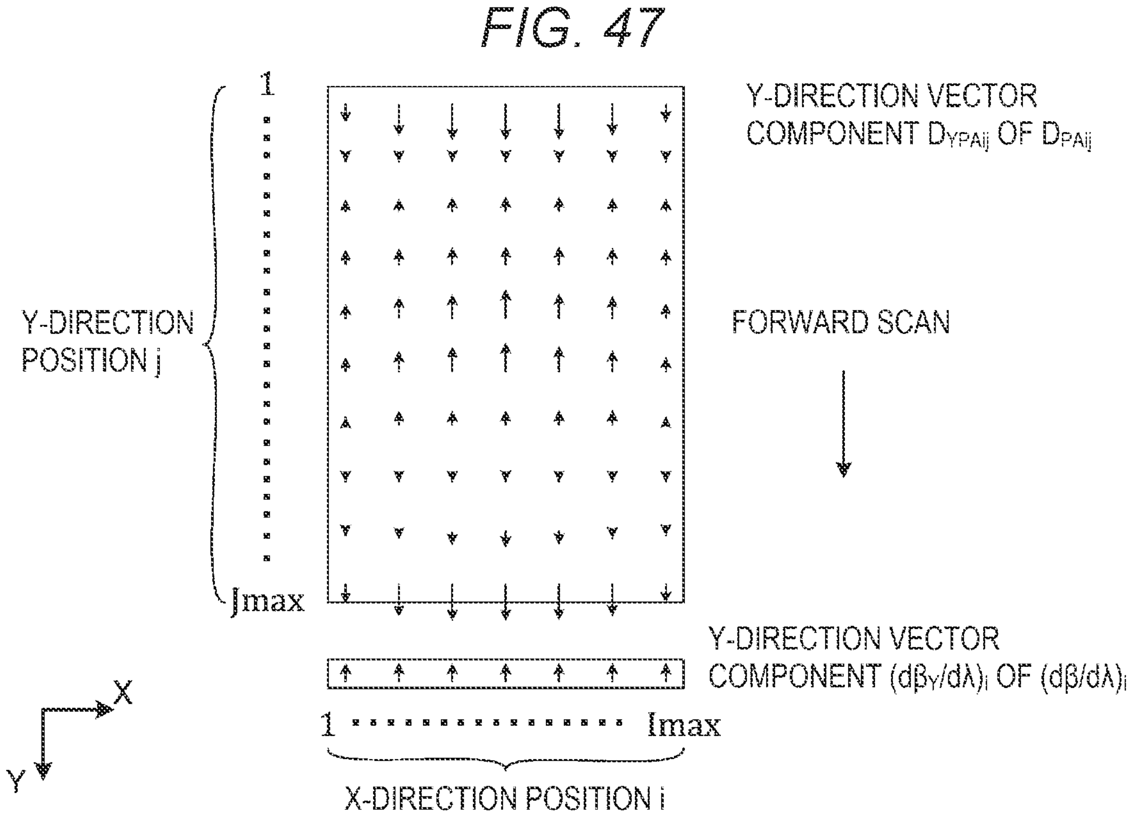
FIG. 47 shows the relationship between a Y-direction component of the average of the overlay errors and a Y-direction component of the distortion sensitivity at X-direction positions in the forward scan.

FIG. 47 shows the relationship between the Y-direction component $D_{YPAij}$ of the average $D_{PAij}$ of the overlay errors and the Y-direction component $(d\beta_Y/d\lambda)_i$ of the distortion sensitivity $(d\beta/d\lambda)_i$ in the forward scan.

Figure 48:
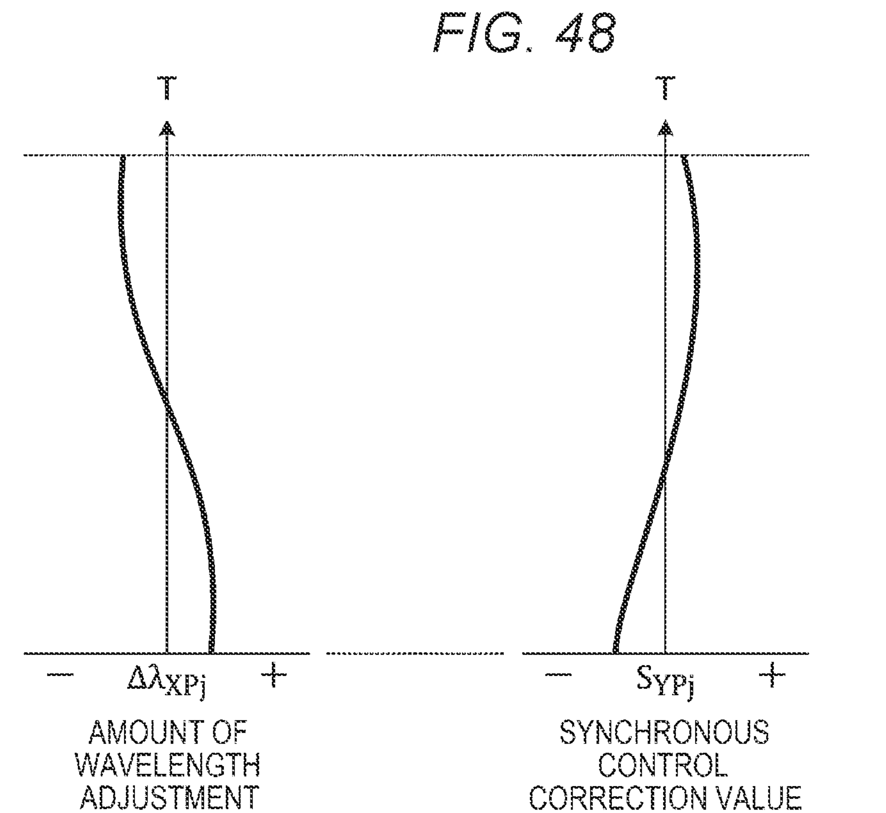
FIG. 48 shows an example of the amount of wavelength adjustment and the synchronous control correction values in the forward scan.

FIG. 48 shows an example of the amount of wavelength adjustment $\Delta\lambda_{XPj}$ and the synchronous control correction value $S_{YPj}$ in the forward scan. The vertical axis of FIG. 48 represents time T. Setting the amount of wavelength adjustment $\Delta\lambda_{XPj}$ to reduce the X-direction component $D_{XPAij}$ produces the distortion $(d\beta/d\lambda)_i\Delta\lambda_{XPj}$, as shown in FIGS. 45 and 46. Therefore, in the second embodiment, not only the Y-direction component $D_{YPAij}$ of the average $D_{PAij}$ of the overlay errors but also the Y-direction component $(d\beta_Y/d\lambda)_i\Delta\lambda_{XPj}$ of the distortion $(d\beta/d\lambda))\Delta\lambda_{XPj}$ need to be reduced. To this end, the synchronous control correction value $S_{YPj}$ is calculated by using Expression (4).

The amount of wavelength adjustment $\Delta\lambda_{XMj}$, the amount of focus shift $\Delta Z_{XMj}$, and the synchronous control correction value $S_{YMj}$ in the reverse scan are also determined as the amount of wavelength adjustment $\Delta\lambda_{XPj}$, the amount of focus shift $\Delta Z_{XPj}$, and the synchronous control correction value $S_{YPj}$ in the forward scan described with reference to FIGS. 45 to 48 are.

Figure 49:
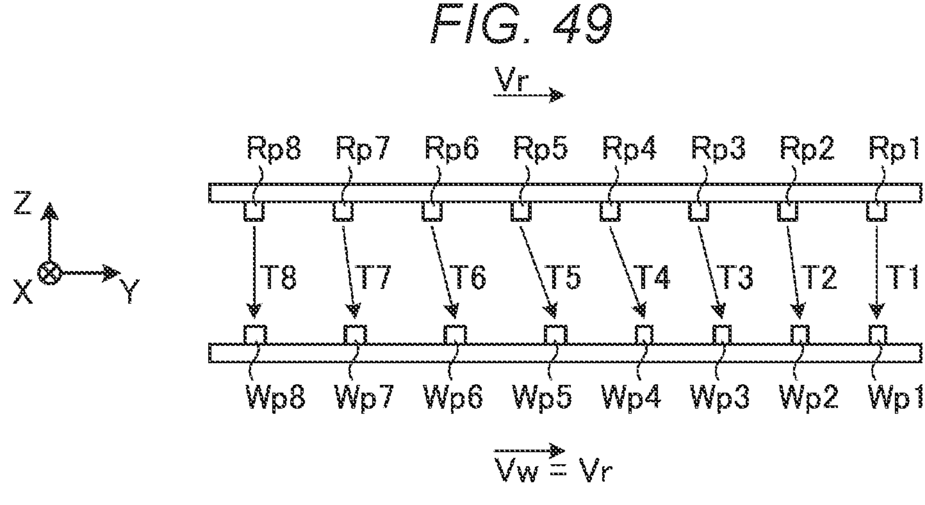
FIG. 49 conceptually shows a method for adjusting the Y-direction position of a reticle pattern to which a semiconductor wafer is exposed with the aid of the synchronous control of the reticle stage and a workpiece table.
Figure 50:
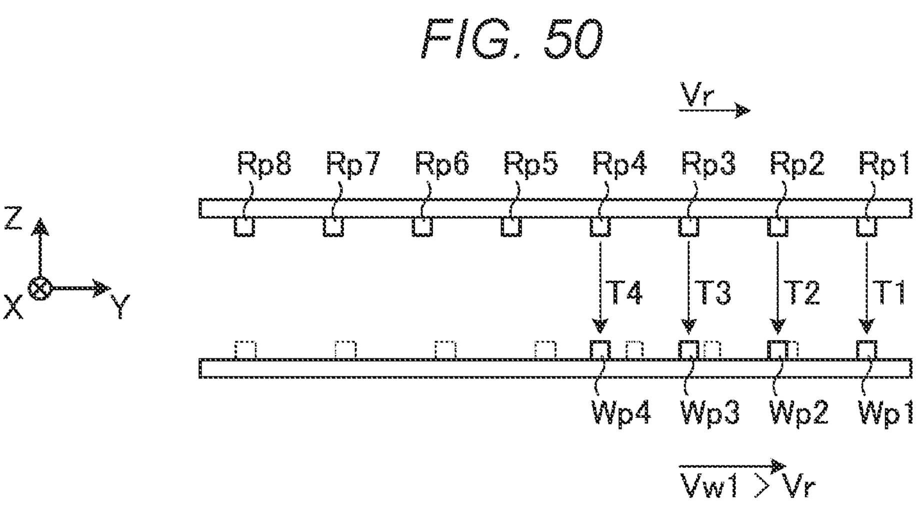
FIG. 50 conceptually shows the method for adjusting the Y-direction position of the reticle pattern to which the semiconductor wafer is exposed with the aid of the synchronous control of the reticle stage and the workpiece table.
Figure 51:
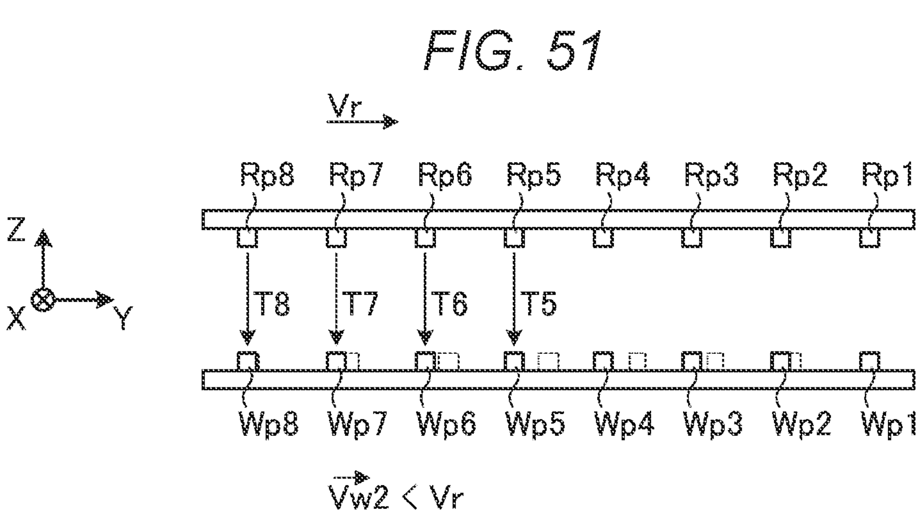
FIG. 51 conceptually shows the method for adjusting the Y-direction position of the reticle pattern to which the semiconductor wafer is exposed with the aid of the synchronous control of the reticle stage and the workpiece table.

FIGS. 49 to 51 conceptually show a method for adjusting the Y-direction position of a reticle pattern to which a semiconductor wafer is exposed with the aid of the synchronous control of the reticle stage RT and the workpiece table WT. Let Vr be the travel speed of the reticle stage RT, and Vw be the travel speed of the workpiece table WT. For example, when the magnification of the projection optical system 202 is set at ¼, Vw is ¼ of Vr, and the reticle pattern is projected at a reduction magnification of ¼ onto the semiconductor wafer coated with a photoresist film. It is, however, assumed in FIGS. 49 to 51 that the magnification of the projection optical system 202 is one for easier understanding of the correspondence between the reticle pattern and the photoresist pattern. It is further assumed that the travel directions of the reticle stage RT and the workpiece table WT are not opposite directions but the same direction. As the reticle stage RT and the workpiece table WT move, a first section Rp1 of the reticle pattern is transferred to a first section Wp1 of the semiconductor wafer at time T1, and similarly, a second section Rp2 to an eighth section Rp8 of the reticle pattern are transferred to a second section Wp2 to an eighth section Wp8 of the semiconductor wafer, respectively, at time T2 to T8.

When the travel speed Vr of the reticle stage RT and the travel speed Vw of the workpiece table WT are equal to each other, as shown in FIG. 49, it is assumed that the Y-direction component $D_{YPAij}$ of the average $D_{PAij}$ of the overlay errors and the Y-direction component $(d\beta_Y/d\lambda)\Delta\lambda_{XPj}$ of the distortion $(d\beta/d\lambda))\Delta\lambda_{XPj}$ are generated. In FIG. 49, the spacings in the Y-direction between the first section Wp1 to the fourth section Wp4 of the semiconductor wafer are narrower than the spacings in the Y-direction between the first section Rp1 to the fourth section Rp4 of the reticle pattern. On the other hand, the spacings in the Y-direction between the fifth section Wp5 to the eighth section Wp8 of the semiconductor wafer are wider than the spacings in the Y-direction between the fifth section Rp5 to the eighth section Rp8 of the reticle pattern.

In this case, correcting the synchronous control as shown in FIGS. 50 and 51 allows adjustment of the Y-direction positions of the first section Wp1 to the eighth section Wp8.

From the time T1 to T4, a travel speed Vw1 of the workpiece table WT is made faster than the travel speed Vr of the reticle stage RT, as shown in FIG. 50. As a result, the first section Rp1 to the fourth section Rp4 of the reticle pattern are transferred to the first section Wp1 to the fourth section Wp4 indicated by the solid lines in place of those at the positions indicated by the broken lines in FIG. 50.

On the other hand, from the time T5 to T8, a travel speed Vw2 of the workpiece table WT is made slower than the travel speed Vr of the reticle stage RT, as shown in FIG. 51. As a result, the fifth section Rp5 to the eighth section Rp8 of the reticle pattern are transferred to the fifth section Wp5 to the eighth section Wp8 indicated by the solid lines in place of those at the positions indicated by the broken lines in FIG. 51.

The exposure control processor 210 can perform the synchronous control by calculating the travel speeds Vw1 and Vw2 of the workpiece table WT by using the synchronous control correction values $S_{YPj}$ and $S_{Ymj}$.

FIG. 52 shows a data table of the amount of wavelength adjustment $\Delta\lambda_{XPj}$, the synchronous control correction value $S_{YPj}$, and the amount of focus shift $\Delta Z_{XPj}$ in the forward scan. These values are calculated for each Y-direction position j.

FIG. 53 shows a data table of the amount of wavelength adjustment $\Delta\lambda_{XMj}$, the synchronous control correction value $S_{Ymj}$, and the amount of focus shift $\Delta Z_{XMj}$ in the reverse scan. These values are also calculated for each Y-direction position j.

3.2 Effects (8) According to the second embodiment, the lithography control processor 430 not only calculates the amounts of wavelength adjustment $\Delta\lambda_{XPj}$ and $\Delta\lambda_{XMj}$, but also calculates the synchronous control correction values $S_{YPj}$ and $S_{Ymj}$ used to correct the synchronous control of the reticle stage RT and the workpiece table WT of the exposure apparatus 200 by using the averages $D_{YPAij}$ and $D_{YMAij}$ and the values of the distortion $(d\beta_Y/d\lambda)_i\Delta\lambda_{XPj}$ and $(d\beta_Y/d\lambda)_i\Delta\lambda_{XMj}$. The exposure apparatus 200 performs the synchronous control in accordance with the correction values $S_{YPj}$ and $S_{Ymj}$. According to the configuration described above, combining the wavelength adjustment and the synchronous control adjustment allows appropriate reduction in the overlay error $D_{kij}$.

(9) According to the second embodiment, the values of the distortion $(d\beta_X/d\lambda)_i\Delta\lambda_{XPj}$ and $(d\beta_X/d\lambda)_i\Delta\lambda_{XMj}$ are values obtained by multiplying the distortion sensitivity $(d\beta_X/d\lambda)_i$ of the projection optical system 202 of the exposure apparatus 200 with respect to the wavelength of the pulse laser light by the amounts of wavelength adjustment $\Delta\lambda_{XPj}$ and $\Delta\lambda_{XMj}$, respectively. The lithography control processor 430 calculates the amounts of wavelength adjustment $\Delta\lambda_{XPj}$ and $\Delta\lambda_{XMj}$ by using the X-direction components $D_{XPAij}$ and $D_{XMAij}$ of the average of the overlay errors and the X-direction components $(d\beta_X/d\lambda)_i\Delta\lambda_{XPj}$ and $(d\beta_X/d\lambda)_i\Delta\lambda_{XMj}$ of the distortion. The lithography control processor 430 calculates the correction values $S_{YPj}$ and $S_{YMj}$ by using the Y-direction components $D_{YPAij}$ and $D_{YMAij}$ of the average of the overlay errors and the Y-direction components $(d\beta_Y/d\lambda)_i\Delta\lambda_{XPj}$ and $(d\beta_Y/d\lambda)_i\Delta\lambda_{XMj}$ of the distortion. According to the configuration described above, the overlay errors $D_{XPAij}$ and $DX_{MAij}$ in the X-direction can be reduced by the wavelength adjustment, and the overlay errors $D_{YPAij}$ and $D_{YMAij}$ in the Y-direction can be reduced by the synchronous control.

(10) According to the second embodiment, the lithography control processor 430 calculates the correction values $S_{YPj}$ and $S_{YMj}$ by summing along the X-direction the sum of the Y-direction components $D_{YPAij}$ and $D_{YMAij}$ of the average of the overlay errors, and the Y-direction components $(d\beta_Y/d\lambda)_i\Delta\lambda_{XPj}$ and $(d\beta_Y/d\lambda)_i\Delta\lambda_{XMj}$ of the distortion. According to the configuration described above, in which the correction values $S_{YPj}$ and $S_{YMj}$ are calculated from the overall characteristics in the X-direction, the overlay error $D_{kij}$ can be appropriately reduced.

As for the other points, the second embodiment is the same as the first embodiment.

Figure 54:
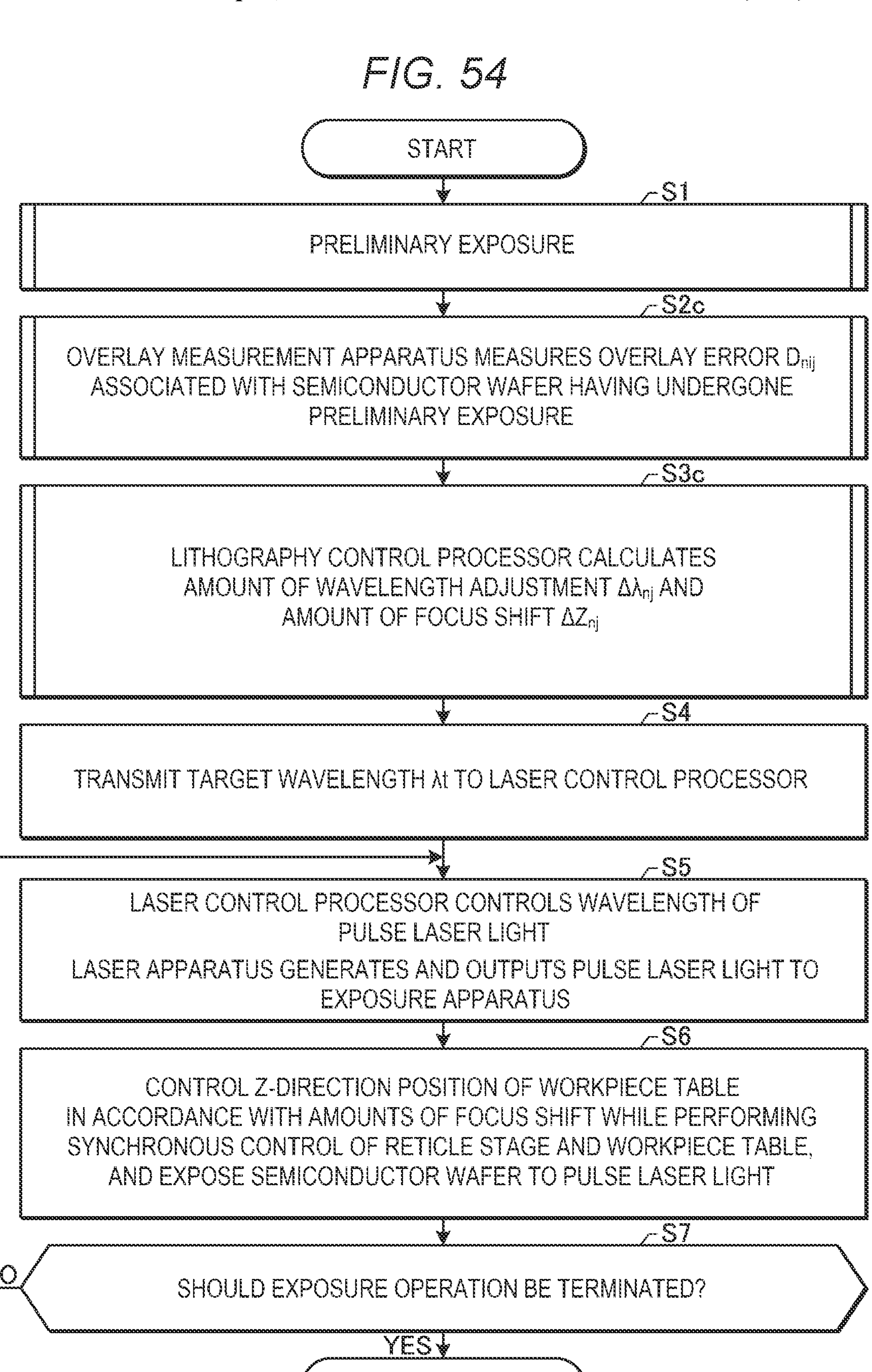
FIG. 54 is a flowchart showing the process of exposing the semiconductor wafer to the pulse laser light in such a way that the overlay errors are reduced in a third embodiment.

4. Lithography System that Calculates Amount of Wavelength Adjustment $\Delta\lambda_{nj}$ and Amount of Focus Shift $\Delta Z_{nj}$ for Each Scan Field Number n 4.1 Operation 4.1.1 Main Procedure FIG. 54 is a flowchart showing the process of exposing the semiconductor wafer to the pulse laser light in such a way that the overlay errors are reduced in a third embodiment. The configuration of the lithography system according to the third embodiment is the same as that in the first embodiment. The operation in the third embodiment differs from that in the first embodiment in that S2 and S3 in FIG. 16 are replaced with S2*c* and S3*c*, as shown in FIG. 54. The processes in S1 and S4 to S7 are the same as those in the first embodiment.

In S2*c*, the overlay measurement apparatus 300 measures an overlay error $D_{nij}$ associated with the semiconductor wafer having undergone the preliminary exposure. The process of measuring the overlay error $D_{nij}$ will be described later with reference to FIG. 56. The measured overlay error $D_{nij}$ is transmitted to the lithography control processor 430.

In S3*c*, the lithography control processor 430 calculates the amount of wavelength adjustment $\Delta\lambda_{nj}$ and the amount of focus shift $\Delta Z_{nj}$. The process in S3*c* will be described later in detail with reference to FIGS. 57 to 60.

Figure 55:
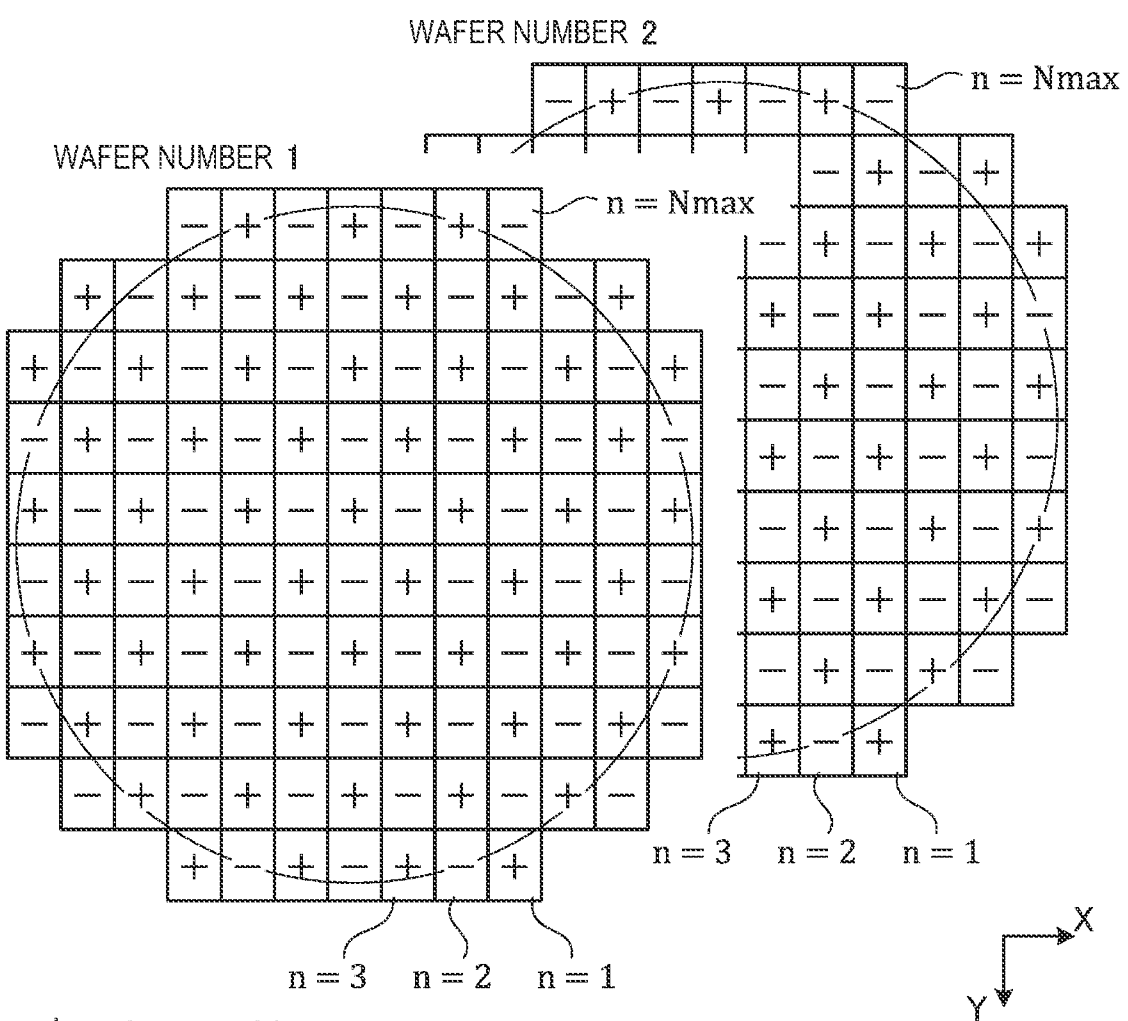
FIG. 55 shows plural semiconductor wafers where the overlay error is measured.

FIG. 55 shows plural semiconductor wafers where the overlay error $D_{nij}$ is measured. Wafer numbers are assigned to the plural semiconductor wafers. Out of the plural scan fields of each of the plural semiconductor wafers, the scan fields having the same scan field number n are scanned in the same scan direction. For each of the semiconductor wafers, the overlay error $D_{nij}$ is measured at the Nmax scan fields to which the scan field numbers n are assigned.

The Nmax scan fields include scan fields each having an outer edge located inside the outer edge of the semiconductor wafer, and scan fields each having an outer edge that intersects with the outer edge of the semiconductor wafer, as described with reference to FIG. 17.

In the third embodiment, for each scan field having an outer edge located inside the outer edge of the semiconductor wafer, the overlay error $D_{nij}$ is measured at all the Imax×Jmax in-scan-field positions (i, j). For each scan field having an outer edge that intersects with the outer edge of the semiconductor wafer, the overlay error $D_{nij}$ is measured at the in-scan-field positions (i, j) inside the outer edge of the semiconductor wafer.

4.1.2 Measurement of Overlay Error $D_{nij}$

Figure 56:
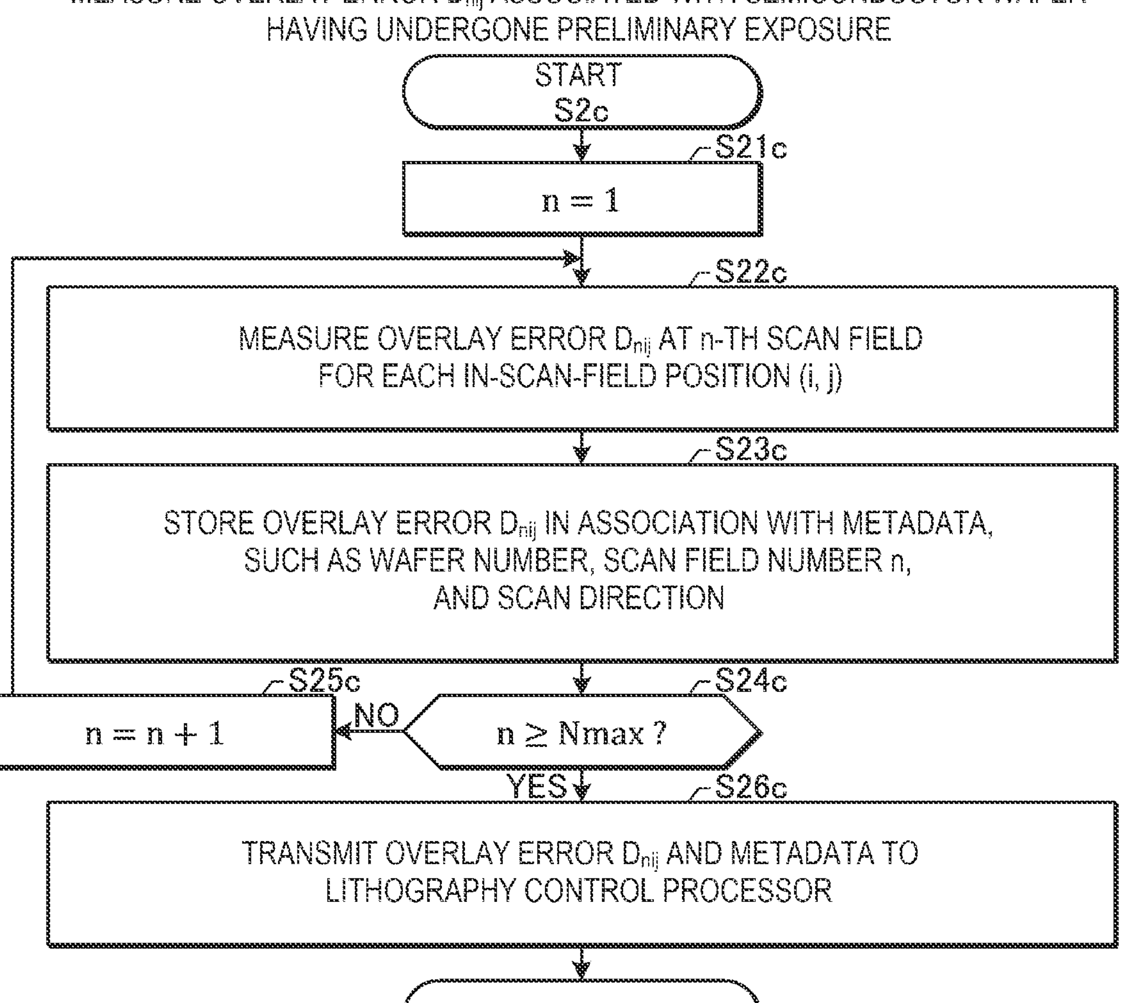
FIG. 56 is a flowchart showing the process of measuring the overlay error in detail.

FIG. 56 is a flowchart showing the process of measuring the overlay error $D_{nij}$ in detail. The processes shown in FIG. 56 correspond to the subroutine S2*c* shown in FIG. 54.

The processes shown in FIG. 56 differ from those in the first embodiment shown in FIG. 19 in that the scan field number is expressed by n in place of k, and that the maximum value of the scan field number is Nmax in place of K. The other points are the same as those in the processes shown in FIG. 19.

Figure 57:
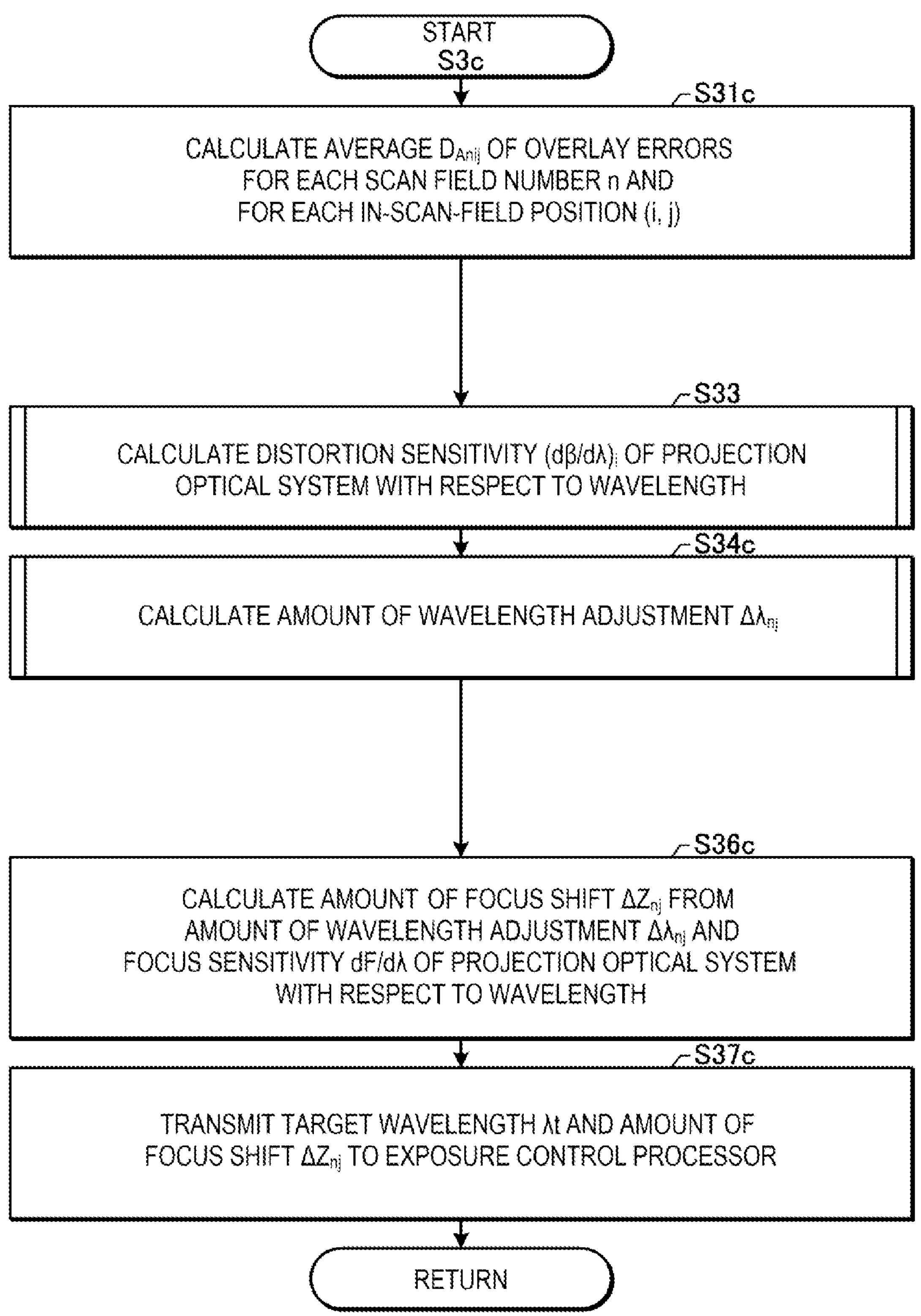
FIG. 57 is a flowchart showing the process of calculating the amount of wavelength adjustment and the amount of defocus in detail.

4.1.3 Calculation of Amount of Wavelength Adjustment $\Delta\lambda_{nj}$ and Amount of Focus Shift $\Delta Z_{nj}$ FIG. 57 is a flowchart showing the process of calculating the amount of wavelength adjustment $\Delta\lambda_{nj}$ and the amount of defocus $\Delta Z_{nj}$ in detail. The processes shown in FIG. 57 correspond to the subroutine S3*c* shown in FIG. 54.

The processes shown in FIG. 57 differ from those in the first embodiment shown in FIG. 20 in that the amount of wavelength adjustment $\Delta\lambda_{nj}$ and the amount of focus shift $\Delta Z_{nj}$ are calculated for each scan field number n. The processes are specifically carried out as shown below.

In S31*c*, the lithography control processor 430 calculates an average $D_{Anij}$ of the overlay errors for each scan field number n and for each in-scan-field position (i, j). The average $D_{Anij}$ is calculated by summing the overlay errors $D_{nij}$ measured at one or more semiconductor wafers by carrying out the processes shown in FIG. 56 for each scan field number n and for each in-scan-field position (i, j) and dividing the sum by the number of semiconductor wafers.

FIG. 58 shows a data table of the average $D_{Anij}$ of the overlay errors. The average $D_{Anij}$ is calculated for each scan field number n and for each in-scan-field position (i, j).

Referring again to FIG. 57, the process in S33 is the same as that in the first embodiment shown in FIG. 20.

In S34*c*, the lithography control processor 430 calculates the amount of wavelength adjustment $\Delta\lambda_{nj}$ by using the average $D_{Anij}$ and the distortion sensitivity $(d\beta/d\lambda)_i$. The calculation of the amount of wavelength adjustment $\Delta\lambda_{nj}$ will be described later with reference to FIGS. 59 and 60.

In S36*c*, the lithography control processor 430 calculates the amount of focus shift $\Delta Z_{nj}$ from the amount of wavelength adjustment $\Delta\lambda_{nj}$ and the focus sensitivity dF/dλ by using the following expression:

$$\Delta Z_{nj} = (dF/d\lambda) \times \Delta k_{nj}$$

In S37*c*, the lithography control processor 430 transmits the target wavelength at and the amount of focus shift $\Delta Z_{nj}$ to the exposure control processor 210. The target wavelength at is the sum of the reference wavelength $\lambda_0$ and the amount of wavelength adjustment $\Delta\lambda_{nj}$.

4.1.4 Calculation of Amount of Wavelength Adjustment $\Delta\lambda_{nj}$

Figure 59:
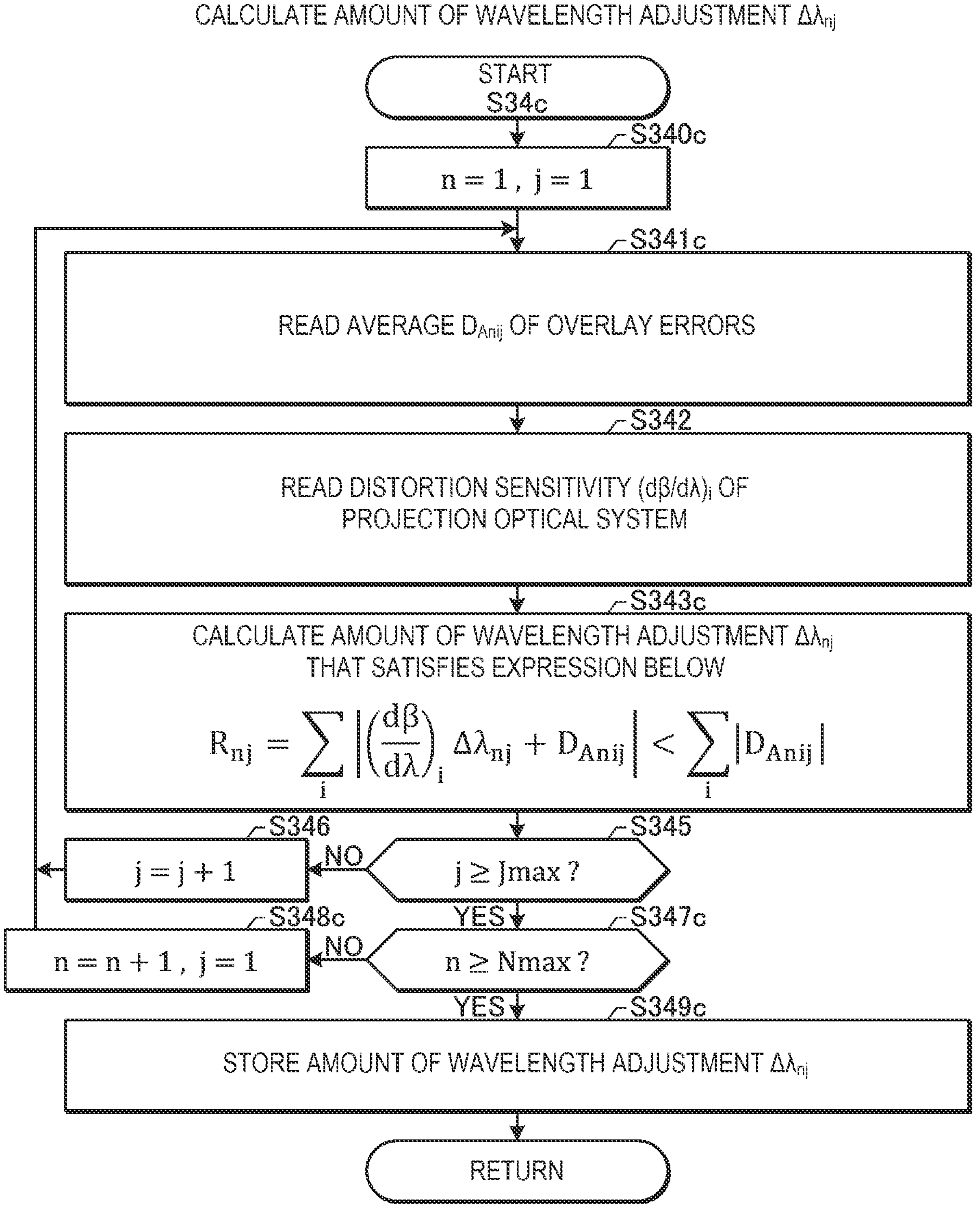
FIG. 59 is a flowchart showing the process of calculating the amount of wavelength adjustment in detail.

FIG. 59 is a flowchart showing the process of calculating the amount of wavelength adjustment $\Delta\lambda_{nj}$ in detail. The processes shown in FIG. 59 correspond to the subroutine S34*c* shown in FIG. 57.

The processes shown in FIG. 59 differ from those in the first embodiment shown in FIGS. 33 and 34 in that the amount of wavelength adjustment $\Delta\lambda_{nj}$ is calculated for each scan field number n. The processes are specifically carried out as shown below.

In S340*c*, the lithography control processor 430 sets each of the scan field number n and the Y-direction position j in a scan field at one.

In S341*c*, the lithography control processor 430 reads the average $D_{Anij}$ of the overlay errors calculated in S31*c* in FIG. 57.

The process in S342 is the same as that in the first embodiment shown in FIG. 33.

In S343*c*, the lithography control processor 430 calculates the amount of wavelength adjustment $\Delta\lambda_{nj}$ in such a way that the inequality indicated by Expression (5) below is satisfied.

$$R_{nj} = \sum_i \left| \left( \frac{d\beta}{d\lambda} \right)_i \Delta\lambda_{nj} + D_{Anij} \right| < \sum_i |D_{Anij}| \tag{5}$$

It is more desirable that the amount of wavelength adjustment $\Delta\lambda_{nj}$ is so calculated that the left side $R_{nj}$ of Expression (5) is minimized.

The processes in S345 and S346 are the same as those in the first embodiment shown in FIG. 33. Note, however, that when the value of j is greater than or equal to Jmax (YES in S345), the lithography control processor 430 proceeds to the process in S347*c*.

In S347$c$, the lithography control processor 430 evaluates whether the value of n is greater than or equal to Nmax. When the value of n is smaller than Nmax (NO in S347$c$), the lithography control processor 430 proceeds to the process in S348$c$. When the value of n is greater than or equal to Nmax (YES in S347$c$), the lithography control processor 430 proceeds to the process in S349$c$.

In S348$c$, the lithography control processor 430 adds one to the value of n to update the value of n and resets the value of j to one. After S348$c$, the lithography control processor 430 returns to the process in S341$c$.

In S349$c$, the lithography control processor 430 causes the memory 432 to store the amount of wavelength adjustment $\Delta\lambda_{nj}$ for each Y-direction position j.

FIG. 60 shows a data table of the amount of wavelength adjustment $\Delta\lambda_{nj}$ and the amount of focus shift $\Delta Z_{nj}$. These values are calculated for each scan field number n and for each Y-direction position j.

4.2 Effects

(11) According to the third embodiment, the scan fields of the plural semiconductor wafers at positions corresponding to one another are scanned in the same scan direction. The lithography control processor 430 calculates the average $D_{Anij}$ of the overlay errors at the plural positions (i, j) in each of the scan fields of the plural semiconductor wafers at the positions corresponding to one another. According to the configuration described above, the overlay errors $D_{nij}$ that depend on the position in each scan fields of each semiconductor wafer can be reduced.

(12) According to the third embodiment, the plural scan fields include scan fields each having an outer edge located inside the outer edge of the semiconductor wafer, and scan fields each having an outer edge that intersects with the outer edge of the semiconductor wafer. According to the configuration described above, the overlay errors $D_{nij}$ in the scan fields each having an outer edge that intersects with the outer edge of the semiconductor wafer can also be appropriately reduced.

As for the other points, the third embodiment is the same as the first embodiment.

Figure 61:
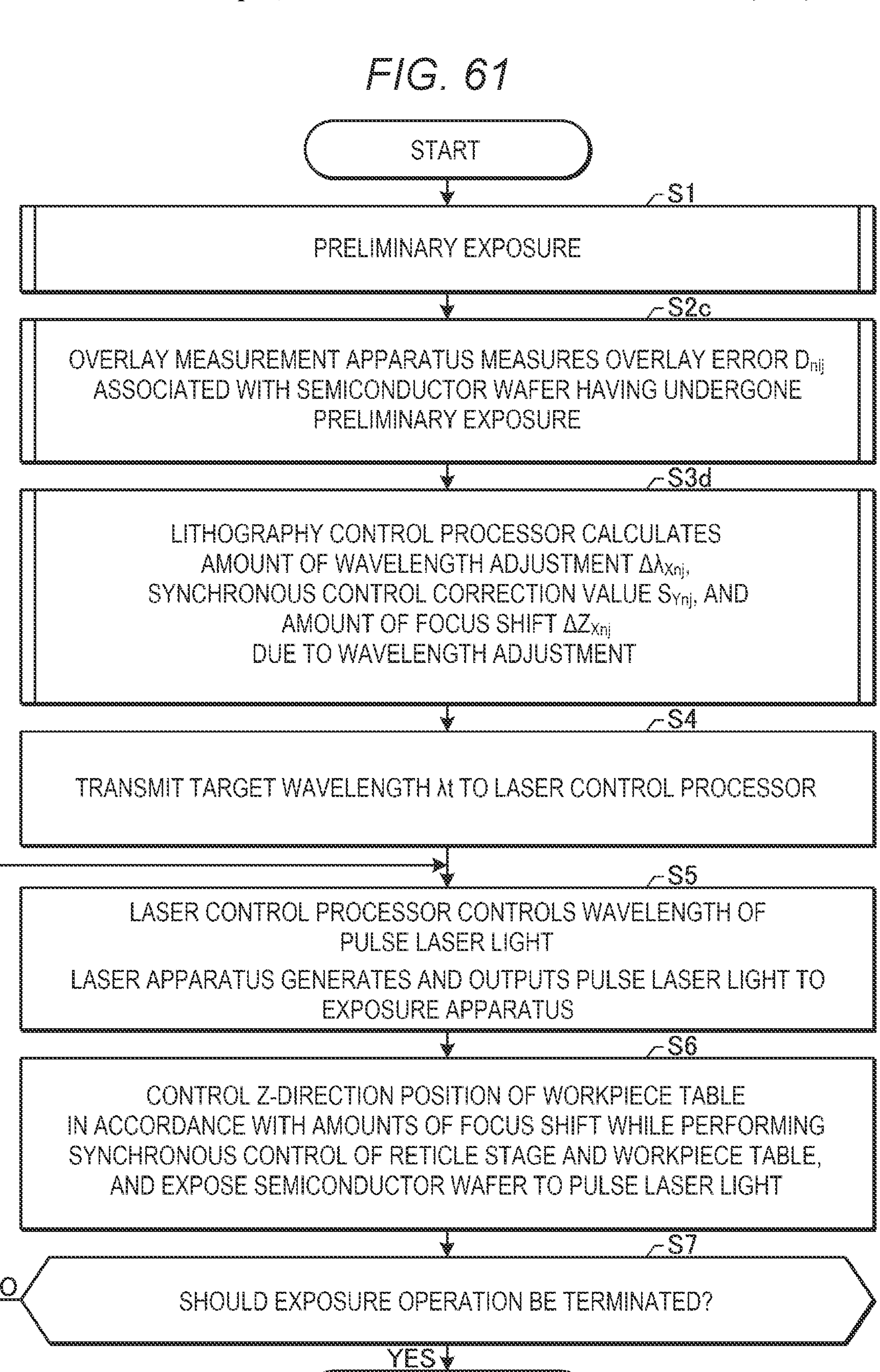
FIG. 61 is a flowchart showing the process of exposing the semiconductor wafer to the pulse laser light in such a way that the overlay errors are reduced in a fourth embodiment.

5. Lithography System that Calculates Synchronous Control Correction Value $S_{Ynj}$ for Each Scan Field Number n 5.1 Operation 5.1.1 Main Procedure FIG. 61 is a flowchart showing the process of exposing the semiconductor wafer to the pulse laser light in such a way that the overlay errors are reduced in a fourth embodiment. The configuration of the lithography system according to the fourth embodiment is the same as that in the first embodiment. The operation in the fourth embodiment differs from that in the first embodiment in that S2 and S3 in FIG. 16 are replaced with S2$c$ and S3$d$, as shown in FIG. 61. The processes in S1 and S4 to S7 are the same as those in the first embodiment.

The process in S2$c$ is the same as that in the third embodiment shown in FIGS. 54 and 56. For each of one or more semiconductor wafers, the overlay error $D_{ij}$ is measured at the Nmax scan fields to which the scan field numbers n are assigned.

In S3$d$, the lithography control processor 430 calculates a synchronous control correction value $S_{Ynj}$ as well as the amount of wavelength adjustment $\Delta\lambda_{Xnj}$ and the amount of focus shift $\Delta Z_{Xnj}$. The process in S3$d$ will be described later in detail with reference to FIGS. 62 to 64.

The synchronous control correction value $S_Y$nj is used to perform the synchronous control of the reticle stage RT and the workpiece table WT in S6.

Figure 62:
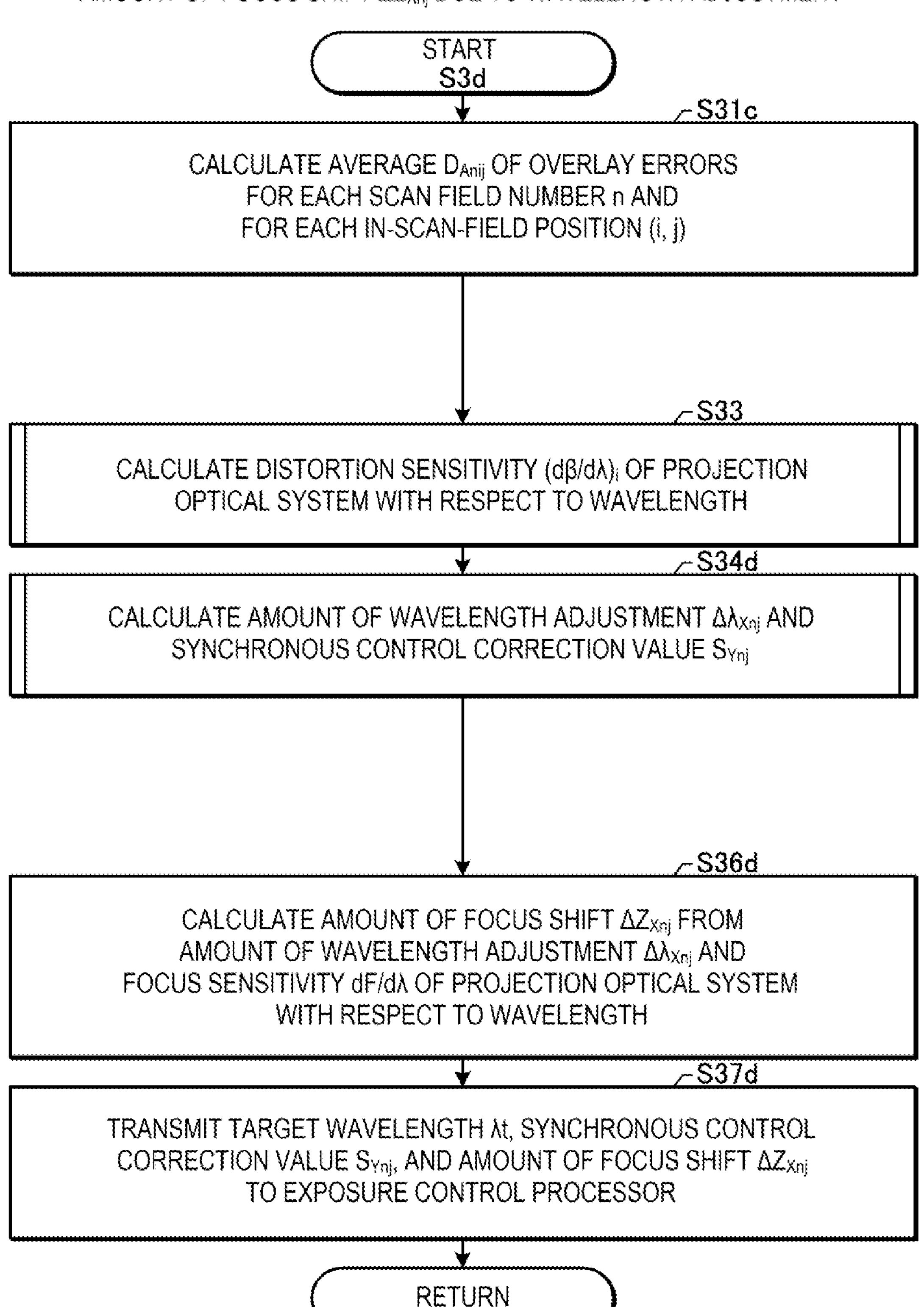
FIG. 62 is a flowchart showing the process of calculating the amount of wavelength adjustment, the synchronous control correction value, and the amount of focus shift in detail.

5.1.2 Calculation of Amount of Wavelength Adjustment $\Delta\lambda_{Xnj}$, Synchronous Control Correction Value $S_{Ynj}$, and Amount of Focus Shift $\Delta Z_{Xnj}$ FIG. 62 is a flowchart showing the process of calculating the amount of wavelength adjustment $\Delta\lambda_{Xnj}$, the synchronous control correction value $S_{Ynj}$, and the amount of focus shift $\Delta Z_{Xnj}$ in detail. The processes shown in FIG. 62 correspond to the subroutine S3$d$ shown in FIG. 61.

The processes shown in FIG. 62 differ from those in the second embodiment shown in FIG. 42 in that the amount of wavelength adjustment $\Delta\lambda_{Xnj}$, the synchronous control correction value $S_{Ynj}$, and the amount of focus shift $\Delta Z_{Xnj}$ are calculated for each scan field number n. The processes are specifically carried out as shown below.

The process in S31$c$ is the same as that in the third embodiment shown in FIG. 57. The lithography control processor 430 calculates the average $D_{Anij}$ of the overlay errors for each scan field number n and for each in-scan-field position (i, j).

The process in S33 is the same as that in the first embodiment shown in FIG. 20.

In S34$d$, the lithography control processor 430 calculates the amount of wavelength adjustment $\Delta\lambda_{Xnj}$ and the synchronous control correction value $S_{Ynj}$. The amount of wavelength adjustment $\Delta\lambda_{Xnj}$ is calculated by using the average $D_{Anij}$ of the overlay errors and an X-direction component $D_{XAnij}$ and $(d\beta_X/d\lambda)_i$ of the distortion sensitivity $(d\beta/d\lambda)_i$. The synchronous control correction value $S_{Ynj}$ is calculated by using the average $D_{Anij}$ of the overlay errors and a Y-direction component $D_{YAnij}$ and $(d\beta_Y/d\lambda)_i$ of the distortion sensitivity $(d\beta/d\lambda)_i$. S34$d$ will be described later in detail with reference to FIGS. 63 and 64.

In S36$d$, the lithography control processor 430 calculates the amount of focus shift $\Delta Z_{Xnj}$ from the amount of wavelength adjustment $\Delta\lambda_{Xnj}$ and the focus sensitivity $dF/d\lambda$ by using the following expression:

$$\Delta z_{xnj} = (dF/d\lambda) \times \Delta\lambda_{xnj}$$

In S37$d$, the lithography control processor 430 transmits the target wavelength λt, the synchronous control correction value $S_{Ynj}$, and the amount of focus shift $\Delta Z_{Xnj}$ to the exposure control processor 210. The target wavelength at is the sum of the reference wavelength $\lambda_0$ and the amount of wavelength adjustment $\Delta\lambda_{Xnj}$.

5.1.3 Calculation of Amount of Wavelength Adjustment $\Delta\lambda_{Xnj}$ and Synchronous Control Correction Value $S_{Ynj}$ FIG. 63 is a flowchart showing the process of calculating the amount of wavelength adjustment $\Delta\lambda_{Xnj}$ and the synchronous control correction value $S_{Ynj}$ in detail. The processes shown in FIG. 63 correspond to the subroutine S34*d* shown in FIG. 62.

The processes shown in FIG. 63 differ from those in the second embodiment shown in FIG. 43 in that the amount of wavelength adjustment $\Delta\lambda_{Xnj}$ and the synchronous control correction value $S_{Ynj}$ are calculated for each scan field number n. The processes are specifically carried out as shown below.

In S340*c*, the lithography control processor 430 sets each of the scan field number n and the Y-direction position j in a scan field at one.

In S341*d*, the lithography control processor 430 reads the average $D_{Anj}$ of the overlay errors calculated in S31*c* in FIG. 62, and calculates the X-direction component $D_{Xanij}$ and the Y-direction component $D_{Yanij}$.

The process in S342*b* is the same as that in the second embodiment shown in FIG. 43, and calculates the X-direction component $(d\beta_X/d\lambda)_i$ and the Y-direction component $(dp_Y/d\lambda)_i$ of the distortion sensitivity $(d\beta/d\lambda)_i$.

In S343*d*, the lithography control processor 430 calculates the amount of wavelength adjustment $\Delta\lambda_{Xnj}$ in such a way that the inequality indicated by Expression (6) below is satisfied.

$$R_{Xnj} = \sum_i \left| \left(\frac{d\beta_X}{d\lambda}\right)_i \Delta\lambda_{Xnj} + D_{XAnij} \right| < \sum_i |D_{XAnij}| \tag{6}$$

It is more desirable that the amount of wavelength adjustment $\Delta\lambda_{Xnj}$ is so calculated that the left side $R_{Xnj}$ of Expression (6) is minimized.

In S344*d*, the lithography control processor 430 calculates the synchronous control correction value $S_{Ynj}$ by using Expression (7) below.

$$S_{Ynj} = \frac{1}{Imax} \sum_{i=1}^{Imax} \left[ \left(\frac{d\beta_Y}{d\lambda}\right)_i \Delta\lambda_{Xnj} + D_{YAnij} \right] \tag{7}$$

That is, the synchronous control correction value $S_{Ynj}$ is the average obtained by summing along the X-direction the sum of the Y-direction component $D_{Yanij}$ of the average $D_{Anij}$ of the overlay errors and the Y-direction component $(d\beta_Y/d\lambda)_i\Delta\lambda_{Xnj}$ of the distortion $(d\beta/d\lambda)_i\Delta\lambda_{Xnj}$ and dividing the resultant sum by Imax.

The processes in S345, S346, S347*c*, and S348*c* are the same as those in the third embodiment shown in FIG. 59.

In S349*d*, the lithography control processor 430 causes the memory 432 to store the amount of wavelength adjustment $\Delta\lambda_{Xnj}$ and the synchronous control correction value $S_{Ynj}$ for each Y-direction position j.

FIG. 64 shows a data table of the amount of wavelength adjustment $\Delta\lambda_{Xnj}$, the synchronous control correction value $S_{Ynj}$, and the amount of focus shift $\Delta Z_{Xnj}$.

These values are calculated for each scan field number n and for each Y-direction position j.

5.2 Effects

The fourth embodiment can provide an effect that is the combination of the effects provided by the second and third embodiments.

As for the other points, the fourth embodiment is the same as the second embodiment.

6. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of any thereof and any other than A, B, and C.

What is claimed is:

1. An electronic device manufacturing method comprising:

performing scanning exposure in which plural scan fields of a first photosensitive substrate are exposed to pulse laser light having a reference wavelength;

measuring overlay error vectors at plural positions in each of the plural scan fields;

calculating an average of the overlay error vectors at each of the plural positions in scan fields scanned in the same scan direction out of the plural scan fields;

calculating an amount of wavelength adjustment with respect to the reference wavelength in such a way that a first overlay error parameter calculated by summing, along a direction that intersects with the scan direction, absolute values of sums of the averages and distortions obtained by multiplying a distortion sensitivity vector of a projection optical system of the exposure apparatus by the amount of wavelength adjustment of the pulse laser light from the reference wavelength is smaller than a second overlay error parameter calculated by summing absolute values of the averages along the direction that intersects with the scan direction;

causing a laser apparatus to generate the pulse laser light having a wavelength controlled by using the amount of wavelength adjustment;

outputting the pulse laser light to an exposure apparatus; and exposing a second photosensitive substrate to the pulse laser light in the exposure apparatus to manufacture electronic devices.

2. The electronic device manufacturing method according to claim 1, wherein an average of the overlay error vectors at each of the plural positions in plural first scan fields scanned in a first direction and an average of the overlay error vectors at each of the plural positions in plural second scan fields scanned in a second direction are calculated as the average.

3. The electronic device manufacturing method according to claim 2, wherein the first and second scan fields each have an outer edge located inside an outer edge of the first photosensitive substrate.

4. The electronic device manufacturing method according to claim 1, wherein the amount of wavelength adjustment is calculated for each of plural positions in the scan direction.

5. The electronic device manufacturing method according to claim 1, wherein the amount of wavelength adjustment is used to calculate an amount of focus shift in the exposure apparatus, and a position of the second photosensitive substrate in an optical axis direction is controlled in accordance with the amount of focus shift.

6. The electronic device manufacturing method according to claim 1, wherein the averages and the distortions are used to calculate a correction value used to perform synchronous control of a reticle stage and a workpiece table of the exposure apparatus, and the synchronous control is performed in accordance with the correction value.

7. The electronic device manufacturing method according to claim 6, wherein the amount of wavelength adjustment is calculated by using components of the averages in a direction that intersects with the scan direction and components of the distortions in the direction that intersects with the scan direction, and the correction value is calculated by using components of the averages in the scan direction and components of the distortions in the scan direction.

8. The electronic device manufacturing method according to claim 7, wherein the correction value is calculated by summing, along the direction that intersects with the scan direction, sums of the components of the averages in the scan direction and the components of the distortions in the scan direction.

9. The electronic device manufacturing method according to claim 1, wherein the first photosensitive substrate includes plural photosensitive substrates, scan fields of the first photosensitive substrate at positions corresponding to each other are scanned in the same scan direction, and the average is calculated at each of the plural positions for each of the scan fields at the positions corresponding to each other.

10. The electronic device manufacturing method according to claim 9, wherein the plural scan fields include scan fields each having an outer edge located inside an outer edge of the first photosensitive substrate and scan fields each having an outer edge that intersects with the outer edge of the first photosensitive substrate.

11. The electronic device manufacturing method according to claim 9, wherein the amount of wavelength adjustment is calculated at each of plural positions in the scan direction.

12. The electronic device manufacturing method according to claim 9, wherein the amount of wavelength adjustment is used to calculate an amount of focus shift in the exposure apparatus, and a position of the second photosensitive substrate in an optical axis direction is controlled in accordance with the amount of focus shift.

13. The electronic device manufacturing method according to claim 9, wherein the averages and the distortions are used to calculate a correction value used to perform synchronous control of a reticle stage and a workpiece table of the exposure apparatus, and the synchronous control is performed in accordance with the correction value.

14. The electronic device manufacturing method according to claim 13, wherein the amount of wavelength adjustment is calculated by using components of the averages in a direction that intersects with the scan direction and components of the distortions in the direction that intersects with the scan direction, and the correction value is calculated by using components of the averages in the scan direction and components of the distortions in the scan direction.

15. The electronic device manufacturing method according to claim 14, wherein the correction value is calculated by summing, along the direction that intersects with the scan direction, sums of the components of the averages in the scan direction and the components of the distortions in the scan direction.

16. A lithography control processor comprising:

a non-transitory computer-readable storage medium configured to store a lithography control program; and a CPU, the lithography control program causing the CPU to acquire overlay error vectors at plural positions in each of plural scan fields of a first photosensitive substrate that undergoes scanning exposure in which the plural scan fields are exposed to pulse laser light having a reference wavelength, calculate an average of the overlay error vectors at each of the plural positions in scan fields scanned in the same scan direction out of the plural scan fields, and calculate an amount of wavelength adjustment with respect to the reference wavelength in such a way that a first overlay error parameter calculated by summing, along a direction that intersects with the scan direction, absolute values of sums of the averages and distortions obtained by multiplying a distortion sensitivity vector of a projection optical system of the exposure apparatus by the amount of wavelength adjustment of the pulse laser light from the reference wavelength is smaller than a second overlay error parameter calculated by summing absolute values of the averages along the direction that intersects with the scan direction.

17. The electronic device manufacturing method according to claim 1, wherein the amount of wavelength adjustment is calculated for each of opposite scan directions.

* * * * *